(12) United States Patent
Cui et al.

(10) Patent No.: US 10,777,575 B1
(45) Date of Patent: Sep. 15, 2020

(54) THREE-DIMENSIONAL MEMORY DEVICE WITH SELF-ALIGNED VERTICAL CONDUCTIVE STRIPS HAVING A GATE-ALL-AROUND CONFIGURATION AND METHOD OF MAKING THE SAME

(71) Applicant: SANDISK TECHNOLOGIES LLC, Addison, TX (US)

(72) Inventors: Zhixin Cui, Nagoya (JP); Kiyohiko Sakakibara, Yokkaichi (JP); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/361,722

(22) Filed: Mar. 22, 2019

(51) Int. Cl.
| | |
|---|---|
| H01L 27/11582 | (2017.01) |
| H01L 27/11573 | (2017.01) |
| H01L 27/1157 | (2017.01) |
| H01L 27/11565 | (2017.01) |
| H01L 27/11575 | (2017.01) |

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11575* (2013.01)

(58) Field of Classification Search
CPC .................................. H01L 27/11578–11582
See application file for complete search history.

(56) References Cited

U.S. PATENT DOCUMENTS

| | | | |
|---|---|---|---|
| 5,915,167 A | 6/1999 | Leedy | |
| 9,515,085 B2 | 12/2016 | Rabkin et al. | |
| 9,922,987 B1 | 3/2018 | Mizutani et al. | |
| 10,115,732 B2 | 10/2018 | Yu et al. | |
| 10,192,878 B1 | 1/2019 | Tsutsumi et al. | |
| 2012/0032245 A1* | 2/2012 | Hwang | H01L 27/11556 257/314 |
| 2012/0098049 A1 | 4/2012 | Moon et al. | |

(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

(Continued)

*Primary Examiner* — Robert G Bachner
*Assistant Examiner* — Molly K Reida
(74) *Attorney, Agent, or Firm* — The Marbury Law Group PLLC

(57) ABSTRACT

A three-dimensional memory device includes an alternating stack of insulating layers and electrically conductive layers located over a substrate, memory stack structures extending through the alternating stack, drain-select-level trenches that vertically extend through at least one drain-select-level electrically conductive layer and laterally extend along a first horizontal direction and divide each drain-select-level electrically conductive layer into multiple drain-select-level electrically conductive strips, and pairs of vertical conductive strips located within a respective one of the drain-select-level trenches. Each of the vertical conductive strips has a pair of vertical straight sidewalls that laterally extends along the first horizontal direction. Each drain-select-level electrode may have at least one drain-select-level electrically conductive layer and at least one vertical conductive strip.

11 Claims, 49 Drawing Sheets

(56) References Cited

U.S. PATENT DOCUMENTS

| | | |
|---|---|---|
| 2017/0179026 A1 | 6/2017 | Toyama et al. |
| 2017/0243879 A1 | 8/2017 | Yu et al. |
| 2018/0138193 A1* | 5/2018 | Zhang ............... H01L 27/11556 |
| 2019/0027488 A1 | 1/2019 | Kai et al. |
| 2019/0027489 A1 | 1/2019 | Orimoto et al. |
| 2019/0035803 A1 | 1/2019 | Zhang et al. |

OTHER PUBLICATIONS

U.S. Appl. No. 15/865,892, filed Jan. 9, 2018, SanDisk Technologies LLC.
U.S. Appl. No. 15/888,714, filed Feb. 5, 2018, SanDisk Technologies LLC.
U.S. Appl. No. 15/906,109, filed Feb. 27, 2018, SanDisk Technologies LLC.
U.S. Appl. No. 16/019,821, filed Jun. 27, 2018, SanDisk Technologies LLC.
U.S. Appl. No. 16/019,856, filed Jun. 27, 2018, SanDisk Technologies LLC.
U.S. Appl. No. 16/023,289, filed Jun. 29, 2018, SanDisk Technologies LLC.
U.S. Appl. No. 16/023,866, filed Jun. 29, 2018, SanDisk Technologies LLC.
U.S. Appl. No. 16/024,048, filed Jun. 29, 2018, SanDisk Technologies LLC.
U.S. Appl. No. 16/136,686, filed Sep. 20, 2018, SanDisk Technologies LLC.
U.S. Appl. No. 16/142,875, filed Sep. 26, 2018, SanDisk Technologies LLC.
U.S. Appl. No. 16/211,387, filed Dec. 6, 2018, SanDisk Technologies LLC.
U.S. Appl. No. 16/267,592, filed Feb. 5, 2019, SanDisk Technologies LLC.
U.S. Appl. No. 16/267,625, filed Feb. 5, 2019, SanDisk Technologies LLC.
U.S. Appl. No. 16/352,157, filed Mar. 13, 2019, SanDisk Technologies LLC.
Notification of Transmittal of the International Search Report and Written Opinion of the International Search Authority for International Patent Application No. PCT/US2019/063249, dated Mar. 5, 2020, 9 pages.

* cited by examiner

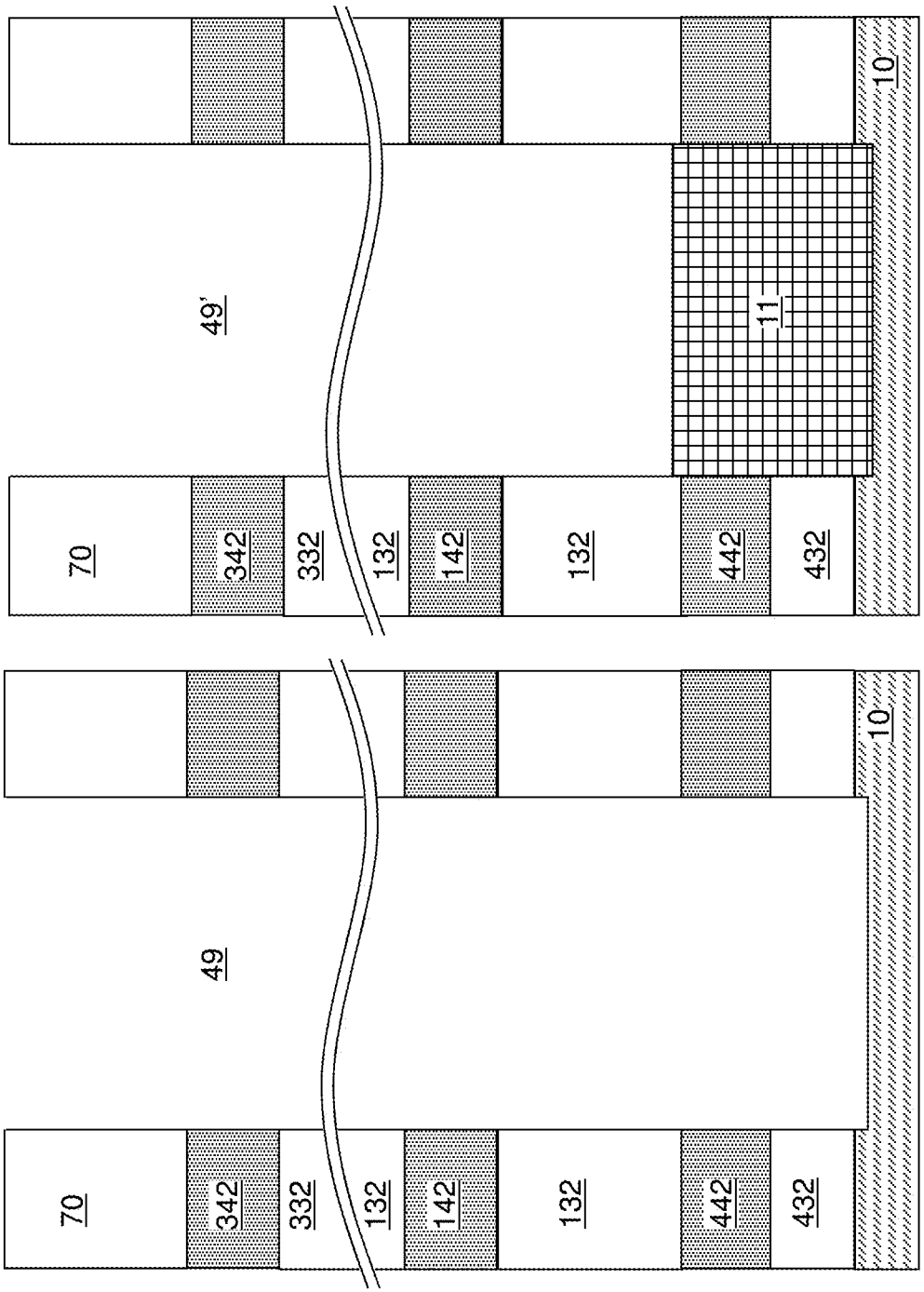

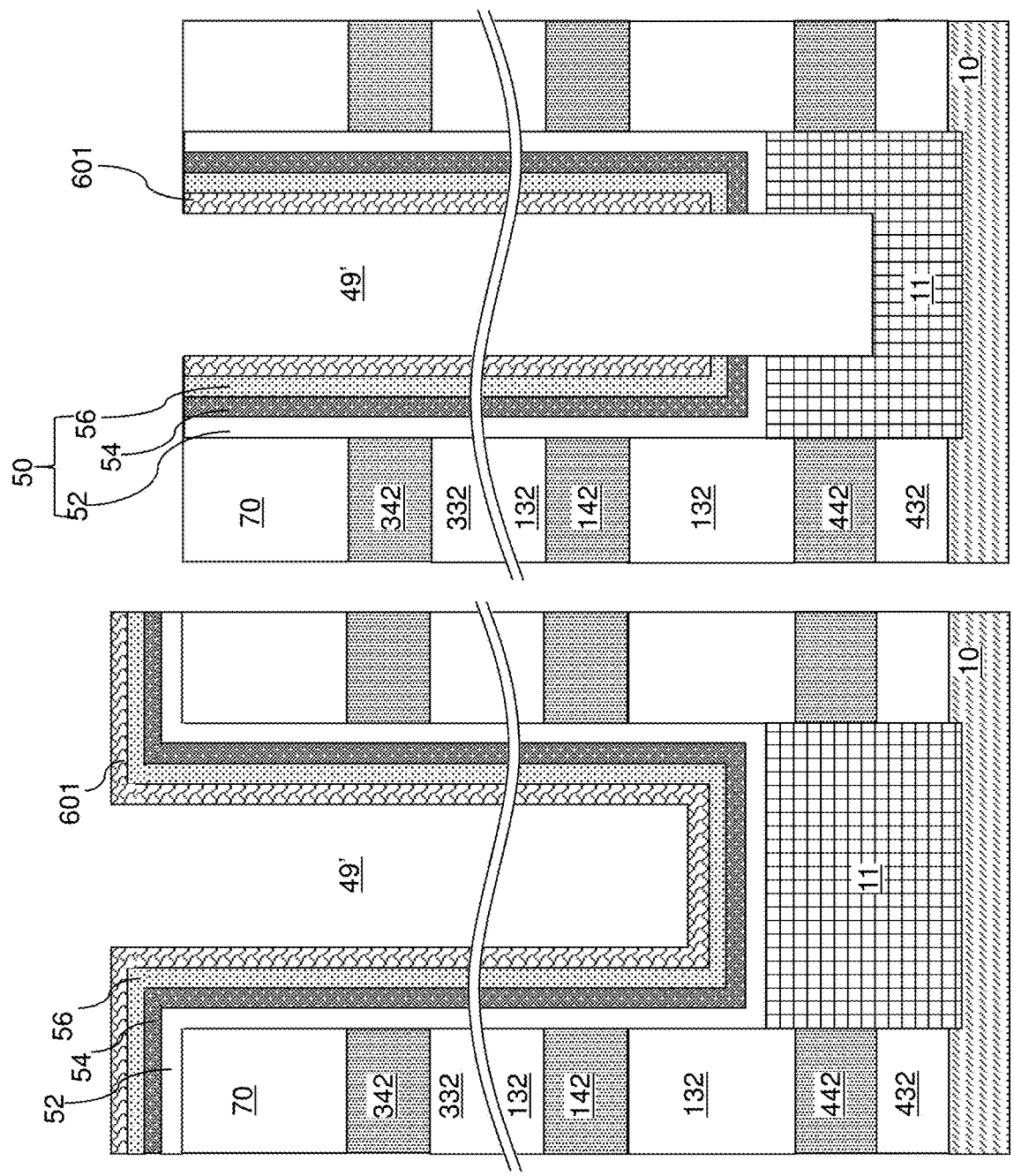

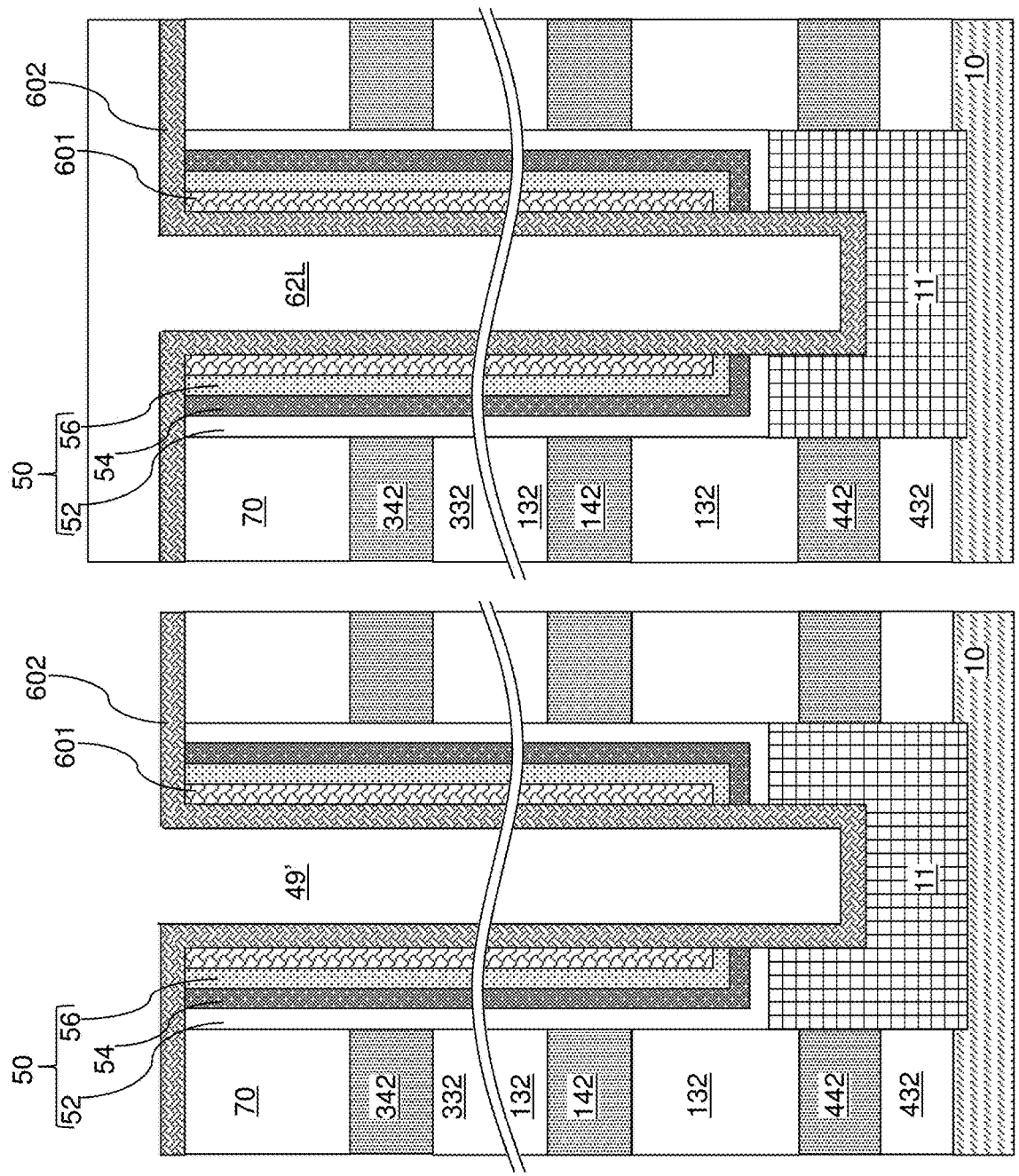

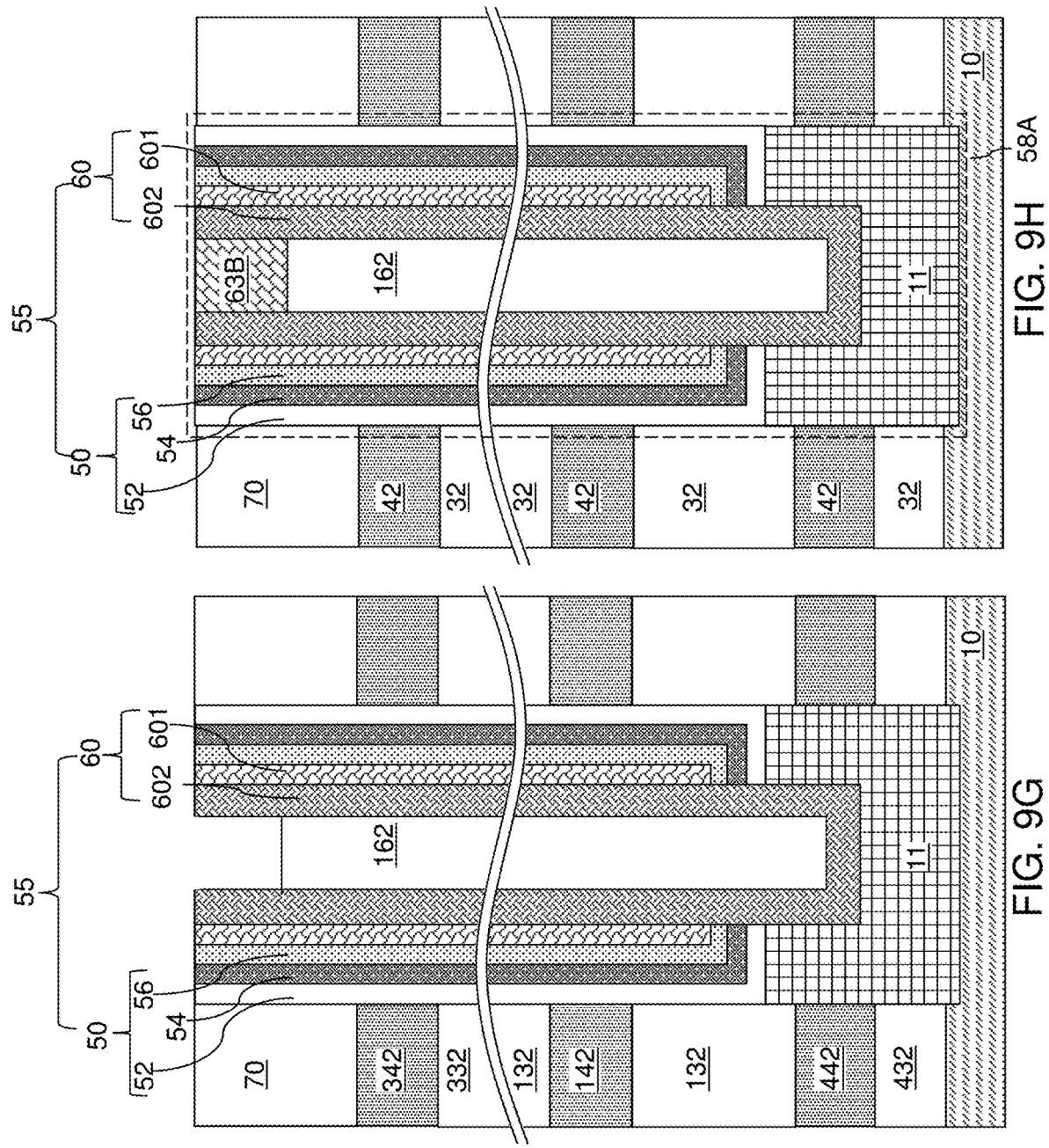

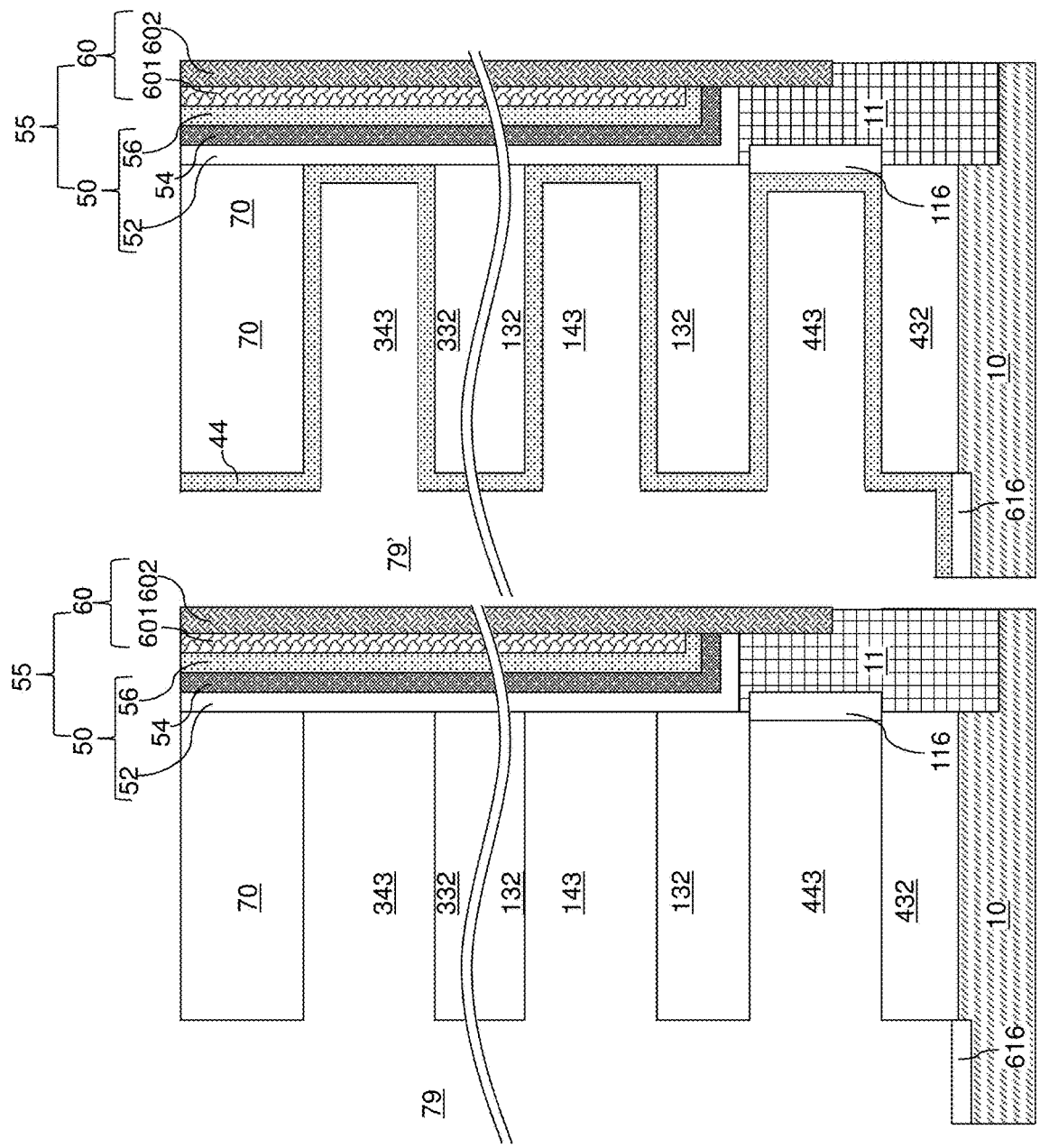

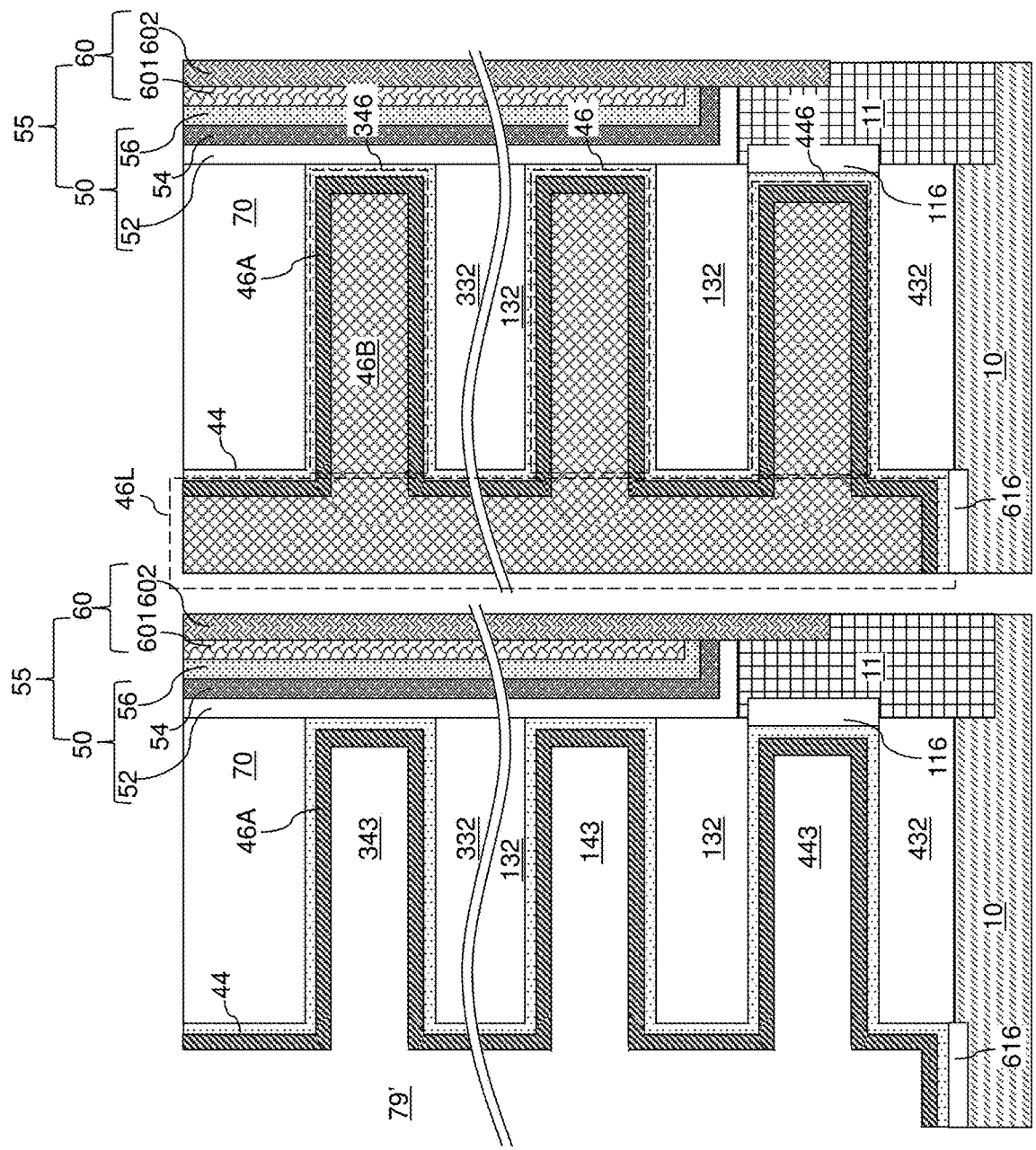

THREE-DIMENSIONAL MEMORY DEVICE WITH SELF-ALIGNED VERTICAL CONDUCTIVE STRIPS HAVING A GATE-ALL-AROUND CONFIGURATION AND METHOD OF MAKING THE SAME

FIELD

The present disclosure relates generally to the field of semiconductor devices, and particularly to a three-dimensional memory device including drain select gate electrodes having a gate-all-around configuration and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate, wherein the electrically conductive layers comprise word-line-level electrically conductive layers and at least one drain-select-level electrically conductive layer that overlie the word-line-level electrically conductive layers; first memory stack structures extending through the alternating stack; drain-select-level trenches that vertically extend through the at least one drain-select-level electrically conductive layer and laterally extend along a first horizontal direction and divide each of the at least one drain-select-level electrically conductive layer into multiple drain-select-level electrically conductive strips that are laterally spaced apart along a second horizontal direction; and pairs of vertical conductive strips, wherein each pair of vertical conductive strips is located within a respective one of the drain-select-level trenches, and each of the vertical conductive strips has a pair of vertical straight sidewalls that laterally extends along the first horizontal direction.

According to another embodiment of the present disclosure, a method of forming a three-dimensional memory device is provided, which comprises: forming an alternating stack of insulating layers and sacrificial material layers over a substrate, wherein the spacer material layers comprise word-line-level sacrificial material layers and at least one drain-select-level sacrificial material layer that overlies the word-line-level sacrificial material layers; forming memory openings through the alternating stack; forming sacrificial memory opening fill structures in the memory openings; forming drain-select-level trenches that laterally extend along a first horizontal direction with straight sidewalls and vertically extend through the at least one drain-select-level sacrificial material layer and cut through edge portions of a respective pair of rows of sacrificial memory opening fill structures selected from the sacrificial memory opening fill structures; forming sacrificial trench fill structures in the drain-select-level trenches; replacing the sacrificial memory opening fill structures with memory opening fill structures, wherein each of the memory opening fill structures comprises a respective memory film and a respective vertical semiconductor channel; forming drain-select-level cavities by removing the sacrificial trench fill structures; forming backside recesses by removing the sacrificial material layers; and depositing at least one conductive material in the drain-select-level cavities and the backside recesses, wherein word-line-level electrically conductive layers replace the word-line-level sacrificial material layers, and drain-select-level electrodes are formed above the word-line-level electrically conductive layers, wherein each of the drain-select-level electrodes comprises at least one drain-select-level electrically conductive layer formed in a volume of the at least one drain-select-level sacrificial material layer and a vertical conductive strip formed at a peripheral region of a respective one of the drain-select-level cavities.

BRIEF DESCRIPTION OF THE DRAWINGS

FIGS. 9A-9H are sequential schematic vertical cross-sectional views of a memory opening within the exemplary structure during formation of a memory opening fill structure according to an embodiment of the present disclosure.

FIGS. 16A-16D are sequential vertical cross-sectional views of a region of the exemplary structure during formation of electrically conductive layers according to an embodiment of the present disclosure.

DETAILED DESCRIPTION

Figure 1:
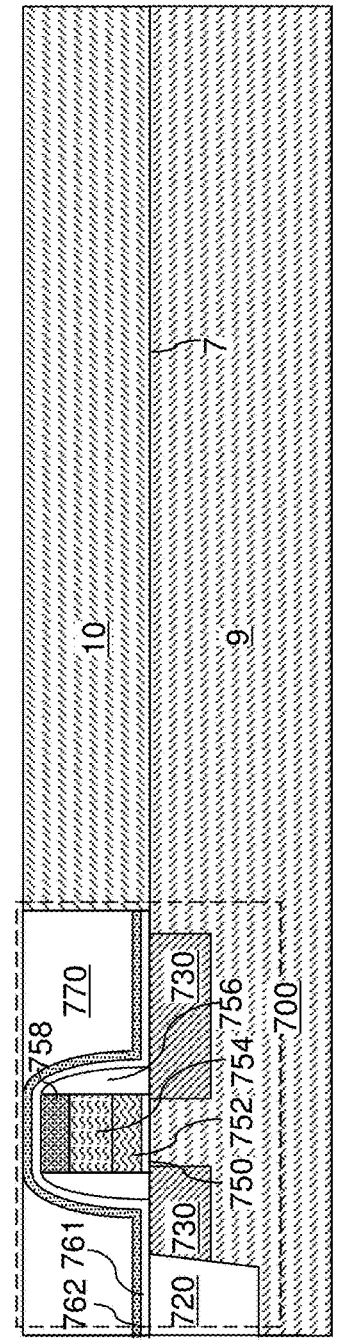
FIG. 1 is a schematic vertical cross-sectional view of an exemplary structure after formation of at least one peripheral device, and a semiconductor material layer according to an embodiment of the present disclosure.

As discussed above, the present disclosure is directed to a three-dimensional memory device including drain select gate electrodes having a gate-all-around configuration and methods of manufacturing the same, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process"

structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a zig-zag vertical plane or a substantially zig-zag vertical plane that includes the first surface and the second surface. A substantially zig-zag vertical plane is a plane that extends straight along a direction that deviates from a vertical direction by an angle less than 5 degrees. A zig-zag vertical plane or a substantially zig-zag vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array may be subsequently formed is herein referred to as a memory array region 100. A staircase region 300 for subsequently forming stepped terraces of electrically conductive layers may be provided between the memory array region 100 and the peripheral device region 200.

Figure 2:
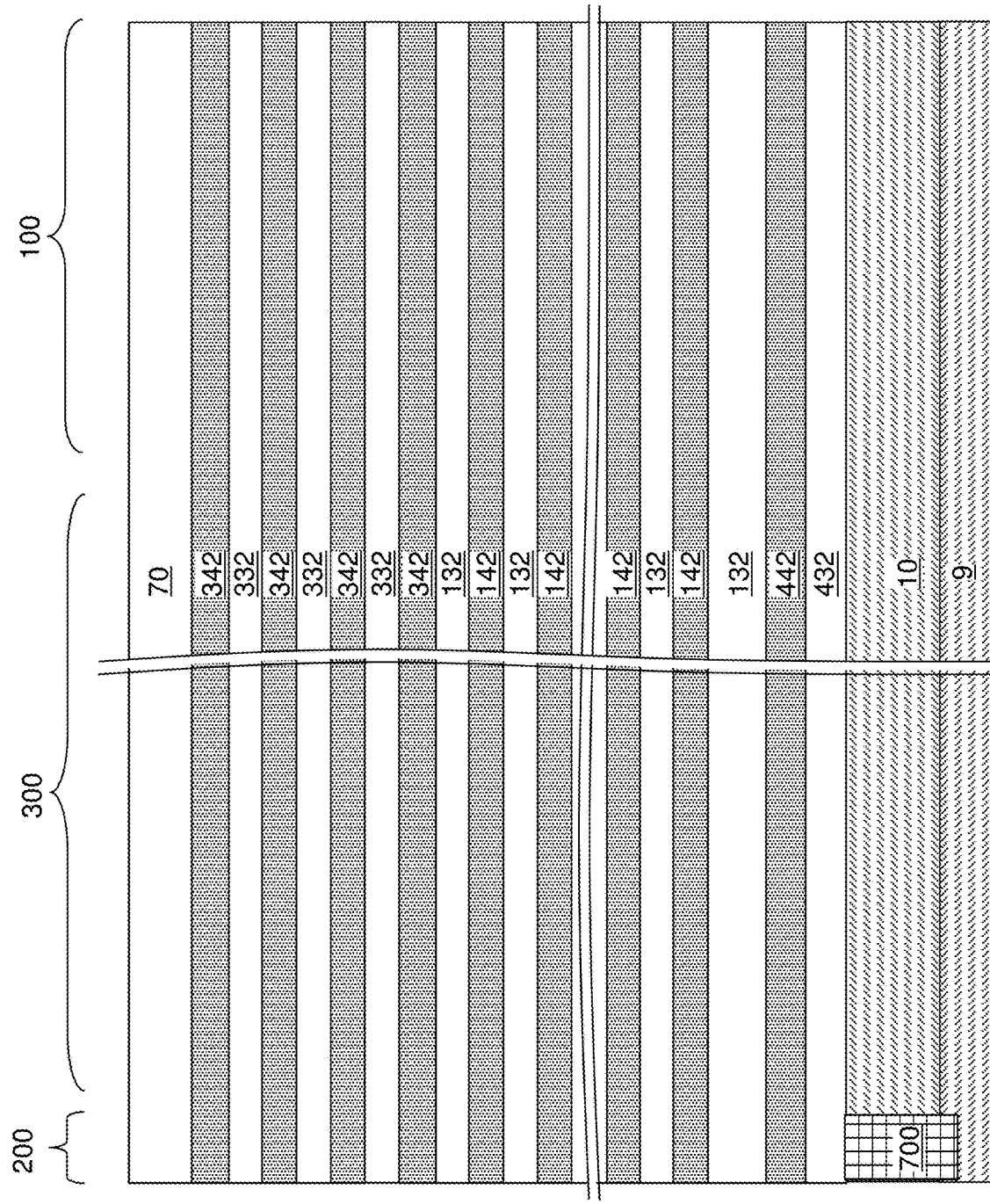
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers and second material layers may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer may include a first material, and each second material layer may include a second material that is different from the first material. In one embodiment, each first material layer may be an insulating layer, and each second material layer may be a sacrificial material layer. In such embodiments, the stack may include an alternating plurality of insulating layers and sacrificial material layers, and constitutes a prototype stack of alternating layers comprising insulating layers and sacrificial material layers. The insulating layers may include a source-select-level insulating layer 432 contacting a top surface of the semiconductor material layer 10, word-line-level insulating layers 132 located between the source-select-level insulating layer 432 and a bottommost one of drain-select-level sacrificial material layers 342, and drain-select-level insulating layers 332 located above the bottommost one of the drain-select-level sacrificial material layers 342. The sacrificial material layers may include a source-select-level sacrificial material layer 442 contacting a top surface of the source-select-level insulating layer 432, word-line-level sacrificial material layers 142 located between the source-select-level sacrificial material layer 442 and a bottommost one of the drain-select-level insulating layers 332, and drain-select-level sacrificial material layers 342 located above the topmost one of the word-line-level insulating layers 132.

The source-select-level sacrificial material layer 442 may be formed at the level at which a source-select-level electrically conductive layer is subsequently formed. The source-select-level electrically conductive layer may be subsequently used to select a group of memory stack structures to be activated. The drain-select-level sacrificial material layers 342 may be formed at levels at which drain-select-level electrically conductive layers are to be subsequently formed. The drain-select-level electrically conductive layers are subsequently used to select a cluster of memory stack structures to be activated. The total number of drain-select-level sacrificial material layers 342 may be in a range from 1 to 8, such as from 2 to 4. Each group of memory stack structures may include at least two clusters of memory stack structures. A total number of clusters in each group may be in a range from 2 to 16. The word-line-level sacrificial material layers 142 may be formed at levels at which word-line-level electrically conductive layers are to be subsequently formed. The word-line-level electrically conductive layers function as word lines and gate electrodes for memory elements in the memory stack structures to be subsequently formed.

The stack of the alternating plurality is herein referred to as an alternating stack {(432, 132, 332), (442, 142, 342)}. In one embodiment, the alternating stack {(432, 132, 332), (442, 142, 342)} may include insulating layers (432, 132, 332) composed of the first material, and sacrificial material layers (442, 142, 342) composed of a second material different from the first material. The first material of the insulating layers (432, 132, 332) may be at least one insulating material. As such, each insulating layer (432, 132, 332) may be an insulating material layer. Insulating materials that may be used for the insulating layers (432, 132, 332) include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers (432, 132, 332) may be silicon oxide.

The second material of the sacrificial material layers (442, 142, 342) may be a sacrificial material that may be removed selective to the first material of the insulating layers (432, 132, 332). As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers (442, 142, 342) may comprise an insulating material, a semiconductor material, or a conductive material. The second material of the sacrificial material layers (442, 142, 342) may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers (442, 142, 342) may be spacer material layers that comprise silicon nitride or a semiconductor material including at least one of silicon and germanium.

In one embodiment, the insulating layers (432, 132, 332) may include silicon oxide, and sacrificial material layers (442, 142, 342) may include silicon nitride. The first material of the insulating layers (432, 132, 332) may be deposited, for example, by chemical vapor deposition (CVD). For example, if silicon oxide is used for the insulating layers (432, 132, 332), tetraethyl orthosilicate (TEOS) may be used as the precursor material for the CVD process. The second material of the sacrificial material layers (442, 142, 342) may be formed, for example, CVD or atomic layer deposition (ALD).

The sacrificial material layers (442, 142, 342) may be suitably patterned so that conductive material portions to be subsequently formed by replacement of the sacrificial material layers (442, 142, 342) may function as electrically conductive electrodes, such as the control gate electrodes of the monolithic three-dimensional NAND string memory devices to be subsequently formed. The sacrificial material layers (442, 142, 342) may comprise a portion having a strip shape extending substantially parallel to the major surface 7 of the substrate.

The thicknesses of the insulating layers (432, 132, 332) and the sacrificial material layers (442, 142, 342) may be in a range from 20 nm to 50 nm, although lesser and greater thicknesses may be used for each insulating layer (432, 132, 332) and for each sacrificial material layer (442, 142, 342). The number of repetitions of the pairs of an insulating layer (432, 132, 332) and a sacrificial material layer (442, 142, 342) may be in a range from 2 to 1,024, and typically from 8 to 256, although a greater number of repetitions may also be used. The top and bottom gate electrodes in the stack may function as the select gate electrodes. In one embodiment, each sacrificial material layer (442, 142, 342) in the alternating stack {(432, 132, 332), (442, 142, 342)} may have a uniform thickness that is substantially invariant within each respective sacrificial material layer (442, 142, 342).

Optionally, an insulating cap layer 70 may be formed over the alternating stack {(432, 132, 332), (442, 142, 342)}. The insulating cap layer 70 may include a dielectric material that is different from the material of the sacrificial material layers 42. In one embodiment, the insulating cap layer 70 may include a dielectric material that may be used for the insulating layers (432, 132, 332) as described above. The insulating cap layer 70 may have a greater thickness than each of the insulating layers (432, 132, 332). The insulating cap layer 70 may be deposited, for example, by chemical vapor deposition. In one embodiment, the insulating cap layer 70 may be a silicon oxide layer.

Figure 3:
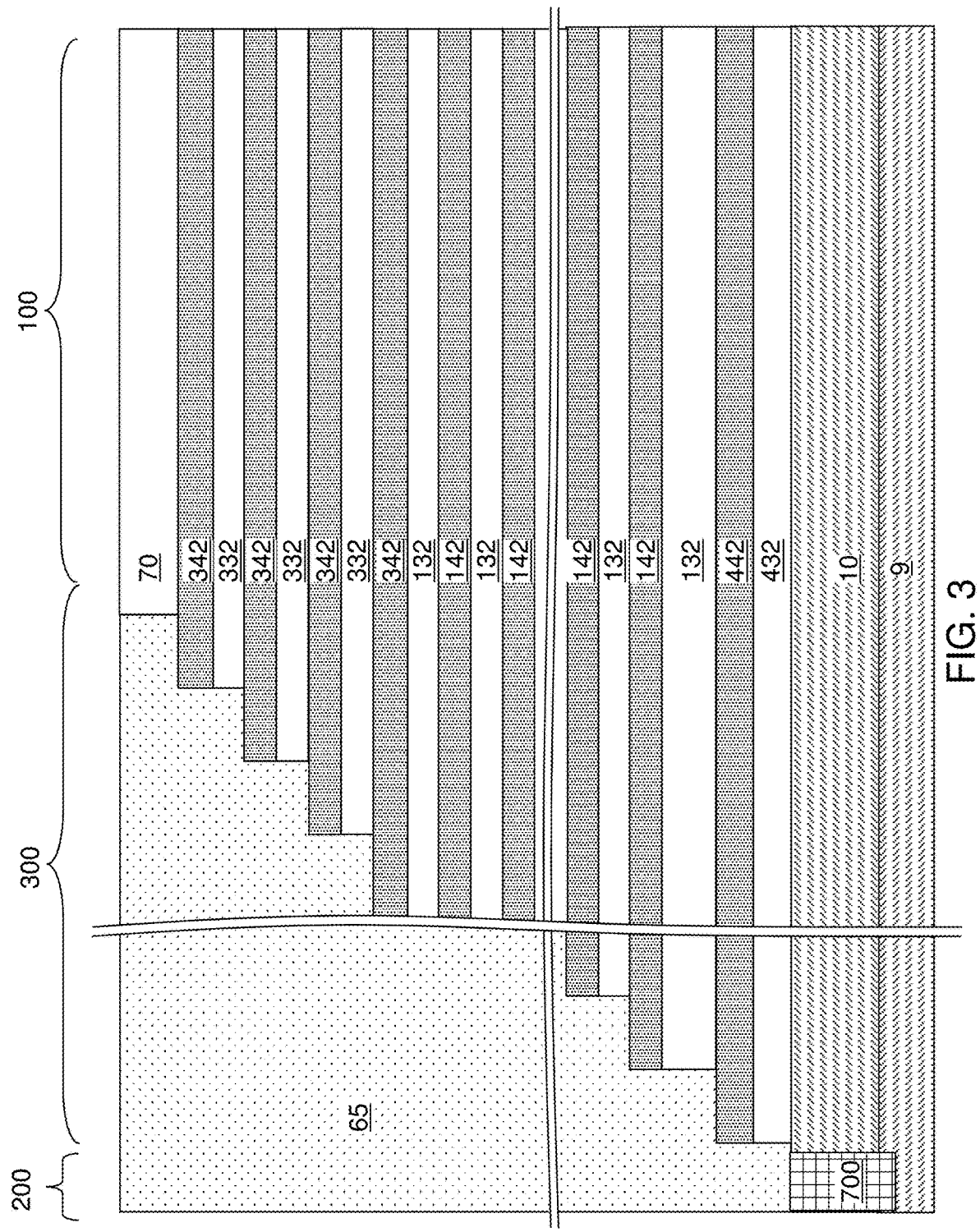
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces may be formed at a peripheral region of the alternating stack {(432, 132, 332), (442, 142, 342)}, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity may be formed within the volume from which portions of the alternating stack {(432, 132, 332), (442, 142, 342)} are removed through formation of the stepped surfaces. A "stepped cavity" refers to a cavity having stepped surfaces.

The terrace region may be formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer (442, 142, 342) other than a topmost sacrificial material layer 342 within the alternating stack {(432, 132, 332), (442, 142, 342)} laterally extends farther than any overlying sacrificial material layer (442, 142, 342) within the alternating stack {(432, 132, 332), (442, 142, 342)} in the terrace region. The terrace region includes stepped surfaces of the alternating stack {(432, 132, 332), (442, 142, 342)} that continuously extend from a bottommost layer within the alternating stack {(432, 132, 332), (442, 142, 342)} to a topmost layer within the alternating stack {(432, 132, 332), (442, 142, 342)}.

Each vertical step of the stepped surfaces may have the height of one or more pairs of an insulating layer (432, 132, 332) and a word-line-level sacrificial material layer (442, 142, 342). In one embodiment, each vertical step may have the height of a single pair of an insulating layer (432, 132, 332) and a word-line-level sacrificial material layer (442, 142, 342). In another embodiment, multiple "columns" of staircases may be formed along a first horizontal direction hd1 such that each vertical step has the height of a plurality of pairs of an insulating layer (432, 132, 332) and a word-line-level sacrificial material layer (442, 142, 342), and the number of columns may be at least the number of the plurality of pairs. Each column of staircase may be vertically offset from one another such that each of the sacrificial material layers (442, 142, 342) has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers (442, 142, 342) (as counted from the bottom) and another column of staircases provide physically exposed top surfaces for even-numbered word-line-level sacrificial material layers (as counted from the bottom). Configurations using three, four, or more columns of staircases with a respective set of vertical offsets from the physically exposed surfaces of the sacrificial material layers (442, 142, 342) may also be used. Each word-line-level sacrificial material layer (442, 142, 342) has a greater lateral extent, at least along one direction, than any overlying sacrificial material layers (442, 142, 342) such that each physically exposed surface of any word-line-level sacrificial material layer (442, 142, 342) does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
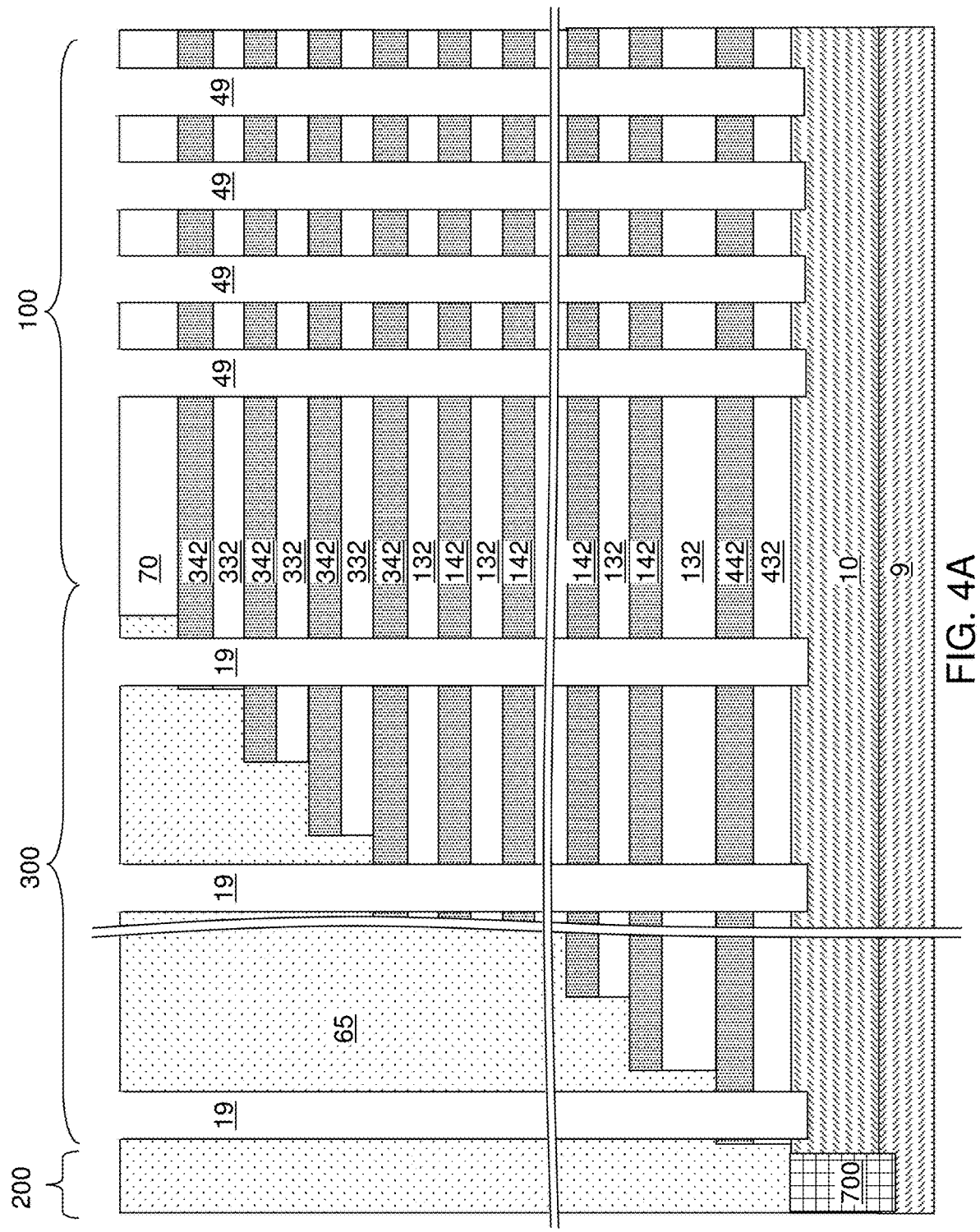
FIG. 4A is a schematic vertical cross-sectional view of the exemplary structure after formation of memory openings and support openings according to an embodiment of the present disclosure.
Figure 4B:
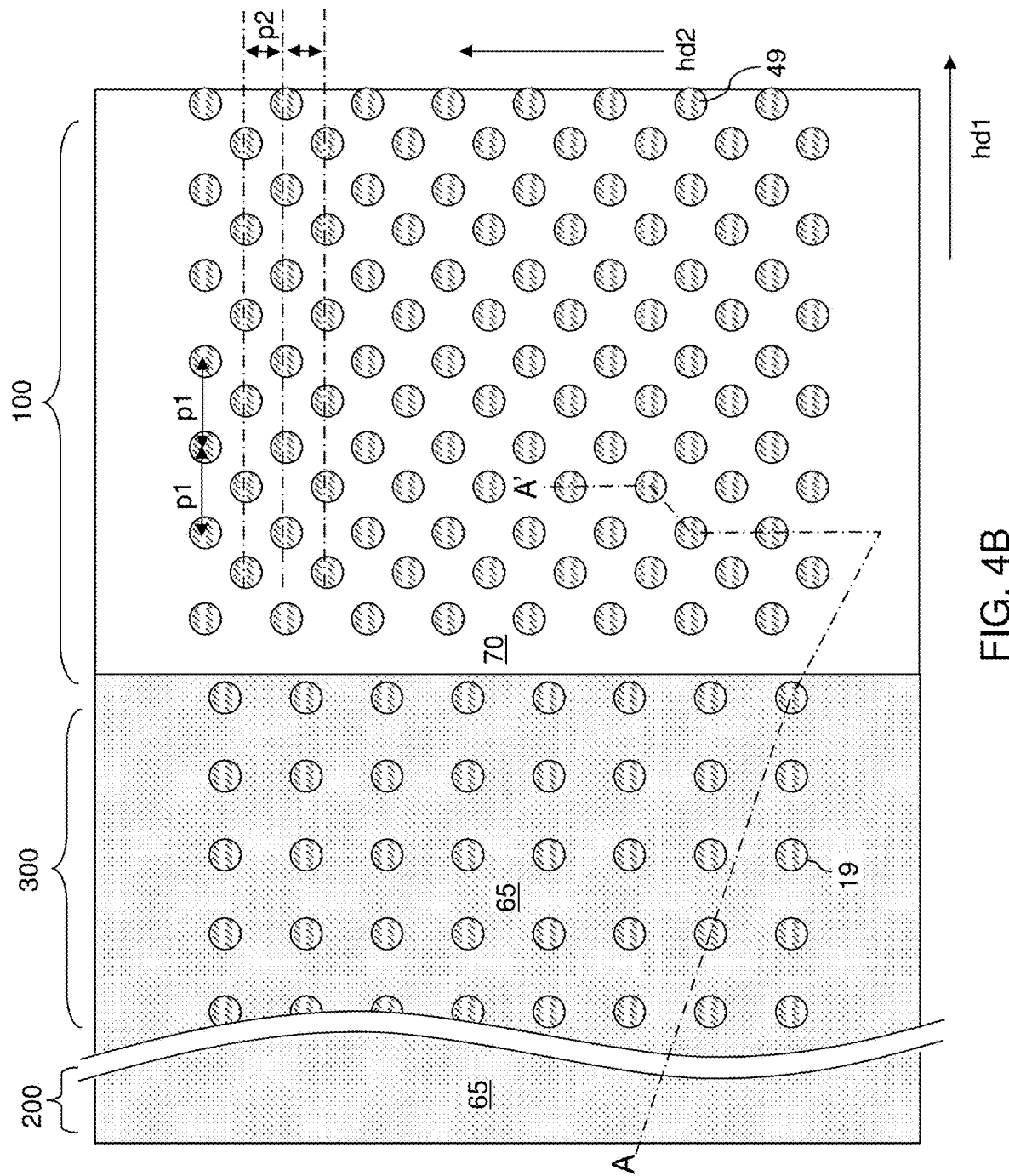
FIG. 4B is a top-down view of the exemplary structure of FIG. 4A. The zig-zag vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack {(432, 132, 332), (442, 142, 342)} by at least one anisotropic etch that uses the patterned lithographic material stack as an etch mask. Portions of the alternating stack {(432, 132, 332), (442, 142, 342)} underlying the openings in the patterned lithographic material stack may be etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 may be formed through the insulating cap layer 70 and the entirety of the alternating stack {(432, 132, 332), (442, 142, 342)} in the memory array region 100. The support openings 19 may be formed through the retro-stepped dielectric material portion 65 and the portion of the alternating stack {(432, 132, 332), (442, 142, 342)} that underlie the stepped surfaces in the staircase region 300.

The memory openings 49 may extend through the entirety of the alternating stack {(432, 132, 332), (442, 142, 342)}. The support openings 19 may extend through a subset of layers within the alternating stack {(432, 132, 332), (442, 142, 342)}. The chemistry of the anisotropic etch process used to etch through the materials of the alternating stack {(432, 132, 332), (442, 142, 342)} may alternate to optimize etching of the first and second materials in the alternating stack {(432, 132, 332), (442, 142, 342)}. The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack {(432, 132, 332), (442, 142, 342)} to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

The memory openings 49 may be arranged in rows that extend along a first horizontal direction hd1 and laterally spaced apart along a second horizontal direction hd2 that is perpendicular to the first horizontal direction hd1. Memory openings 49 in each row may have a uniform intra-row pitch p1, which is the center-to-center distance between a neighboring pair of memory openings 49 within a row of memory openings 49. Further, the rows of memory openings 49 may be arranged along the second horizontal direction hd2 with a uniform inter-row pitch p2, or a row-to-row pitch, which is the distance between a first vertical plane passing through geometrical centers of a first row of memory openings 49 and a second vertical plane passing through geometrical centers of a second row of memory openings 49 that neighbors the first row of memory openings 49. In one embodiment, the memory openings 49 may be arranged as two-dimensional periodic arrays that are laterally spaced apart along the second horizontal direction hd2. Each two-dimensional periodic array of memory openings 49 may include multiple rows of memory openings 49 such that each neighboring pair of rows of memory openings 49 has a uniform inter-row pitch p2. The number of rows of memory openings 49 within each two-dimensional periodic array of memory openings 49 may be in a range from 4 to 32, such as from 8 to 16, although lesser and greater number of rows may be used for each two-dimensional periodic array of memory openings 49.

Figure 5:
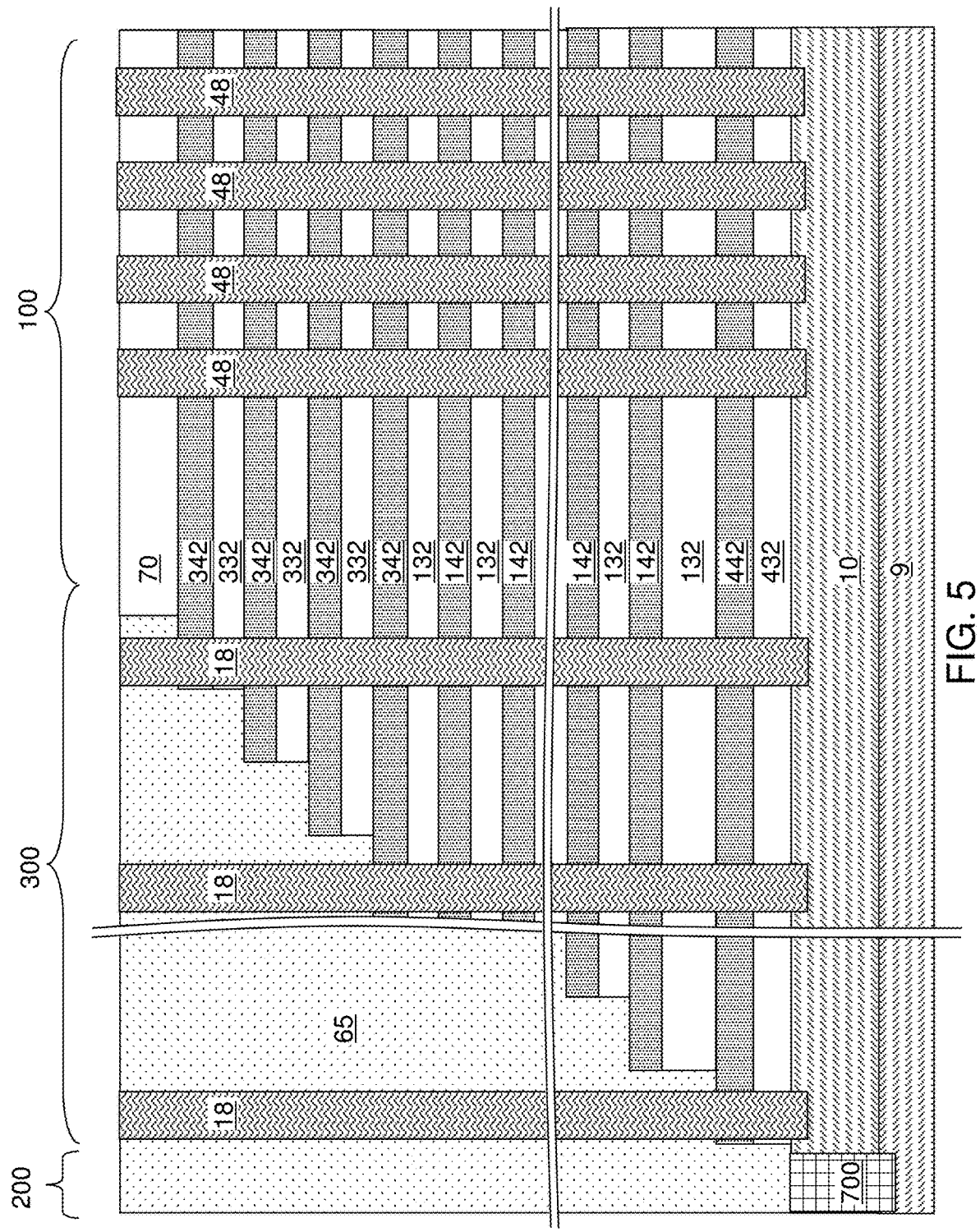
FIG. 5 is a schematic vertical cross-sectional view of the exemplary structure after formation of sacrificial memory opening fill structures according to an embodiment of the present disclosure.

Referring to FIG. 5, a sacrificial fill material may be deposited in the memory openings 49 and support openings 19. The sacrificial fill material may include a material that is different from the materials of the alternating stack {(432, 132, 332), (442, 142, 342)} and the retro-stepped dielectric material portion 65. For example, the sacrificial fill material may include amorphous silicon, amorphous carbon, a polymer material, or a silicon germanium alloy. In embodiments in which amorphous silicon is used as the sacrificial fill material, a thin layer of silicon oxide may be formed by conversion of physically exposed surface portions of the semiconductor material layer 10 before deposition of the sacrificial fill material.

Excess portions of the sacrificial fill material may be removed from above the horizontal plane including the top surface of the insulating cap layer 70 by a planarization process such as chemical mechanical planarization (CMP). Each remaining portion of the sacrificial fill material in the memory openings 49 constitutes a sacrificial memory opening fill structure 48, and each remaining portion of the sacrificial fill material in the support openings 19 constitutes a sacrificial support opening fill structure 18.

Figure 6A:
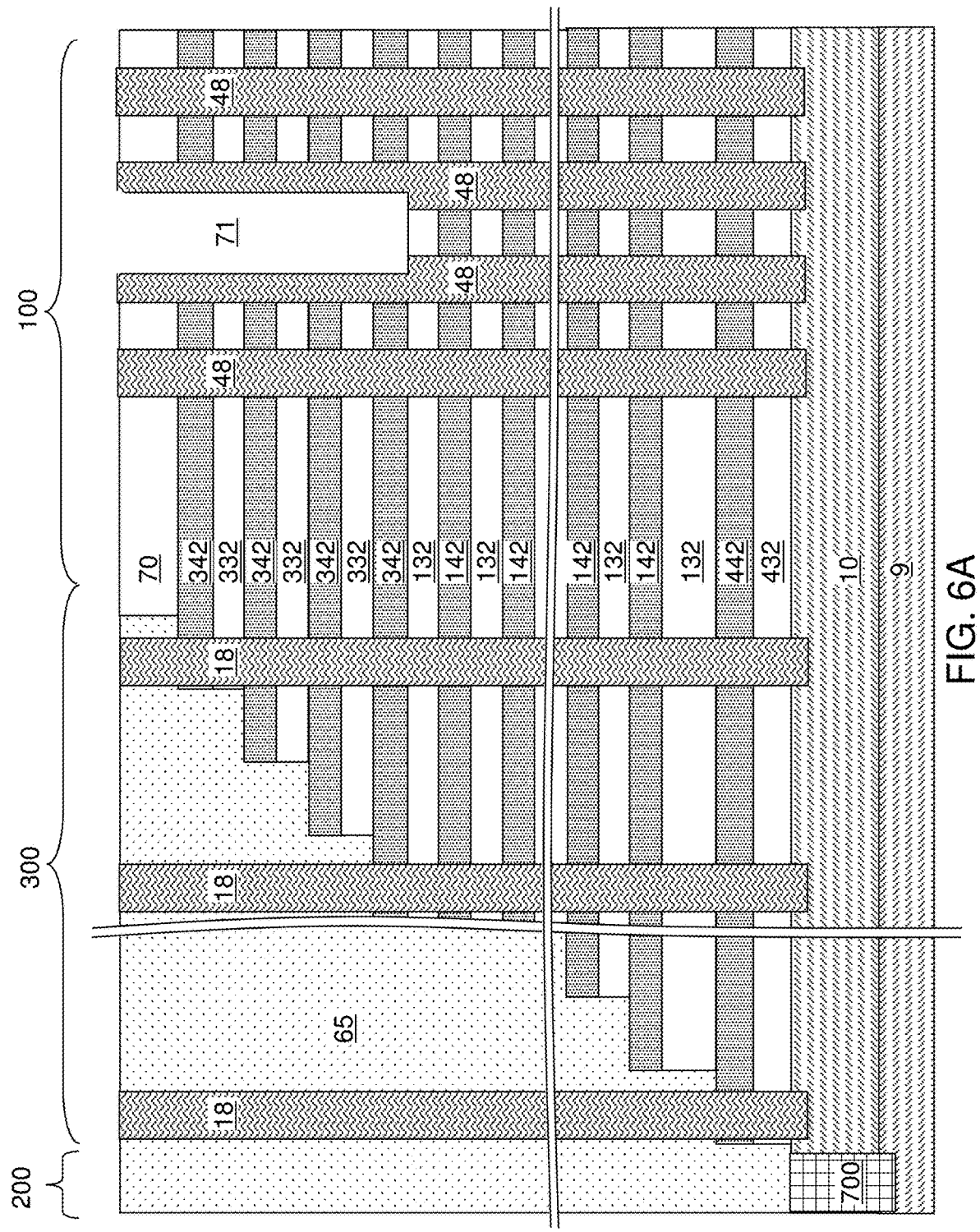
FIG. 6A is a vertical cross-sectional view of a first configuration of the exemplary structure after formation of drain-select-level trenches according to an embodiment of the present disclosure.
Figure 6B:
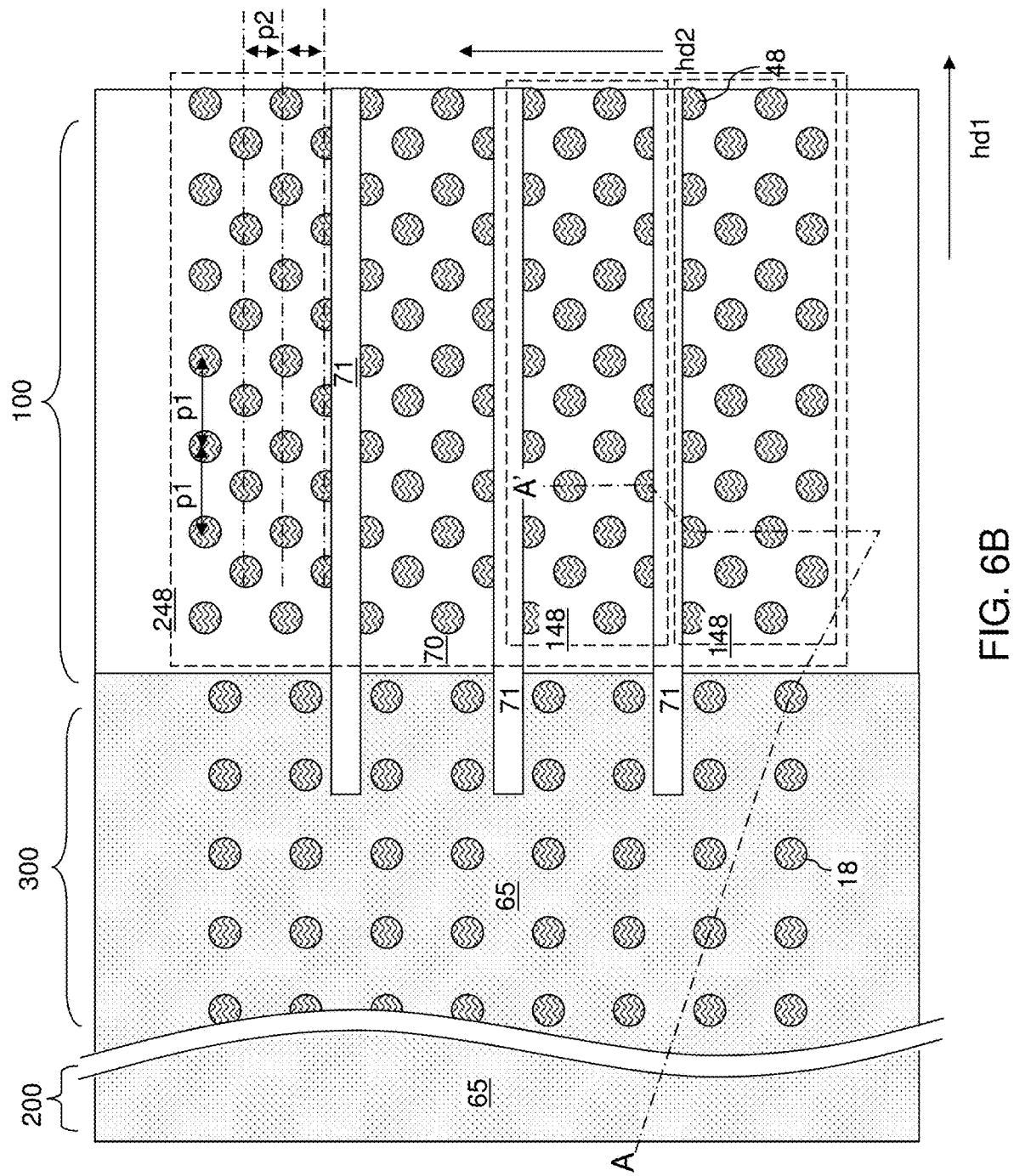
FIG. 6B a top-down view of the first configuration of the exemplary structure of FIG. 6A. The zig-zag vertical plane A-A' is the plane of the cross-section for FIG. 6A.
Figure 6C:
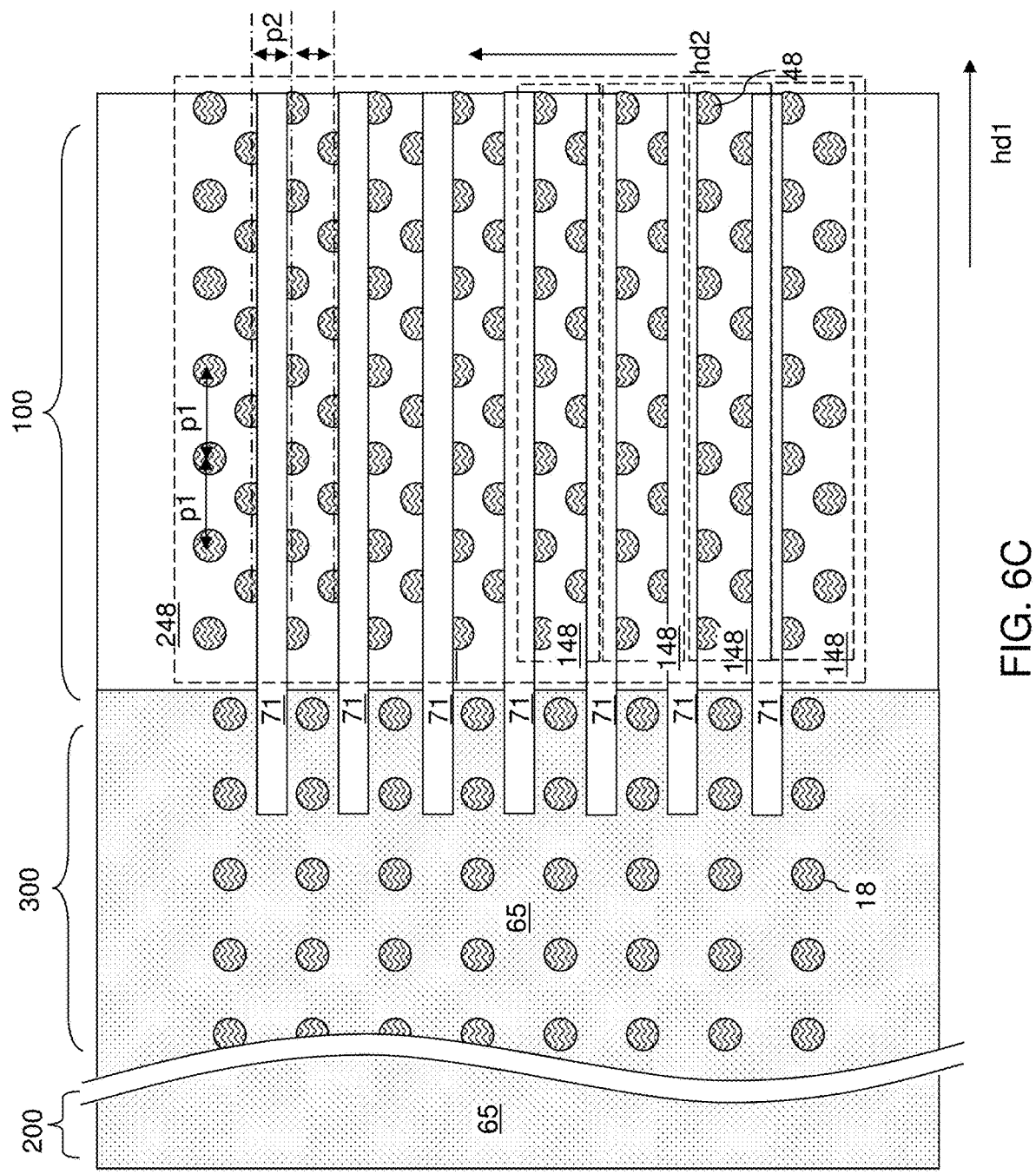
FIG. 6C is a top-down view of a second configuration of the exemplary structure at the processing steps of FIGS. 6A and 6B.

Referring to FIGS. 6A-6C, a photoresist layer (not shown) may be applied over the insulating cap layer 70, and may be lithographically patterned to form narrow openings that extend along the first horizontal direction hd1 between clusters 148 of sacrificial memory opening fill structures 48. Each cluster of sacrificial memory opening fill structures 48 may include a plurality of rows of sacrificial memory opening fill structures 48. In an embodiment illustrated in FIG. 6B, four rows of sacrificial memory opening fill structures 48 may be provided per cluster 148 of sacrificial memory opening fill structures 48. In another embodiment illustrated in FIG. 6C, two rows of sacrificial memory opening fill structures 48 may be provided per cluster of sacrificial memory opening fill structures 48. Generally, the total number of rows of sacrificial memory opening fill structures 48 per cluster 148 is the total number of rows of memory stack structures to be activated by a single strip of drain-select-level electrodes to be subsequently formed.

Multiple clusters 148 of sacrificial memory opening fill structures 48 may be positioned in proximity to one another to define a group 248 of clusters 148 of sacrificial memory opening fill structures 48. The groups 248 of sacrificial memory opening fill structures 48 may be laterally spaced from one another by a respective strip-shaped space that is free of sacrificial memory opening fill structures 48 and sacrificial support opening fill structures 18. Each elongated opening in the photoresist layer has an area that overlaps with edge portions of two underlying rows of sacrificial memory opening fill structures 48. Each elongated opening may include a pair of straight edges that extend along the first horizontal direction hd1.

An anisotropic etch process may be performed to transfer the pattern of the elongated openings in the photoresist layer through the insulating cap layer 70, each drain-select-level insulating layer 332, and each drain-select-level sacrificial material layer 342 of the alternating stack {(432, 132, 332), (442, 142, 342)}. Drain-select-level trenches 71 may be formed through the insulating cap layer 70, drain-select-level layers (332, 342) of the alternating stack {(432, 132, 332), (442, 142, 342)}, and a proximal portion of the retro-stepped dielectric material portion 65. A second anisotropic etch process may then be performed to remove portions of the sacrificial memory opening fill structures 48 protruding into the drain-select-level trenches 71. Each drain-select-level trench 71 may be formed between a neighboring pair of clusters 148 of sacrificial memory opening fill structures 48. Thus, the drain-select-level trench 71 may segregate and isolate neighboring clusters 148 of sacrificial memory opening fill structures 48. Each drain-select-level trench 71 may cut through two underlying rows of sacrificial memory opening fill structures 48 such that each underlying sacrificial memory opening fill structures 48 is partially removed to provide a respective vertical straight sidewall that extends along the first horizontal direction hd1 and a horizontal surface having a shape of a geometrical segment. As used herein, a "segment" refers to a two-dimensional shape that is obtained by dissecting a circle or an ellipse asymmetrically and by retaining the portion having an area less than one half of the circle or the ellipse.

Each drain-select-level trench 71 may laterally extend along the first horizontal direction hd1 with a uniform width along the second horizontal direction hd2. Generally, the drain-select-level trenches 71 may laterally extend along the first horizontal direction hd1 with straight sidewalls, and may vertically extend through each of the at least one drain-select-level sacrificial material layer 342 and drain-select-level insulating layer 332. The drain-select-level trenches 71 may cut through edge portions of a respective pair of rows of sacrificial memory opening fill structures 48. The width of each drain-select-level trench 71 may be in a range from 20% to 90% of the uniform intra-row pitch p1, such as from 40% to 80% of the uniform intra-row pitch p1. The photoresist layer may be subsequently removed, for example, by ashing.

Figure 7A:
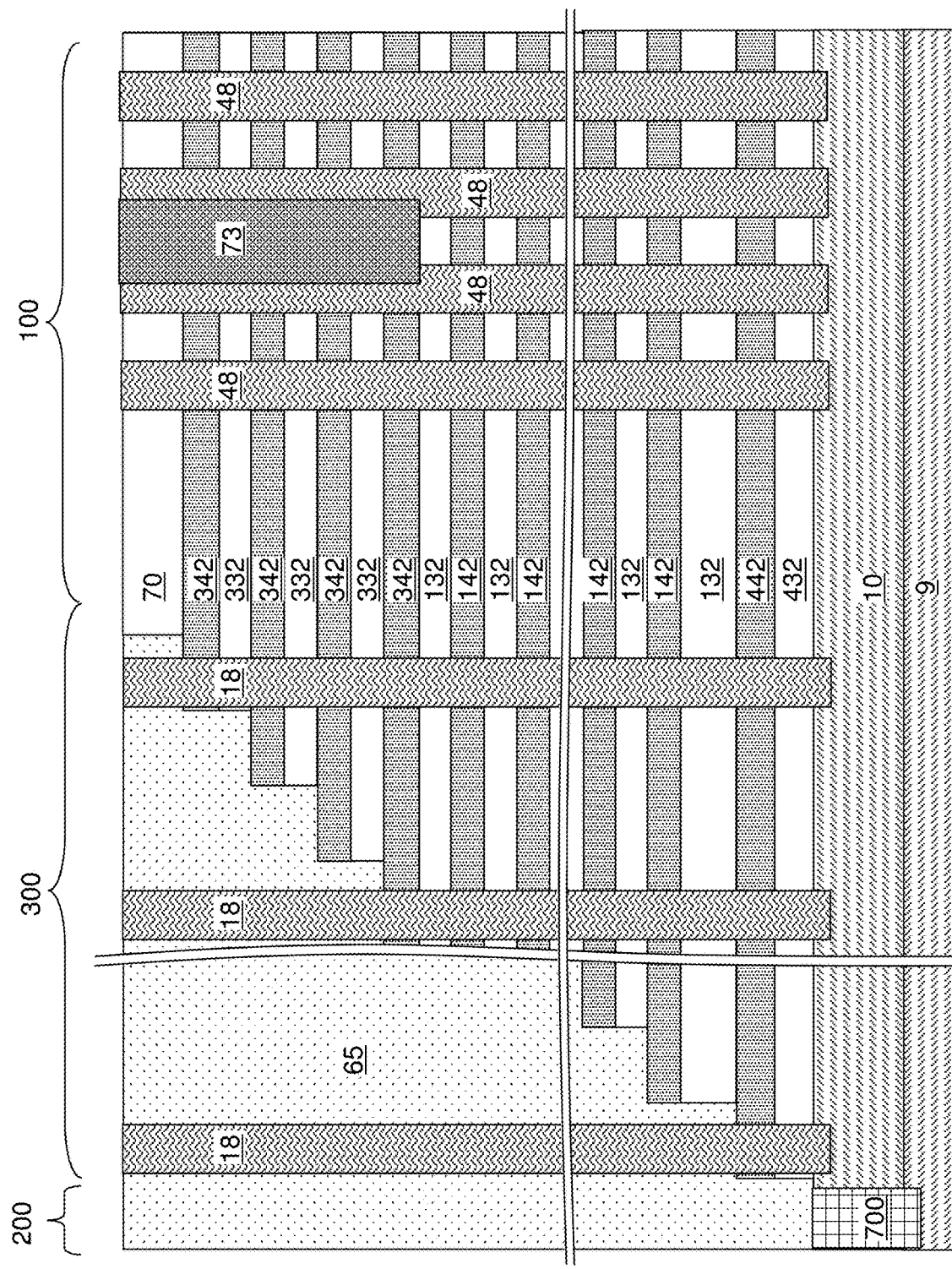
FIG. 7A is a vertical cross-sectional view of the exemplary structure after formation of sacrificial trench fill structures according to an embodiment of the present disclosure.
Figure 7B:
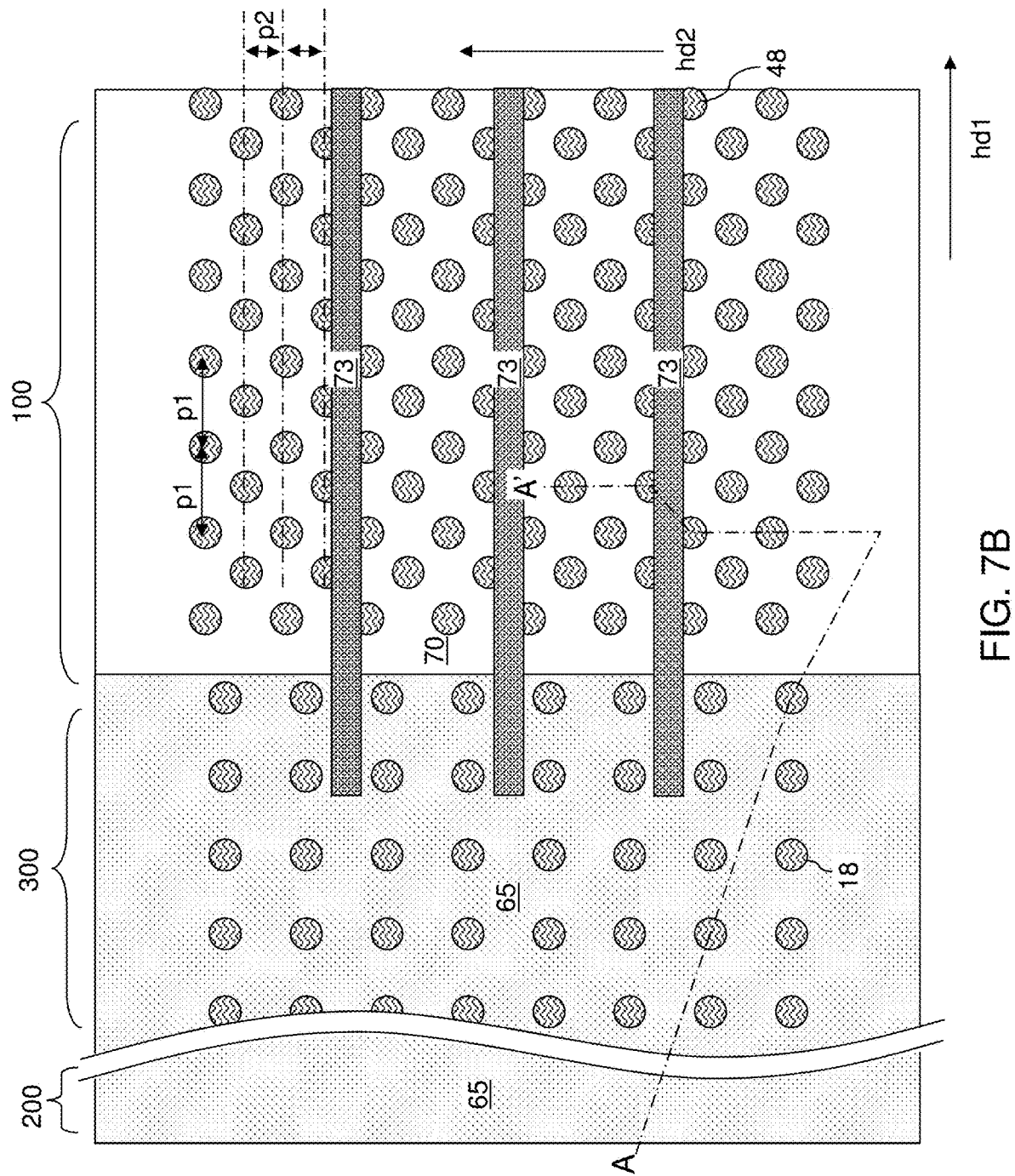
FIG. 7B a top-down view of the first configuration of the exemplary structure of FIG. 7A. The zig-zag vertical plane A-A' is the plane of the cross-section for FIG. 7A.

Referring to FIGS. 7A and 7B, a sacrificial trench fill material may be deposited in the drain-select-level trenches 71. The sacrificial trench fill material may be different from the sacrificial fill material of the sacrificial memory opening fill structures 48 and the sacrificial support opening fill structures 18. The sacrificial trench fill material may be the same as, or different from, the material of the sacrificial material layers (442, 142, 342). In one embodiment, the sacrificial trench fill material may be the same as the material of the sacrificial material layers (442, 142, 342). In one embodiment, the sacrificial trench fill material and the material of the sacrificial material layers (442, 142, 342) may be silicon nitride. In another embodiment, the sacrificial trench fill material may include a polymer material. The sacrificial trench fill material may be deposited by a conformal deposition method or by a nonconformal deposition method.

The sacrificial trench fill material may be removed from above the horizontal plane including the top surface of the insulating cap layer 70 by a planarization process such as chemical mechanical planarization. Each remaining portion of the sacrificial trench fill material in the drain-select-level trenches 71 constitutes a sacrificial trench fill structure 73. Each sacrificial trench fill structure 73 may laterally extend along the first horizontal direction hd1, and may contact vertical planar sidewalls of a pair rows of sacrificial memory opening fill structures 48.

Figure 8A:
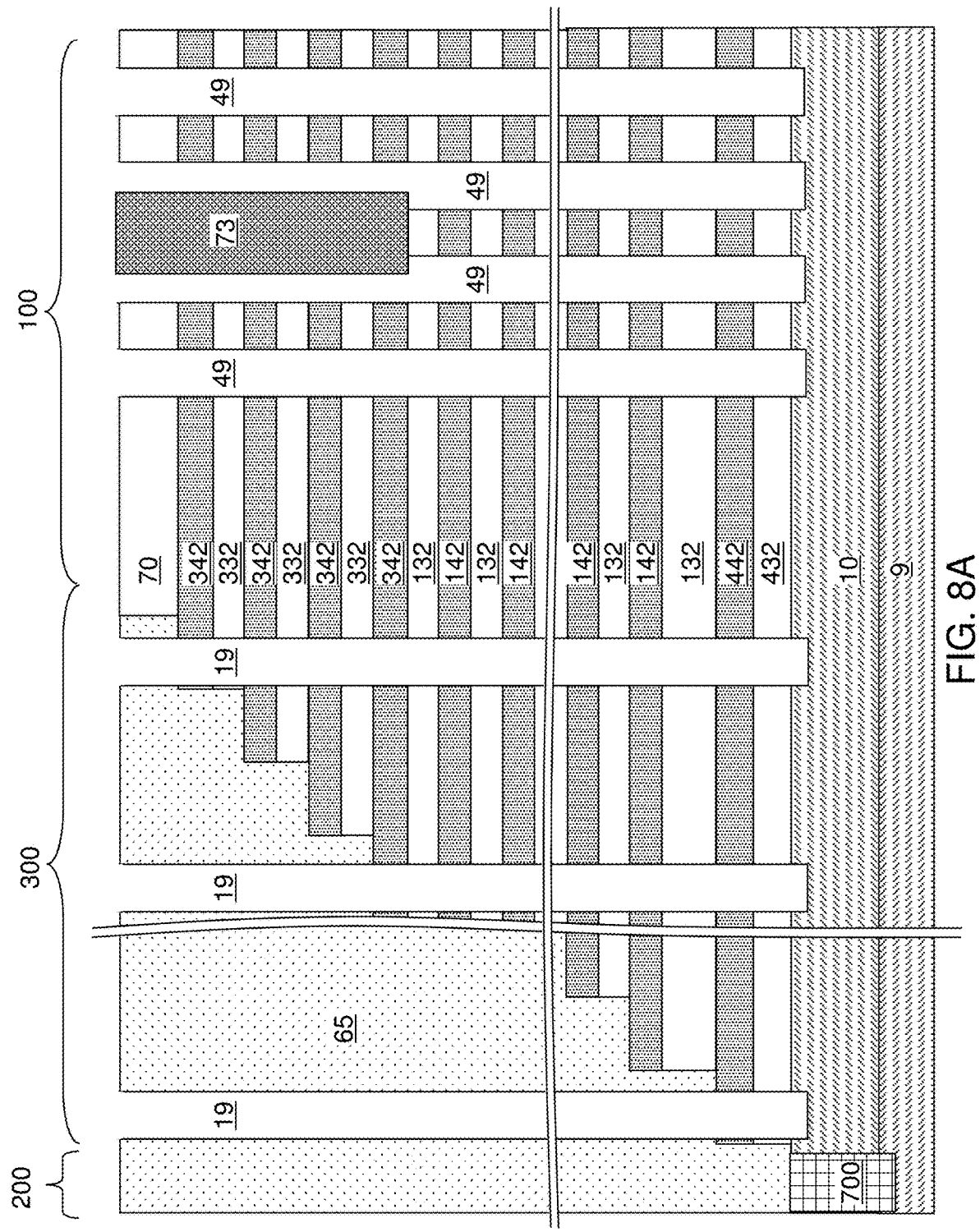
FIG. 8A is a vertical cross-sectional view of the exemplary structure after removal of the sacrificial memory opening fill structures according to an embodiment of the present disclosure.
Figure 8B:
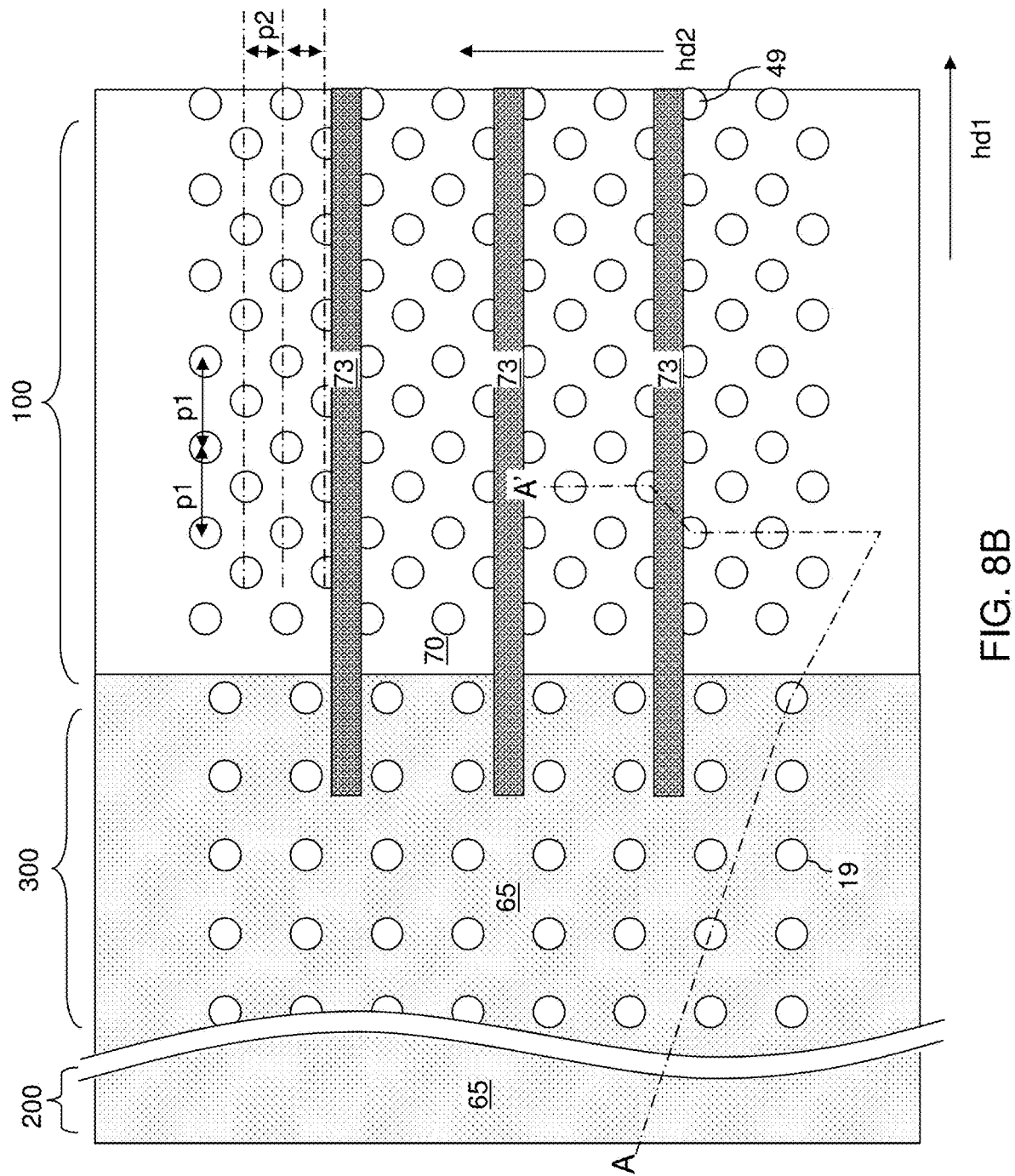
FIG. 8B a top-down view of the first configuration of the exemplary structure of FIG. 8A. The zig-zag vertical plane A-A' is the plane of the cross-section for FIG. 8A.

Referring to FIGS. 8A, 8B, and 9A, the sacrificial memory opening fill structures 48 and the sacrificial support opening fill structures 18 may be removed selective to the materials of the alternating stack {(432, 132, 332), (442, 142, 342)}, the semiconductor material layer 10, the insulating cap layer 70, the retro-stepped dielectric material portion 65, and the sacrificial trench fill structures 73. For example, if the sacrificial memory opening fill structures 48 and the sacrificial support opening fill structures 18 include amorphous silicon or a silicon-germanium alloy, the sacrificial memory opening fill structures 48 and the sacrificial support opening fill structures 18 may be removed by performing an isotropic etch process such as a wet etch process using hot trimethyl-2 hydroxyethyl ammonium hydroxide ("hot TMY") or tetramethyl ammonium hydroxide (TMAH). Cavities may be formed in the volumes of the memory openings 49 and the support openings 19. Cavities that contact any of the sacrificial trench fill structures 73 may have a smaller volume than the volume of the memory opening 49 at the same location as formed at the processing steps of FIGS. 4A and 4B due to protrusion of a sacrificial trench fill structure 73 into an upper portion of the memory opening 49.

FIGS. 9A-9G illustrate structural changes in a memory opening 49, which is one of the memory openings 49 in the exemplary structure of FIGS. 4A and 4B. The same structural change occurs simultaneously in each of the other memory openings 49 and in each of the support openings 19. FIGS. 9A-9G illustrate structural changes in a memory opening 49 that does not border a sacrificial trench fill structure 73. Structural changes in memory openings 49 that contact a sacrificial trench fill structure 73 occur with modifications as a result of reduction in lateral extent in the upper portions of the memory openings 49 due to the presence of the sacrificial trench fill structure 73.

Referring to FIG. 9A, a memory opening 49 in the exemplary device structure of FIGS. 4A and 4B is illustrated. The memory opening 49 extends through the insulating cap layer 70, the alternating stack {(432, 132, 332), (442, 142, 342)}, and optionally into an upper portion of the semiconductor material layer 10. At this processing step, each support opening 19 may extend through the retro-stepped dielectric material portion 65, a subset of layers in the alternating stack {(432, 132, 332), (442, 142, 342)}, and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 9B, an optional pedestal channel portion (e.g., an epitaxial pedestal) 11 may be formed at the bottom portion of each memory opening 49 and each support openings 19, for example, by selective epitaxy. Each pedestal channel portion 11 may comprise a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 442 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' may be present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 9C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers (442, 142, 342) may be laterally recessed with respect to the sidewalls of the insulating layers (432, 132, 332), and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, and the blocking dielectric layer 52 may be sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 9E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the memory cavity 49' in each memory opening is not filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. In one embodiment, the dielectric core layer 62L includes a dielectric material that may be etched at a higher etch rate during a subsequent anisotropic etch process than the materials of the insulating cap layer 70 and the retro-stepped dielectric material portion 65. For example, the insulating cap layer 70 and the retro-stepped dielectric material portion 65 may include undoped silicate glass, and the dielectric core layer 62L may include borosilicate glass or organosilicate glass. The dielectric core layer 62L may be deposited by a conformal deposition method such as low pressure chemical vapor deposition (LPCVD), or by a self-planarizing deposition process such as spin coating. A cavity that is not filled with the dielectric core layer 62L may be formed in volumes of memory openings 49 that contact a sacrificial trench fill structure 73.

Referring to FIG. 9G, the dielectric core layer 62L may be recessed selective to the second semiconductor channel layer 602 to remove portions of the dielectric core layer 62L from above the horizontal portion of the second semiconductor channel layer 602 that overlies the insulating cap layer 70. The material of the dielectric core layer 62L may be further recessed such that the top surface of each remaining portion of the dielectric core layer 62L within the memory openings 49 is located between a first horizontal plane including the bottom surface of the insulating cap layer 70 and a second horizontal plane including the top surface of the insulating cap layer 70. Each remaining portion of the dielectric core layer 62L in a memory opening 49 that contacts a sacrificial trench fill structure 73 constitutes a first dielectric core 162. Each remaining portion of the dielectric core layer 62L in a memory opening 49 that does not contact sacrificial trench fill structure 73 constitutes a second dielectric core, which may encapsulate a cavity underneath the bottom surface of the sacrificial trench fill structure 73.

Figure 10A:
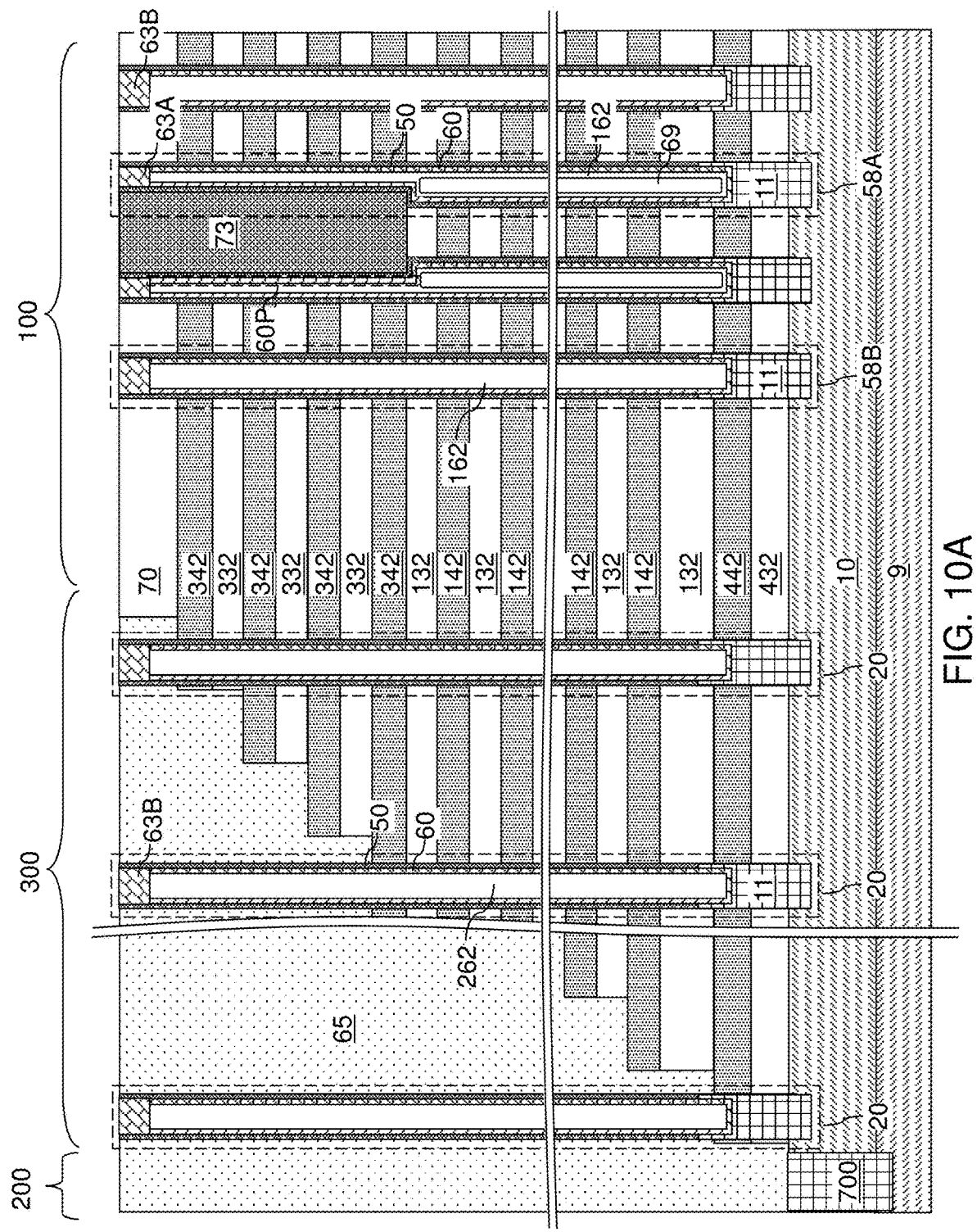
FIG. 10A is a schematic vertical cross-sectional view of the exemplary structure at the processing step of FIG. 9H according to an embodiment of the present disclosure.
Figure 10B:
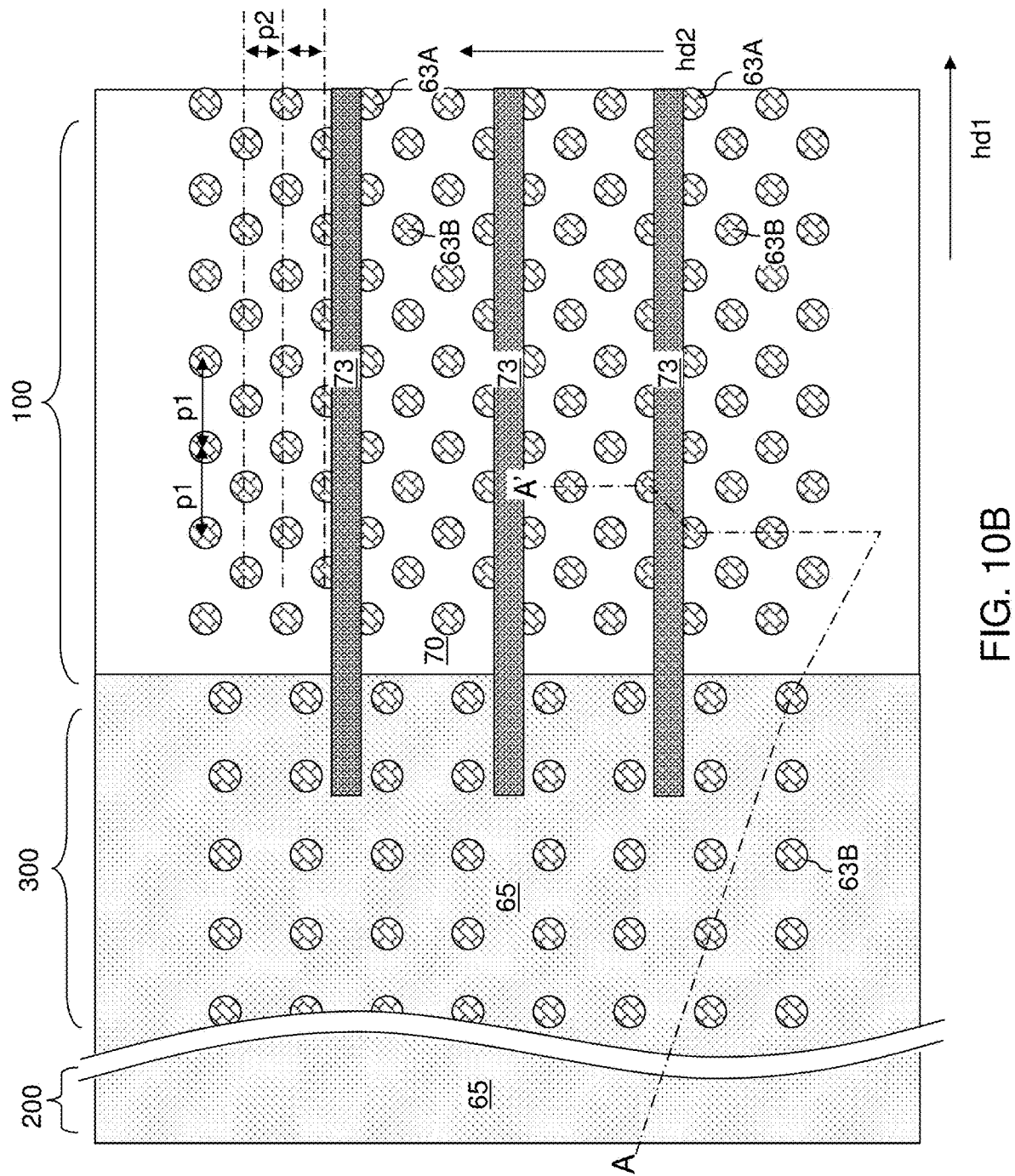
FIG. 10B a top-down view of the first configuration of the exemplary structure of FIG. 10A. The zig-zag vertical plane A-A' is the plane of the cross-section for FIG. 10A.

Referring to FIGS. 9H, 10A, and 10B, drain regions (63A, 63B) may be formed by depositing a doped semiconductor material within each recessed region above the dielectric cores (162, 262). The drain regions (63A, 63B) may have a doping of a second conductivity type that is the opposite of the first conductivity type. For example, if the first conductivity type is p-type, the second conductivity type is n-type, and vice versa. The dopant concentration in the drain regions (63A, 63B) may be in a range from $5.0 \times 10^{19}/cm^3$ to $2.0 \times$ $10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions (63A, 63B).

Drain regions that may be formed in memory openings 49 that do not contact any sacrificial trench fill structure 73 may have a cylindrical shape. Drain regions (63A, 63B) that may be formed in memory openings 49 that contact a respective sacrificial trench fill structure 73 may have a shape of a truncated cylinder that may be obtained from a cylindrical shape by cutting through the cylindrical shape along a vertical direction. Thus, the drain regions (63A, 63B) that may be formed in memory openings 49 that contact a respective sacrificial trench fill structure 73 may have a horizontal cross-sectional shape of a circle or an ellipse modified by removal of a geometrical segment. As used herein, a geometrical segment refers to a shape bounded by a chord of a circle or an ellipse and by an arc connecting two ends of the chord.

Each remaining portion of the second semiconductor channel layer 602 may be located entirety within a memory opening 49 or entirely within a support opening 19. Each first dielectric core 162 may encapsulate a cavity 69 underneath the bottom surface of a sacrificial trench fill structure 73. Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 constitutes a memory stack structure 55. Each set of material portions that fills a memory opening 49 constitutes a memory opening fill structure (58A, 58B). The memory opening fill structures (58A, 58B) include first memory opening fill structures 58A that contacts a respective sacrificial trench fill structure 73 and second memory opening fill structures 58B that do not contact any sacrificial trench fill structure 73. Each set of material portions that fills a support opening 19 constitutes a support pillar structure 20. Each vertical semiconductor channel 60 within a first memory opening fill structure 58A (which is herein referred to as a first vertical semiconductor channel) comprises a flat planar portion 60P having a vertical surface that is parallel to the first horizontal direction hd1. Each vertical semiconductor channel 60 within a second memory opening fill structure 58B (which is herein referred to as a second vertical semiconductor channel) does not comprise any flat planar portion having a vertical surface.

Each first memory opening fill structure 58A may include an optional pedestal channel portion 11, a memory film 50, a vertical semiconductor channel 60, a first dielectric core 162 forming a cavity 69 therein, and a first drain region 63A. Each first memory opening fill structure 58A contacts a respective one of the sacrificial trench fill structures 73. Each second memory opening fill structure 58B may include an optional pedestal channel portion 11, a memory film 50, a vertical semiconductor channel 60, a second dielectric core 262, and a second drain region 63B. Each second memory opening fill structure 58B is laterally spaced from, and does not contact, any of the sacrificial trench fill structures 73. Each support pillar structure 20 may include an optional pedestal channel portion 11, a memory film 50, a vertical semiconductor channel 60, a second dielectric core 262, and a second drain region 63B.

Figure 11:
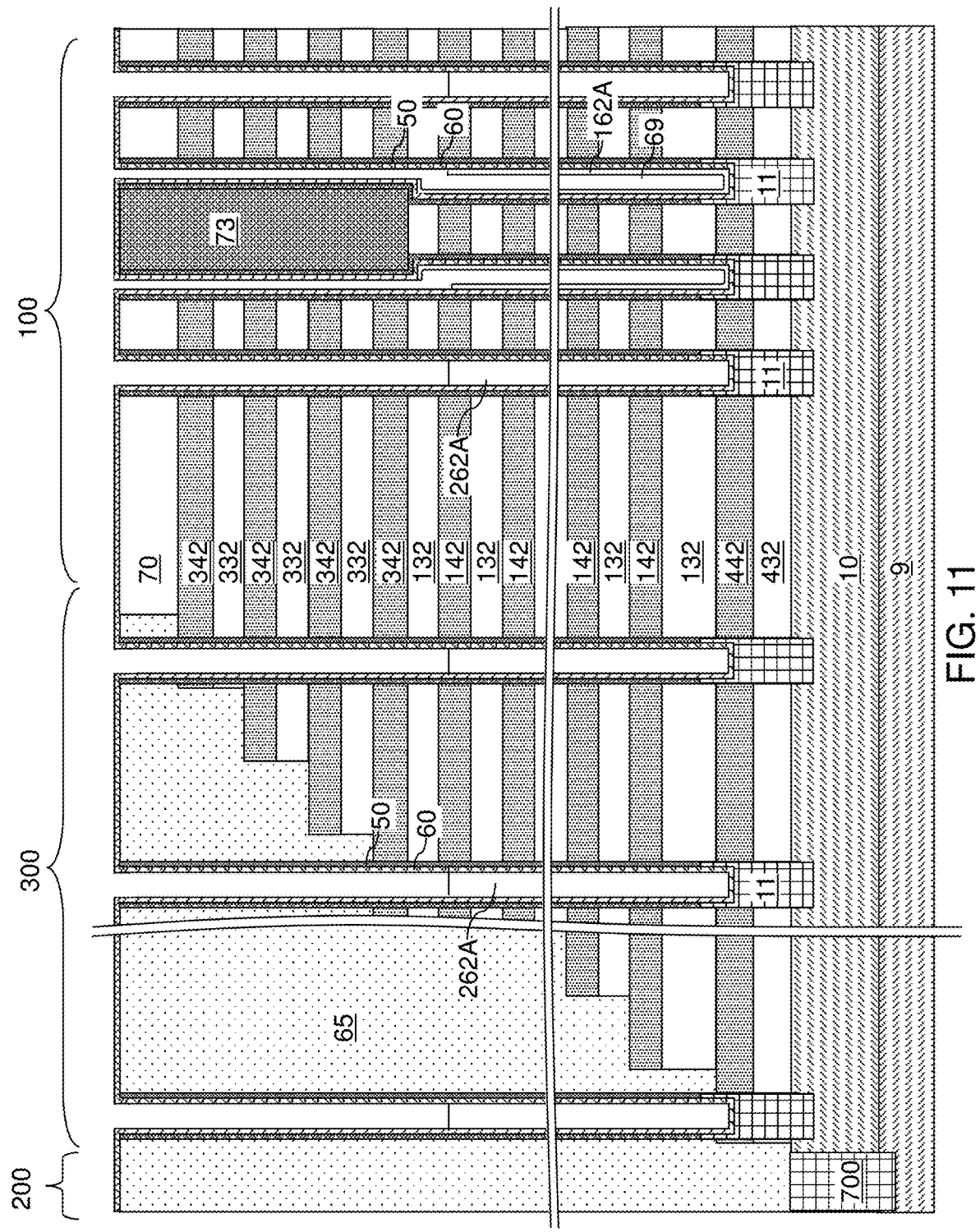
FIG. 11 is a schematic vertical cross-sectional view of an alternative configuration of the exemplary structure after formation of lower dielectric core portions according to an embodiment of the present disclosure.

Referring to FIG. 11, an alternative configuration of the exemplary structure may be derived from the exemplary structure at the processing steps of FIG. 9F by anisotropically recessing the dielectric core layer 62L to the depth of the upper portion of the cavities 69 that are located within the memory openings 49 contacted by a respective sacrificial trench fill structure 73. The material of the dielectric core layer 62L may be recessed selective to the semiconductor material of the second semiconductor channel layer 602. Each cavity 69 within memory openings 49 may continuously extend to the top surface of the insulating cap layer 70. Each remaining portion of the dielectric core layer 62L in a memory opening 49 that contacts a sacrificial trench fill structure 73 constitutes a first lower dielectric core portion 162A. Each remaining portion of the dielectric core layer 62L in a memory opening 49 that does not contact any sacrificial trench fill structure 73 constitutes a second lower dielectric core portion 262A.

Figure 12:
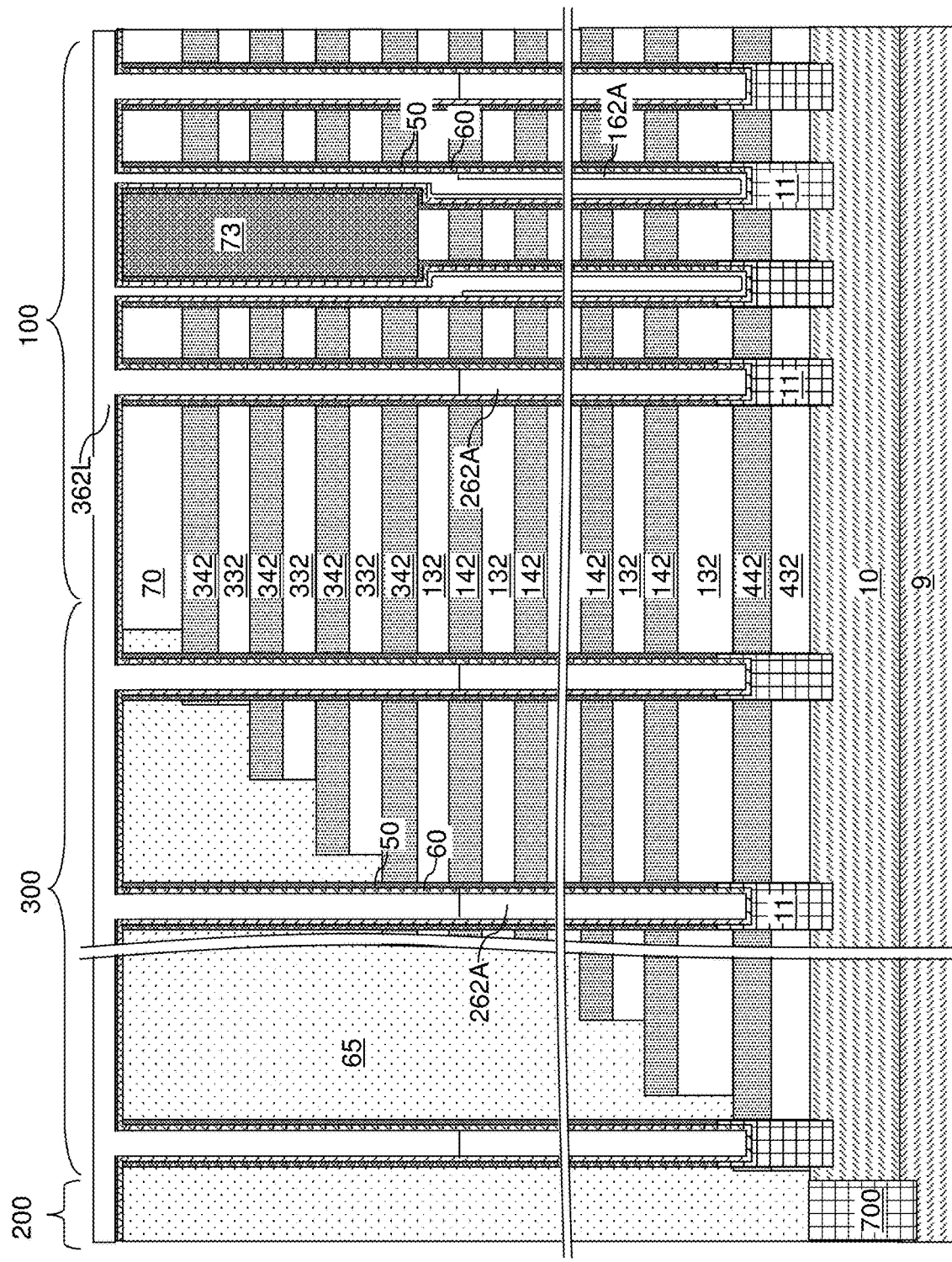
FIG. 12 is a schematic vertical cross-sectional view of the alternative configuration of the exemplary structure after formation of upper dielectric cores according to an embodiment of the present disclosure.

Referring to FIG. 12, a supplemental dielectric core layer 362L including an additional dielectric core material may be deposited in unfilled volumes within the memory openings 49 and the support openings 19. The supplemental dielectric core layer 362L may include a dielectric material that may be subsequently recessed selective to the semiconductor material of the second semiconductor channel layer 602. For example, the supplemental dielectric core layer 362L may include undoped silicate glass, a doped silicate glass, or organosilicate glass.

Figure 13A:
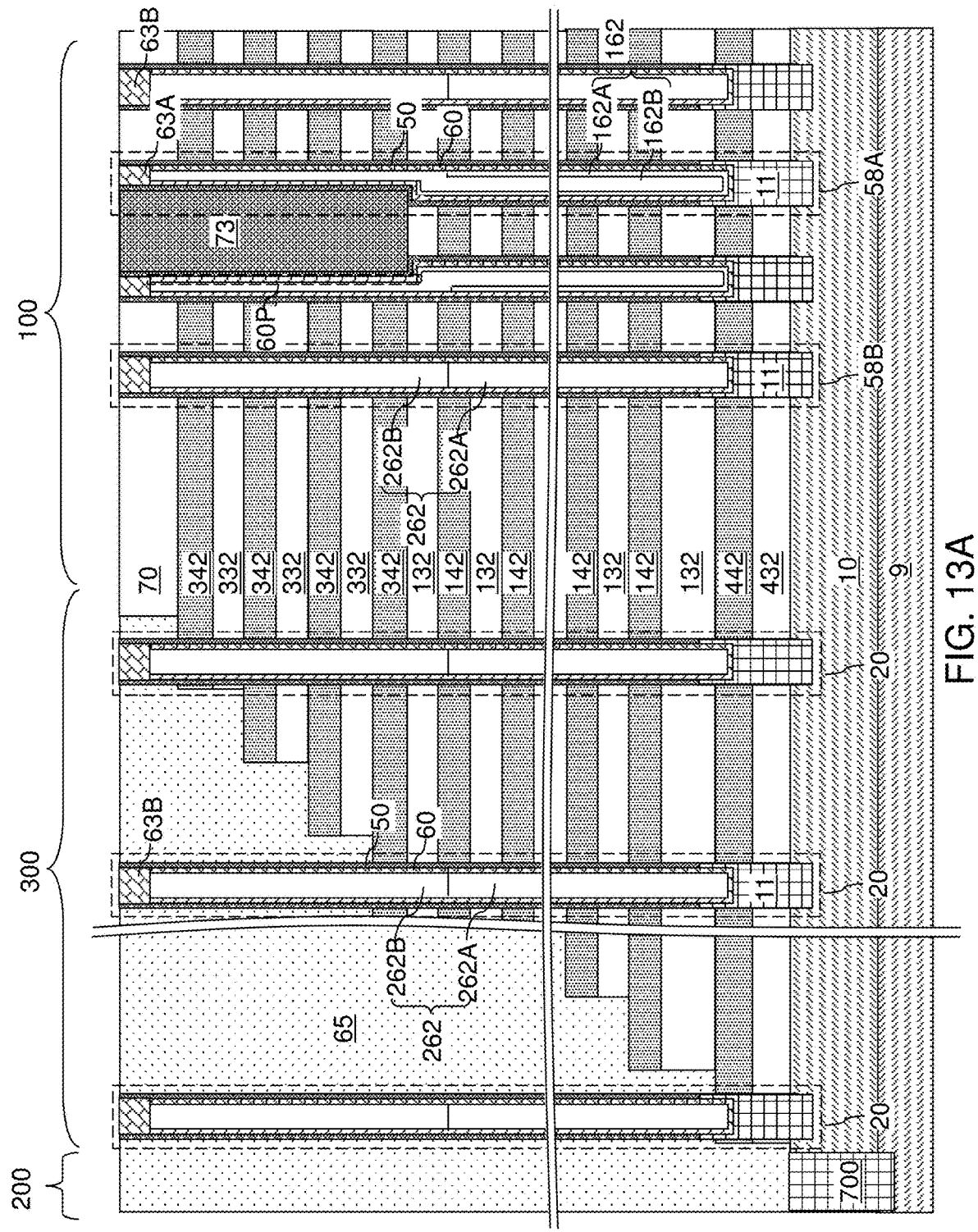
FIG. 13A is a vertical cross-sectional view of the alternative configuration of the exemplary structure after formation of drain regions according to an embodiment of the present disclosure.
Figure 13B:
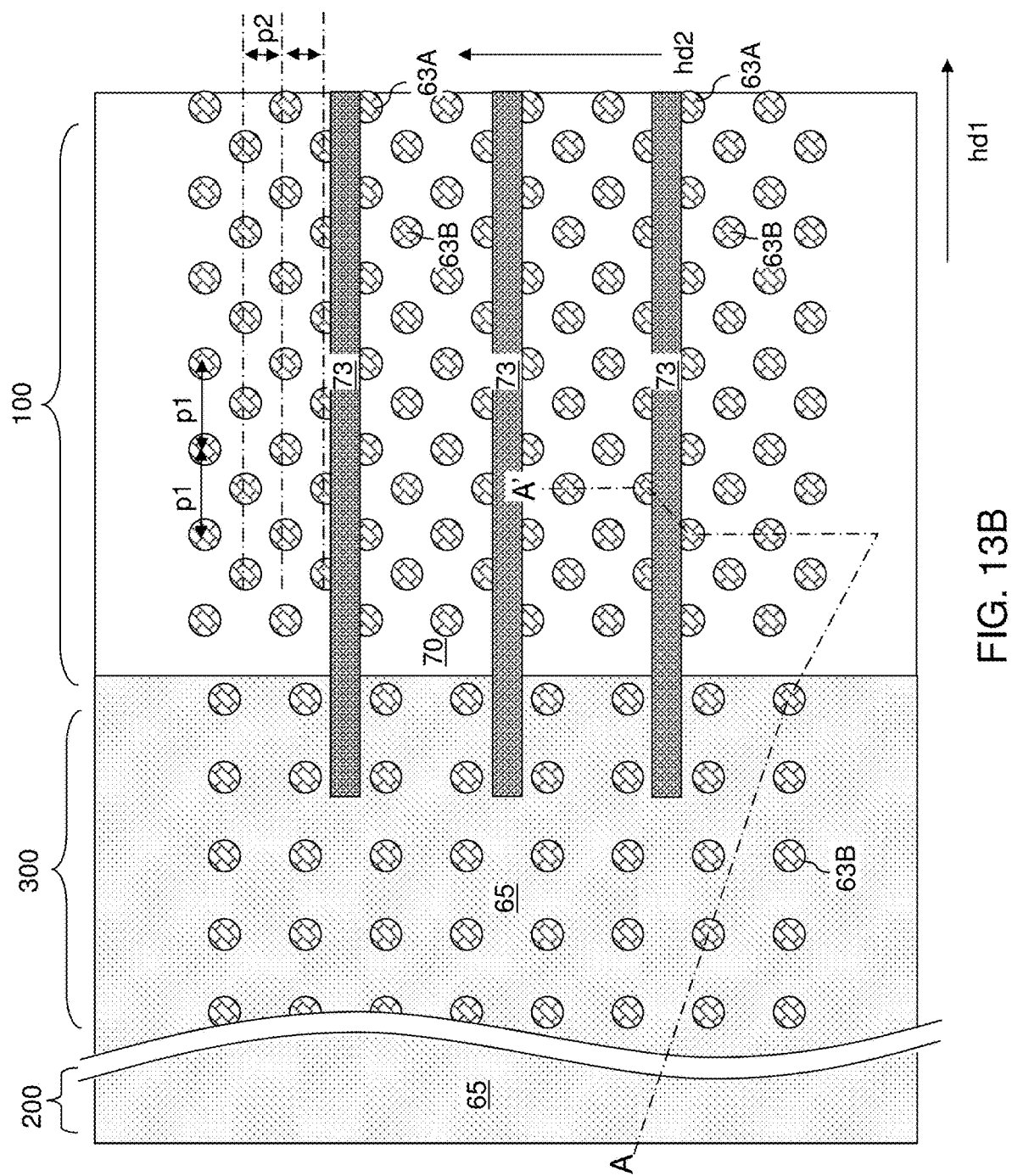
FIG. 13B a top-down view of the first configuration of the exemplary structure of FIG. 13A. The zig-zag vertical plane A-A' is the plane of the cross-section for FIG. 13A.
Figure 14A:
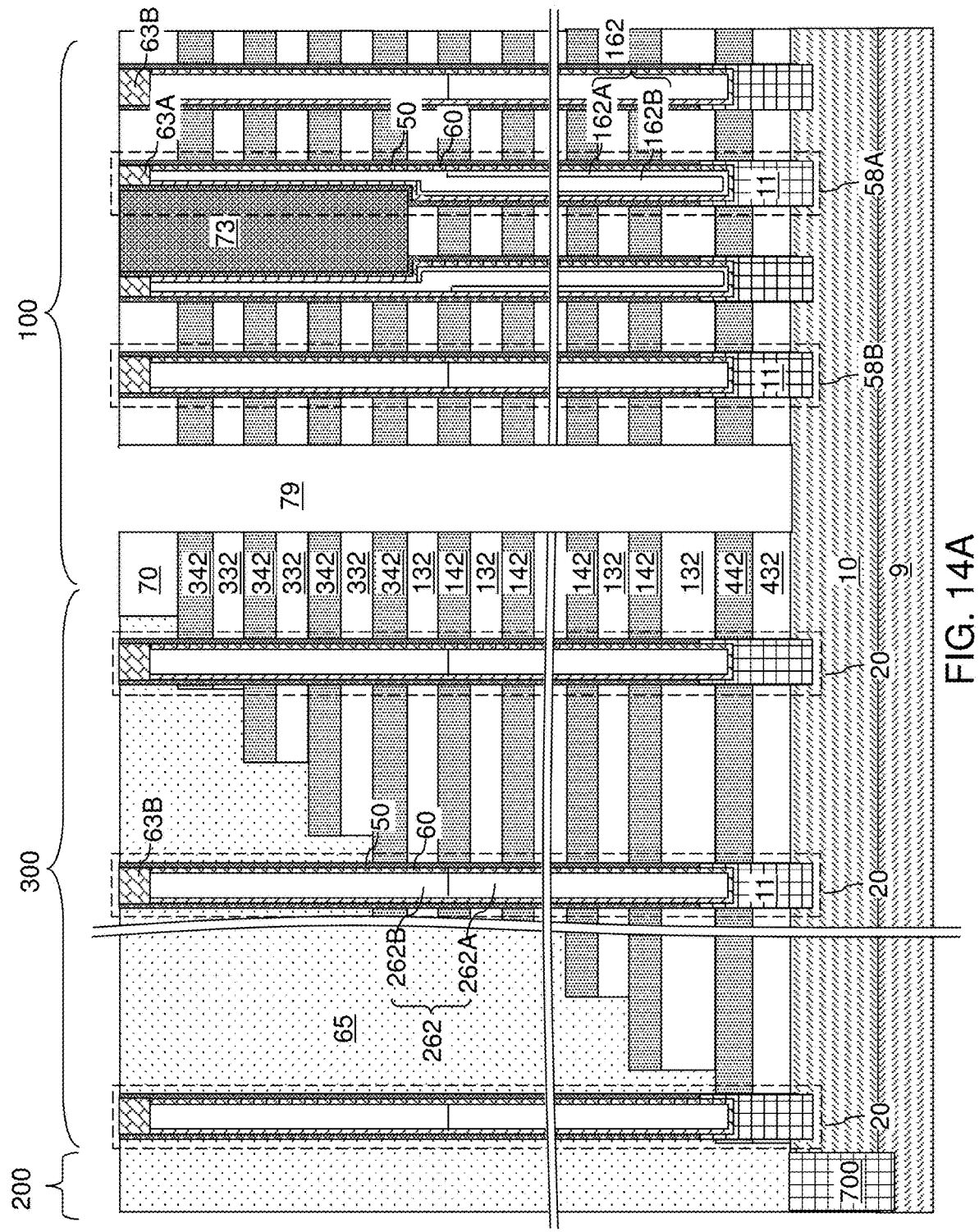
FIG. 14A is a schematic vertical cross-sectional view of the exemplary structure after formation of backside trenches according to an embodiment of the present disclosure.
Figure 14B:
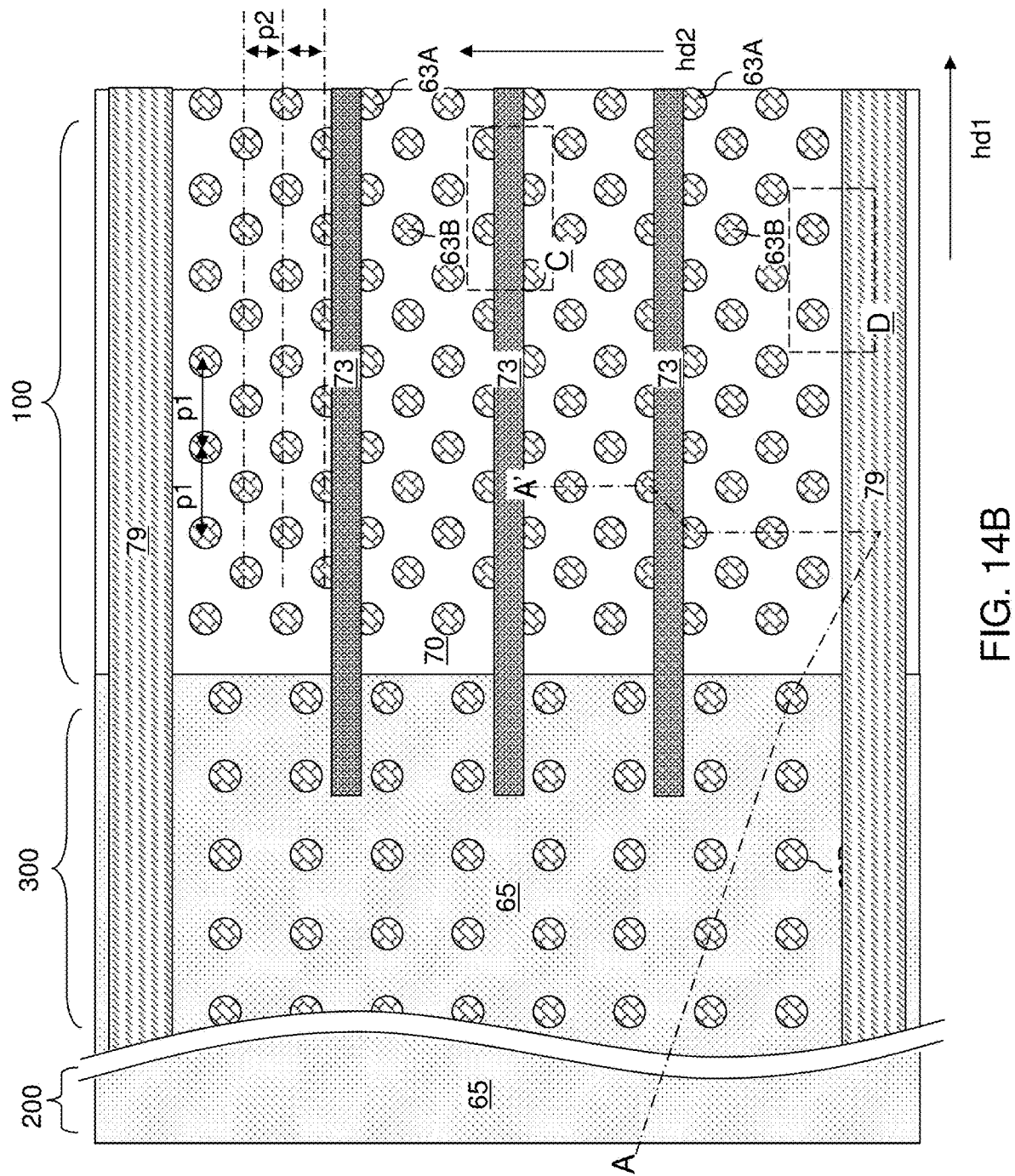
FIG. 14B is a top-down view of the exemplary structure of FIG. 14A. The zig-zag vertical plane A-A' is the plane of the schematic vertical cross-sectional view of FIG. 14A.
Figure 14D:
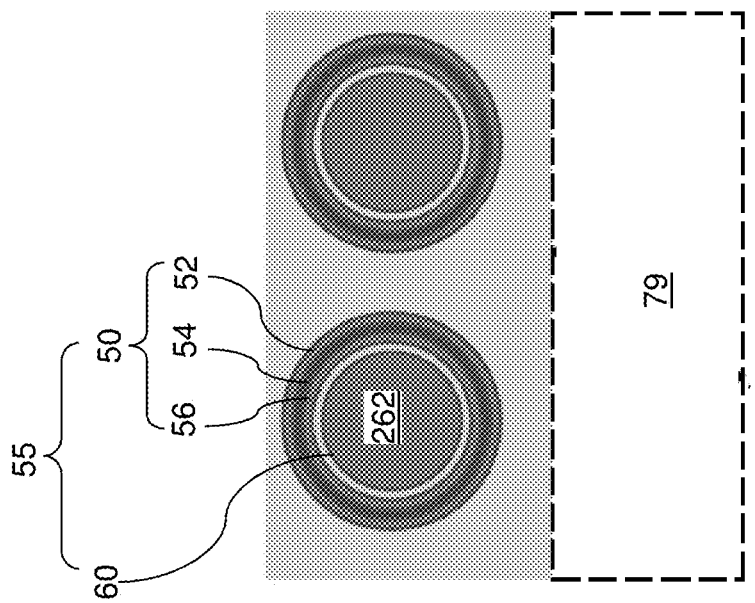
FIG. 14D is a top-down view of a region including a backside trench in the exemplary structure of FIGS. 14A and 14B.
Figure 14C:
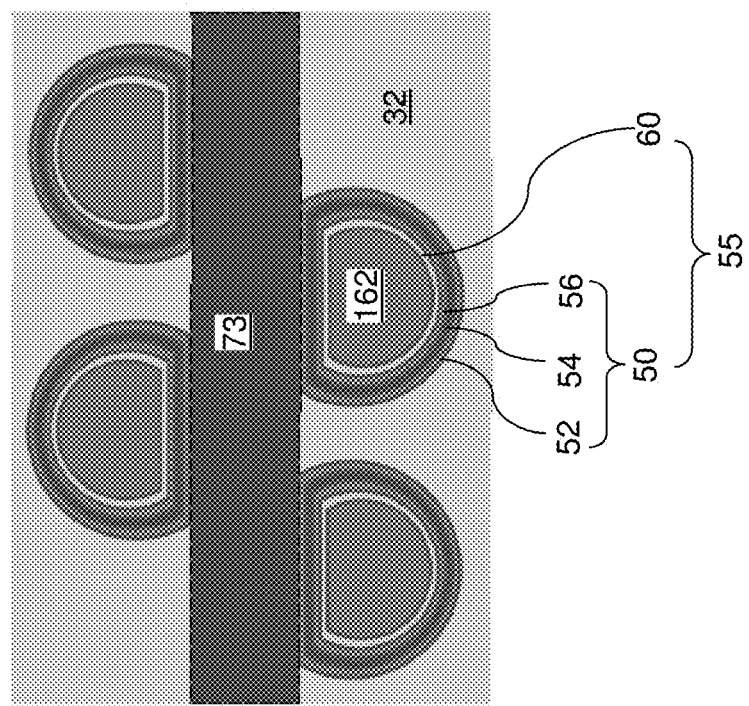
FIG. 14C is top-down view of a region including a sacrificial trench fill structure in the exemplary structure of FIGS. 14A and 14B.

Referring to FIGS. 13A and 13B, the supplemental dielectric core layer 362L may be recessed selective to the second semiconductor channel layer 602 to remove portions of the supplemental dielectric core layer 362L from above the topmost surface of the second semiconductor channel layer 602. The material of the supplemental dielectric core layer 362L may be further recessed such that the top surface of each remaining portion of the supplemental dielectric core layer 362L within the memory openings 49 is located between a first horizontal plane including the bottom surface of the insulating cap layer 70 and a second horizontal plane including the top surface of the insulating cap layer 70. Each remaining portion of the supplemental dielectric core layer 362L in a memory opening 49 that contacts a sacrificial trench fill structure 73 constitutes a first upper dielectric core portion 162B. Each remaining portion of the dielectric core layer 62L in a memory opening 49 that does not contact any sacrificial trench fill structure 73 constitutes a second upper dielectric core portion 262B. Each combination of a first lower dielectric core portion 162A and a first upper dielectric core portion 162B constitutes a first dielectric core 162. Each combination of a second lower dielectric core portion 262A and a second upper dielectric core portion 262B constitutes a second dielectric core 262.

Subsequently, the processing steps of FIGS. 9H, 10A, and 10B may be performed to form a first memory opening fill structure 58A within each memory opening 49 that contacts a respective sacrificial trench fill structure 73, and to form a second memory opening fill structure 58B within each memory opening 49 that does not contact any sacrificial trench fill structure 73. Each combination of a memory film 50 and a vertical semiconductor channel 60 constitutes a memory stack structure 55. Each set of material portions that fills a memory opening 49 constitutes a memory opening fill structure (58A, 58B). The memory opening fill structures (58A, 58B) include first memory opening fill structures 58A that contacts a respective sacrificial trench fill structure 73 and second memory opening fill structures 58B that does not contact any sacrificial trench fill structure 73. Each set of material portions that fills a support opening 19 constitutes a support pillar structure 20.

Each first memory opening fill structure 58A may include an optional pedestal channel portion 11, a memory film 50, a vertical semiconductor channel 60, a first dielectric core 162, and a first drain region 63A. Each first memory opening fill structure 58A contacts a respective one of the sacrificial trench fill structures 73. Each second memory opening fill structure 58B may include an optional pedestal channel portion 11, a memory film 50, a vertical semiconductor channel 60, a second dielectric core 262, and a second drain region 63B. Each second memory opening fill structure 58B is laterally spaced from, and does not contact, the sacrificial trench fill structures 73. Each support pillar structure 20 may include an optional pedestal channel portion 11, a memory film 50, a vertical semiconductor channel 60, a second dielectric core 262, and a second drain region 63B.

In each configuration of the exemplary structure illustrated in FIGS. 9H, 10A, and 10B and in FIGS. 13A and 13B, each of the memory opening fill structures (58A, 58B) comprises a respective memory film 50 and a respective vertical semiconductor channel 60. The memory stack structures 55 in the first memory opening fill structures 58A are herein referred to as first memory stack structures 55, and the memory stack structures 55 in the second memory opening fill structures 58B are herein referred to as second memory stack structures 55. Each of the first memory stack structures 55 in the first memory opening fill structures 58A has a horizontal surface having a shape of a geometrical segment within a horizontal plane including bottom surfaces of the drain-select-level trenches 71, which are filled with the sacrificial trench fill structure 73. Each geometrical segment has a two-dimensional shape defined by a periphery consisting of an arc and a chord.

In one embodiment, each of the sacrificial trench fill structure 73 overlies, and contacts, a respective row of horizontal surfaces of the first memory opening fill structures 58A arranged along the first horizontal direction hd1. In one embodiment, each of the first memory stack structures 55 comprises a planar sidewall having a bottom edge that is adjoined to a straight edge of a respective horizontal surface of the first memory opening fill structures 58A and contacting a sidewall of a respective one of the drain-select-level trenches 71, which are filled with the sacrificial trench fill structure 73.

In one embodiment, each of the first memory stack structures 55 comprises a circular-cylindrical or elliptical-cylindrical sidewall that is located below the horizontal plane including the bottom surfaces of the drain-select-level trenches 71, is adjoined to a curved edge of a respective horizontal surface the first memory opening fill structures 58A, and laterally bounds a volume of a respective first memory stack structure 55 below the horizontal plane including the bottom surfaces of the drain-select-level trenches 71. As used herein, a circular-cylindrical sidewall refers to a sidewall having a vertical surface of a cylinder having a circular horizontal cross-sectional shape, and an elliptical-cylindrical sidewall refers to a sidewall having a vertical surface of a cylinder having an elliptical horizontal cross-sectional shape.

In one embodiment, each of the first memory stack structures 55 includes a respective first memory film 50 and a respective first vertical semiconductor channel 60; and each first vertical semiconductor channel 60 comprises a flat planar portion 60P having a vertical surface that is parallel to the first horizontal direction hd1. In one embodiment, the flat planar portion is laterally spaced from a most proximal one to the drain-select-level trenches 71 by a vertical flat portion of the respective memory film 50. In one embodiment, each of the memory films 50 comprises a stack that includes a charge storage layer 54 and a tunneling dielectric layer 56 that contacts a respective one of the first vertical semiconductor channels 60.

Referring to FIGS. 14A-14D, a photoresist layer (not shown) may be applied over the insulating cap layer 70 and the retro-stepped dielectric material portion 65, and is lithographically patterned to form openings in areas between clusters of memory opening fill structures (58A, 58B). The pattern in the photoresist layer may be transferred through the insulating cap layer 70, the alternating stack {(432, 132, 332), (442, 142, 342)} and/or the retro-stepped dielectric material portion 65 using an anisotropic etch to form backside trenches 79. The backside trenches 79 may extend through each layer of the alternating stack {(432, 132, 332), (442, 142, 342)}. The backside trenches 79 vertically extend from the top surface of the insulating cap layer 70 and the retro-stepped dielectric material portion 65 to the top surface of the substrate (9, 10), and laterally extend through the memory array region 100 and the staircase region 300.

In one embodiment, the backside trenches 79 may laterally extend along the first horizontal direction hd1 and may be laterally spaced apart from one another along the second horizontal direction hd2 that is perpendicular to the first horizontal direction hd1. The memory opening fill structures (58A, 58B) may be arranged in rows that extend along the first horizontal direction hd1. The sacrificial trench fill structures 73 may laterally extend along the first horizontal direction hd1. Each backside trench 79 may have a uniform width that is uniform along the lengthwise direction (i.e., along the first horizontal direction hd1). Each sacrificial trench fill structure 73 may have a uniform vertical cross-sectional profile along vertical planes that are perpendicular to the first horizontal direction hd1 that is invariant with translation along the first horizontal direction hd1.

A cluster of memory opening fill structures (58A, 58B) including a respective plurality of rows of memory opening fill structures (58A, 58B) may be located between each neighboring pair of sacrificial trench fill structures 73 and between each neighboring pair of a sacrificial trench fill structure 73 and a backside trench 79. Multiple clusters of memory opening fill structures (58A, 58B) may be located between a neighboring pair of a backside trench 79. In one embodiment, the backside trenches 79 may include a source contact opening in which a source contact via structure may be subsequently formed. The photoresist layer may be removed, for example, by ashing.

Figure 15A:
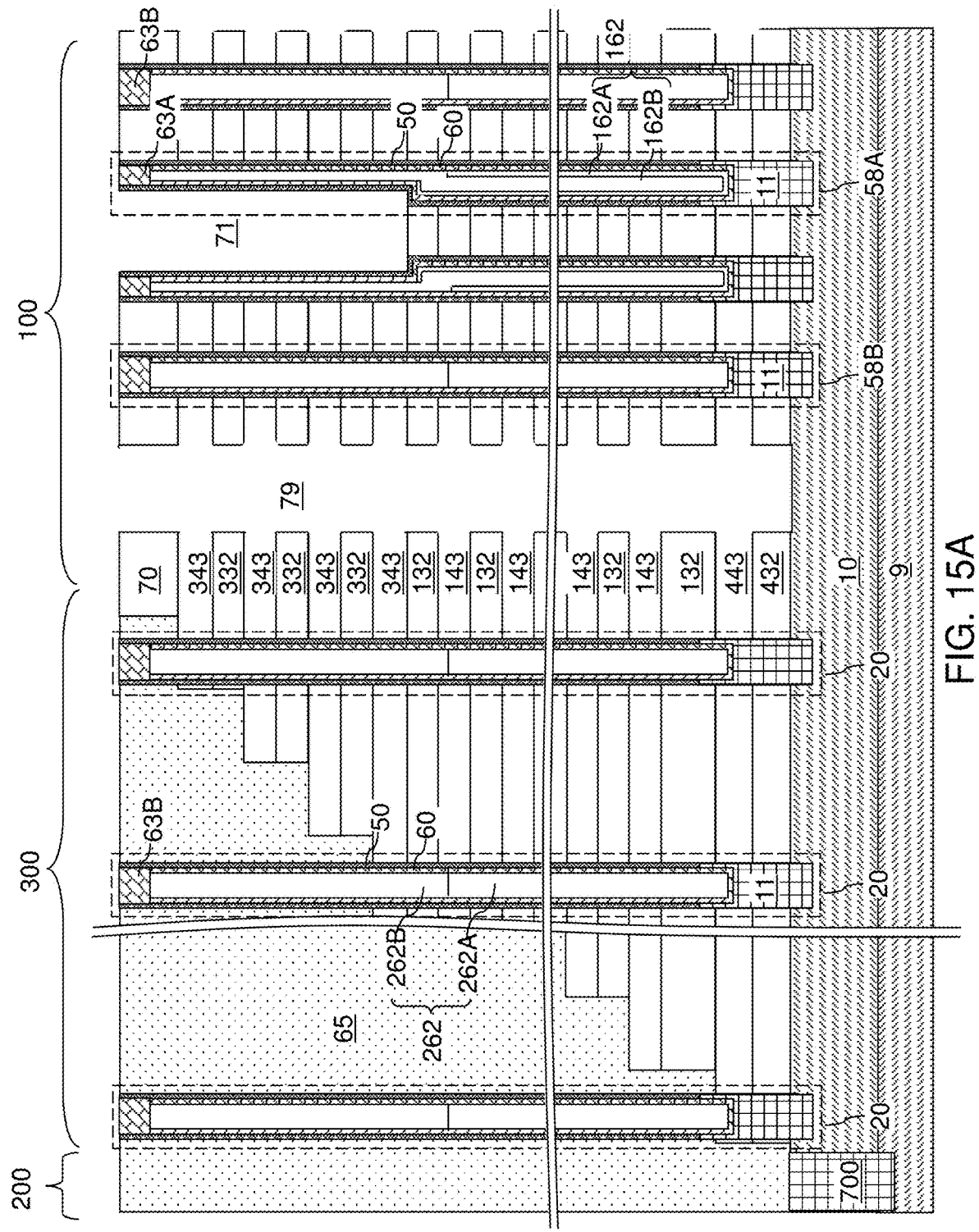
FIG. 15A is a schematic vertical cross-sectional view of the exemplary structure after formation of backside recesses according to an embodiment of the present disclosure.
Figure 15B:
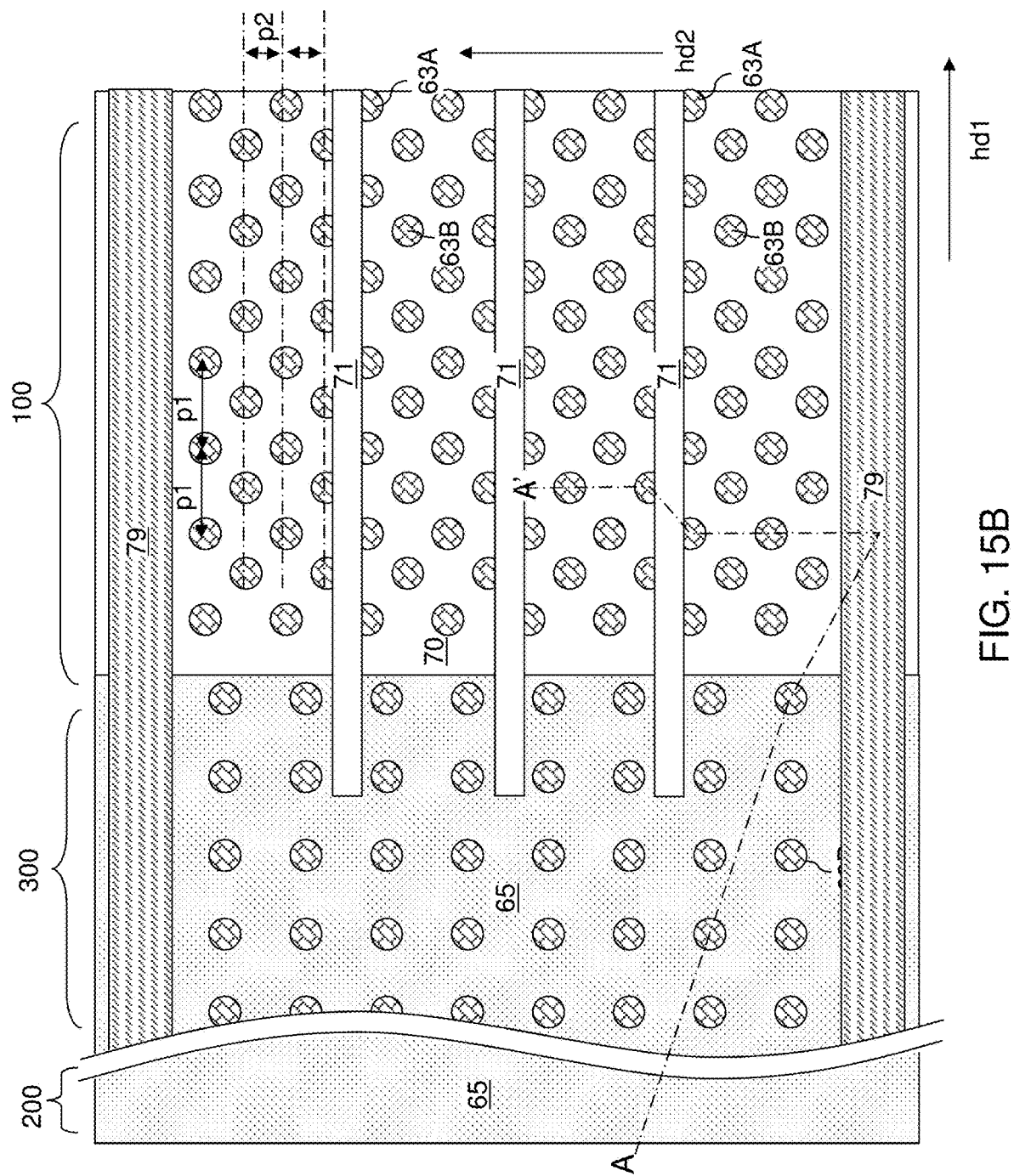
FIG. 15B is a top-down view of the exemplary structure of FIG. 15A. The zig-zag vertical plane A-A' is the plane of the schematic vertical cross-sectional view of FIG. 15A.

Referring to FIGS. 15A and 15B, an etchant that selectively etches the second material of the sacrificial material layers (442, 142, 342) with respect to the first material of the insulating layers (432, 132, 332) may be introduced into the backside trenches 79, for example, using an isotropic etch process. The sacrificial trench fill structures 73 may be removed simultaneously with removal of the sacrificial material layers (442, 142, 342) during the isotropic etch process. Alternatively, if the sacrificial trench fill structures 73 include a different material than the sacrificial material layers (442, 142, 342), an anisotropic etch process or another isotropic etch process may be performed prior to, or after, the isotropic etch process to remove the sacrificial material layers (442, 142, 342). A void may be formed within each volume of the drain-select-level trenches 71.

Backside recesses may be formed in volumes from which the sacrificial material layers (442, 142, 342) are removed. The backside recesses include word-line-level backside recesses 143 that may be formed in volumes from which the word-line-level sacrificial material layers 142 are removed, drain-select-level backside recesses 343 that may be formed in volumes from which the drain-select-level sacrificial material layers 342 are removed, and source-select-level backside recesses 443 that may be formed in volumes from which the source-select-level sacrificial material layer 442 is removed. The removal of the second material of the sacrificial material layers (442, 142, 342) may be selective to the first material of the insulating layers (432, 132, 332), the material of the retro-stepped dielectric material portion 65, the semiconductor material of the semiconductor material layer 10, and the material of the outermost layer of the memory films 50. In one embodiment, the sacrificial material layers (442, 142, 342) may include silicon nitride, and the materials of the insulating layers (432, 132, 332) and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers (442, 142, 342) include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses (443, 143, 343) may be present within volumes previously occupied by the sacrificial material layers (442, 142, 342).

Each backside recess (443, 143, 343) may be a laterally extending cavity having a lateral dimension that is greater than the vertical extent of the cavity. In other words, the lateral dimension of each backside recess (443, 143, 343) may be greater than the height of the backside recess (443, 143, 343). A plurality of backside recesses (443, 143, 343) may be formed in the volumes from which the second material of the sacrificial material layers (442, 142, 342) is removed. The memory openings in which the memory stack structures 55 are formed are herein referred to as front side openings or front side cavities in contrast with the backside recesses (443, 143, 343). In one embodiment, the memory array region 100 comprises an array of monolithic three-dimensional NAND strings having a plurality of device levels disposed above the substrate (9, 10). In this case, each backside recess (443, 143, 343) may define a space for receiving a respective word line of the array of monolithic three-dimensional NAND strings.

The drain-select-level backside recesses 343 may be connected to the drain-select-level trenches 71. Each of the plurality of backside recesses (443, 143, 343) may extend substantially parallel to the top surface of the substrate (9, 10). A backside recess (443, 143, 343) may be vertically bounded by a top surface of an underlying insulating layer (432, 132, 332) and a bottom surface of an overlying insulating layer (132, 332). In one embodiment, each backside recess (443, 143, 343) may have a uniform height throughout. The cavities in the drain-select-level trenches 71 are herein referred to as drain-select-level cavities.

Referring to FIG. 16A, physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 16B, a backside blocking dielectric layer 44 may be optionally formed. The backside blocking dielectric layer 44, if present, comprises a dielectric material that functions as a control gate dielectric for the control gates to be subsequently formed in the backside recesses (443, 143, 343). The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In embodiments in which the blocking dielectric layer 52 is present within each memory opening, the backside blocking dielectric layer 44 is optional. In embodiments in which the blocking dielectric layer 52 is omitted, the backside blocking dielectric layer 44 is present. The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

Referring to FIG. 16C, a metallic barrier layer 46A may be deposited in the backside recesses (443, 143, 343), in the drain-select-level trenches 71, on the sidewalls of the backside trenches 79, and over the top surface of the insulating cap layer 70. The metallic barrier layer 46A may include an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 17A:
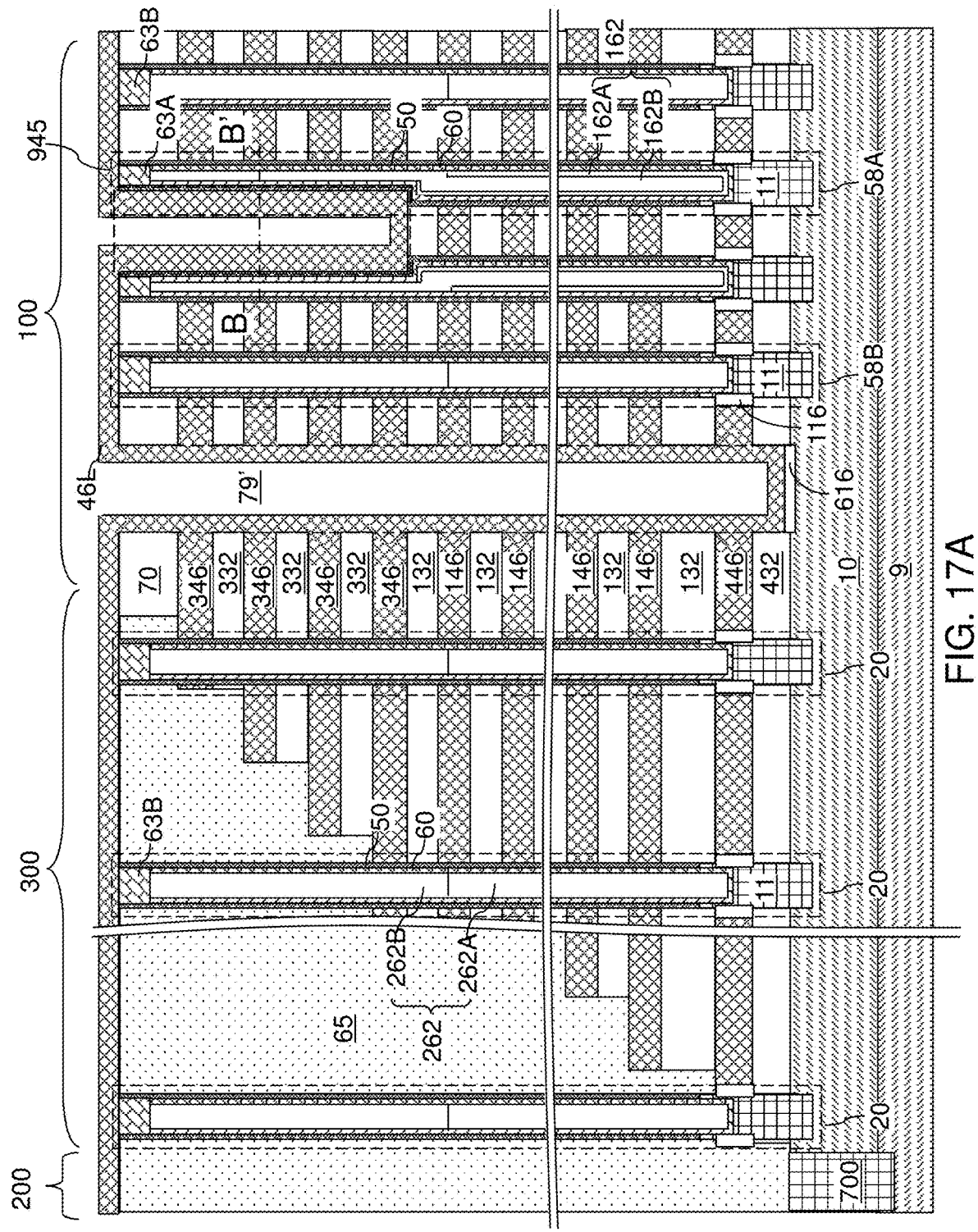
FIG. 17A is a schematic vertical cross-sectional view of the exemplary structure after conformal deposition of at least one electrically conductive material according to an embodiment of the present disclosure.
Figure 17B:
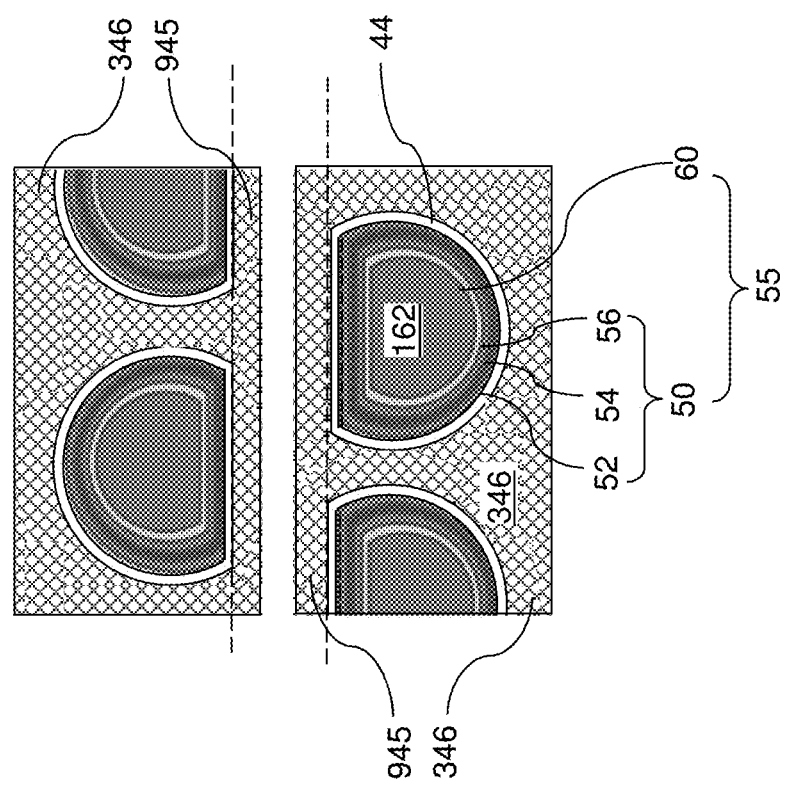
FIG. 17B is a horizontal cross-sectional view of a region of the exemplary structure along the horizontal plane B-B' of FIG. 17A.

Referring to FIGS. 16D, 17A, and 17B, a metallic fill material may be deposited in the backside recesses (443, 143, 343), in the drain-select-level trenches 71, on the sidewalls of the backside trenches 79, and over the top surface of the insulating cap layer 70 to form a metallic fill material layer 46B. The metallic fill material layer 46B may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities.

The thicknesses of the optional backside blocking dielectric layer 44, the metallic barrier layer 46A, and the metallic fill material layer 46B may be selected such that the sum of the thicknesses of the optional backside blocking dielectric layer 44, the metallic barrier layer 46A, and the metallic fill material layer 46B is greater than one half of the maximum height of the backside recesses (443, 143, 343), is less than one half of the minimum width of the drain-select-level trenches 71, and is less than one half of the minimum width of the backside trenches 79. The metallic fill material layer 46B may fill all remaining volumes of the backside recesses (443, 143, 343). The combination of the optional backside blocking dielectric layer 44, the metallic barrier layer 46A, and the metallic fill material layer 46B only partially fills each of the backside trenches 79 and each of the drain-select-level trenches 71.

The portions of the metallic barrier layer 46A and the metallic fill material layer 46B filling the source-select-level backside recesses 443 constitute a source-select-level electrically conductive layer 446. The portions of the metallic barrier layer 46A and the metallic fill material layer 46B filling the word-line-level backside recesses 143 constitute word-line-level electrically conductive layers 146. The portions of the metallic barrier layer 46A and the metallic fill material layer 46B filling the drain-select-level backside recesses 343 constitute drain-select-level electrically conductive layers 346. The portions of the metallic barrier layer 46A and the metallic fill material layer 46B located inside the drain-select-level trenches 71 are herein referred to as drain-select-level conductive material portions 945. The portions of the metallic barrier layer 46A and the metallic fill material layer 46B located inside the backside trenches 79 and over the insulating cap layer 70 constitutes a continuous electrically conductive layer 46L that is self-aligned.

Figure 18A:
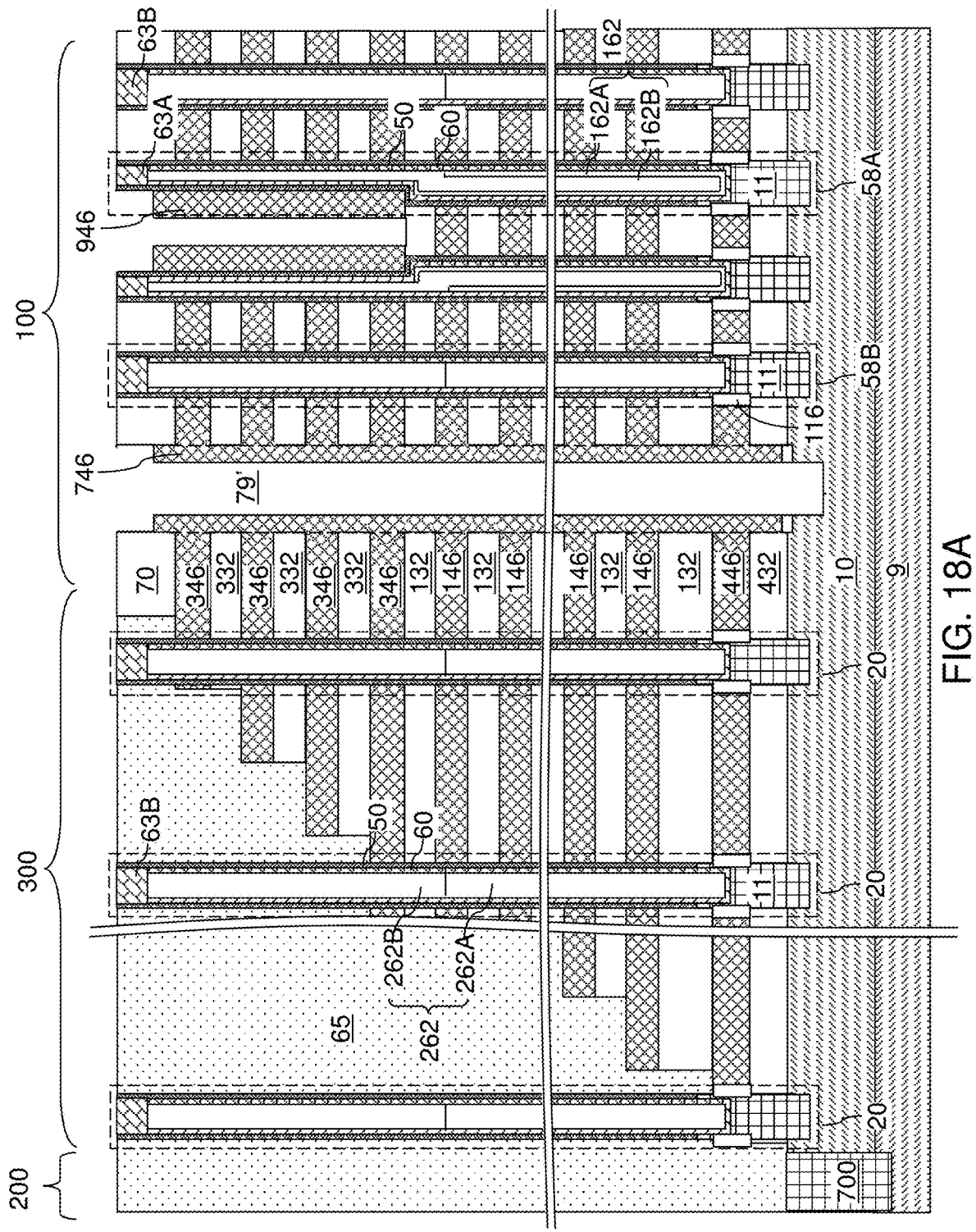
FIG. 18A is a schematic vertical cross-sectional view of the exemplary structure after an anisotropic etch process that removes horizontal portions of the at least one electrically conductive material and removal of edge segments of the at least one electrically conducive material in the drain-select-level trenches according to an embodiment of the present disclosure.
Figure 18B:
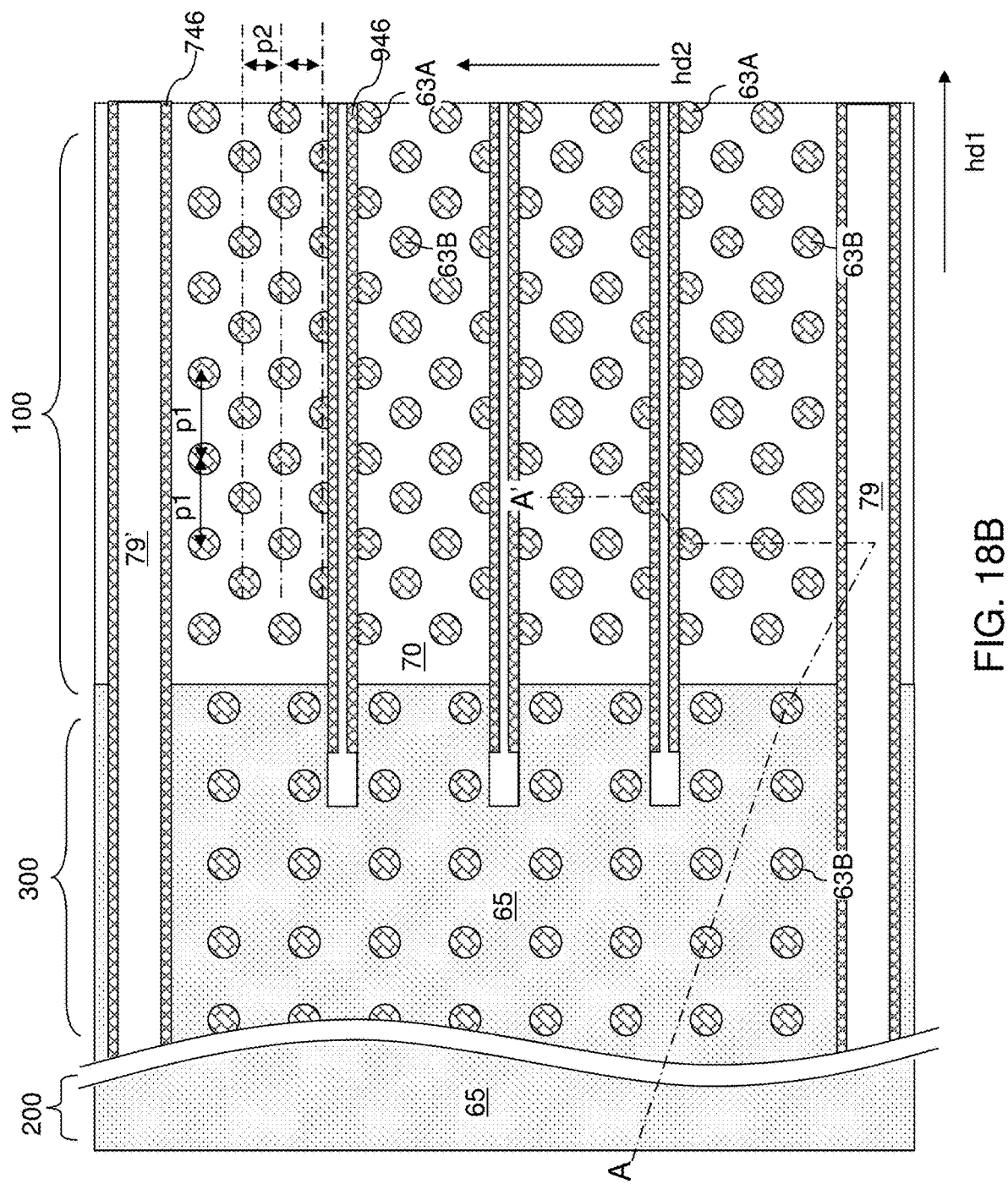
FIG. 18B is a top-down view of a first configuration of the exemplary structure of FIG. 18A.
Figure 18C:
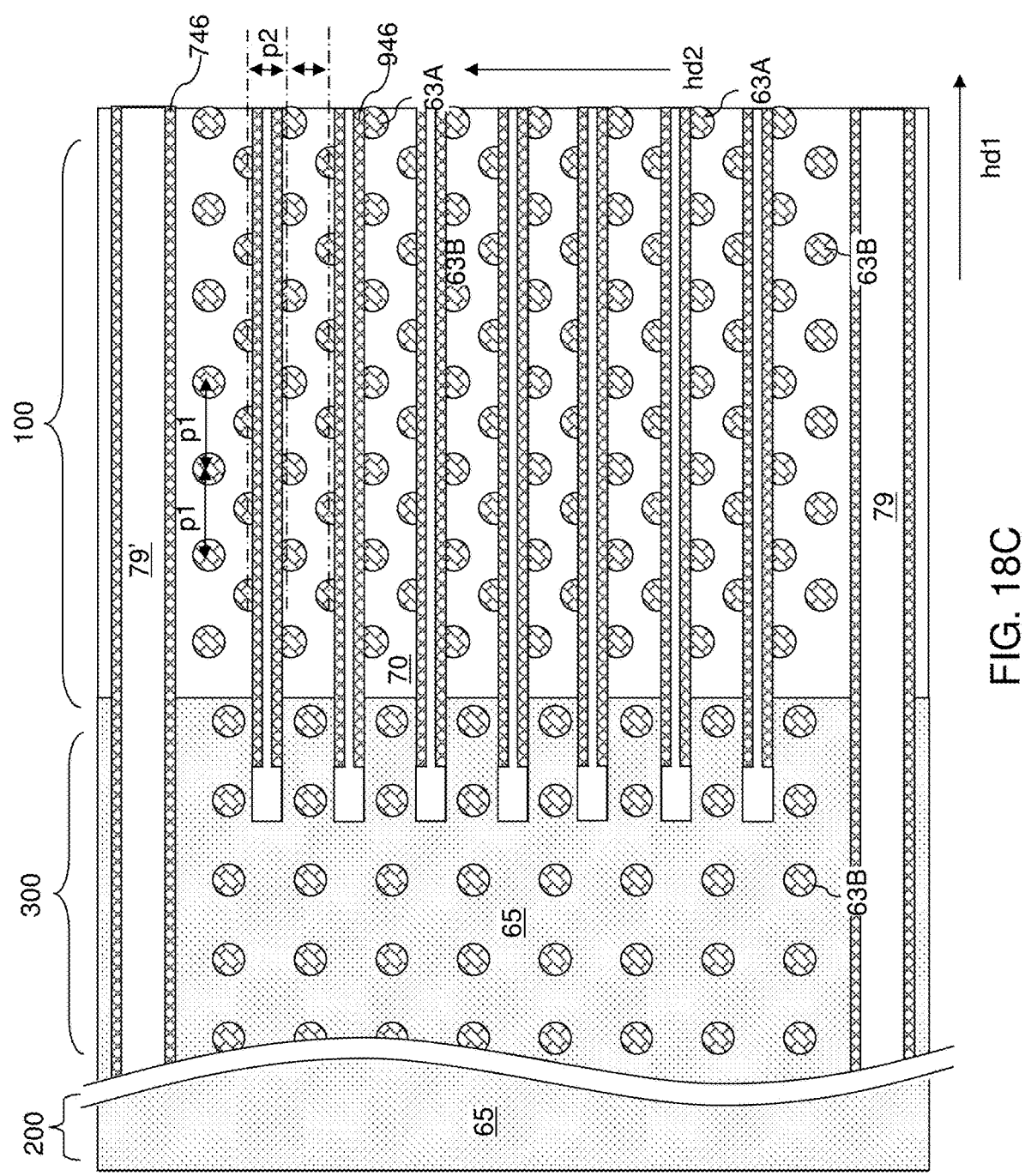
FIG. 18C is a top-down view of a second configuration of the exemplary structure of FIG. 18A.

Referring to FIGS. 18A and 18B, an anisotropic etch process may be performed to remove horizontal portions of the metallic barrier layer 46A and the metallic fill material layer 46B from above the insulating cap layer 70 and the retro-stepped dielectric material portion 65, from the bottom of each backside trench 79, and from the bottom of each drain-select-level trench 71. FIG. 18B is a top-down view of an embodiment in which each cluster of memory opening fill structures (58A, 58B) includes four rows of memory opening fill structures (58A, 58B). FIG. 18C is a top-down view of an embodiment in which each cluster of memory opening fill structures (58A, 58B) includes two rows of memory opening fill structures (58A, 58B). Each remaining vertical portion of the metallic barrier layer 46A and the metallic fill material layer 46B in the backside trenches 79 is herein referred to as an electrically conductive vertical plate 746. Each remaining vertical portion of the metallic barrier layer 46A and the metallic fill material layer 46B in the drain-select-level trenches 71 is herein referred to as a vertical conductive strip 946.

End portions of the vertical conductive strips 946 located at lengthwise ends of each drain-select-level trench 71 may be removed, for example, by applying a photoresist layer over the exemplary structure, lithographically patterning the photoresist layer to form openings that physically expose lengthwise ends of the drain-select-level trenches 71, and by removing the physically exposed end segments of the vertical conductive strips 946. For example, if a drain-select-level trench 71 has an elongated horizontal cross-sectional shape with a pair of lengthwise sidewalls that extend along the first horizontal direction hd1 and a pair of widthwise sidewalls that extend along the second horizontal direction hd2, portions of the vertical conductive strips 946 that are located on the widthwise sidewalls of the drain-select-level trenches 71 may be removed. The photoresist layer may be subsequently removed. Upon patterning of the vertical conductive strips 946, each drain-select-level trench 71 may include two vertical conductive strips 946 that extend along the first horizontal direction hd1 and are laterally spaced apart along the second horizontal direction hd2.

Generally, at least one conductive material may be deposited in the drain-select-level cavities and the backside recesses (443, 143, 343). The word-line-level electrically conductive layers 146 replace the word-line-level sacrificial material layers 142. Each combination of drain-select-level electrically conductive layers 346 and at least one vertical conductive strip 946 constitutes a drain-select-level electrode (346, 946). An anisotropic etch process may be performed partially etch portions of the at least one conductive material in the drain-select-level trenches 71 to provide a pair of vertical conductive strips 946 in each drain-select-level trench 71. Vertical conductive strips 946 in each pair of vertical conductive strips 946 are spaced apart and are electrically isolated from each other.

The drain-select-level electrodes (346, 946) may be formed above the word-line-level electrically conductive layers 146. Each of the drain-select-level electrodes (346, 946) comprises at least one drain-select-level electrically conductive layer 346 formed in a volume of the at least one drain-select-level backside recesses 343, and at least one vertical conductive strip 946 formed at a peripheral region of a respective one of the drain-select-level cavities, which is the volume of a respective drain-select-level trench 71. In one embodiment, each of the drain-select-level trenches 71 has a width that is greater than a maximum thickness of the sacrificial material layers (442, 142, 342). The at least one conductive material (such as the materials of the metallic barrier layer 46A and the metallic fill material layer 46B) is deposited using a conformal deposition process with a thickness that is greater than one half of the maximum thickness of the sacrificial material layers (442, 142, 342) and is less than one half of the width of the drain-select-level trenches 71.

Each of the drain-select-level electrically conductive layers 346 may contact a respective one of the vertical conductive strips 946. Each of the drain-select-level electrically conductive layers 346 and the respective one of the vertical conductive strips 946 comprises an integral conductive structure (346, 946) that includes a metallic barrier layer 46A that continuously extends around, and encircles, at least two rows of first memory stack structures 55 selected from the first memory stack structures 55 and extends into a respective one of the drain-select-level trenches 71, and a metallic fill material layer 46B that continuously extends around, and encircles, the at least two rows of first memory stack structures 55 selected from the first memory stack structures 55 and extends into the respective one of the drain-select-level trenches 71.

Figure 19:
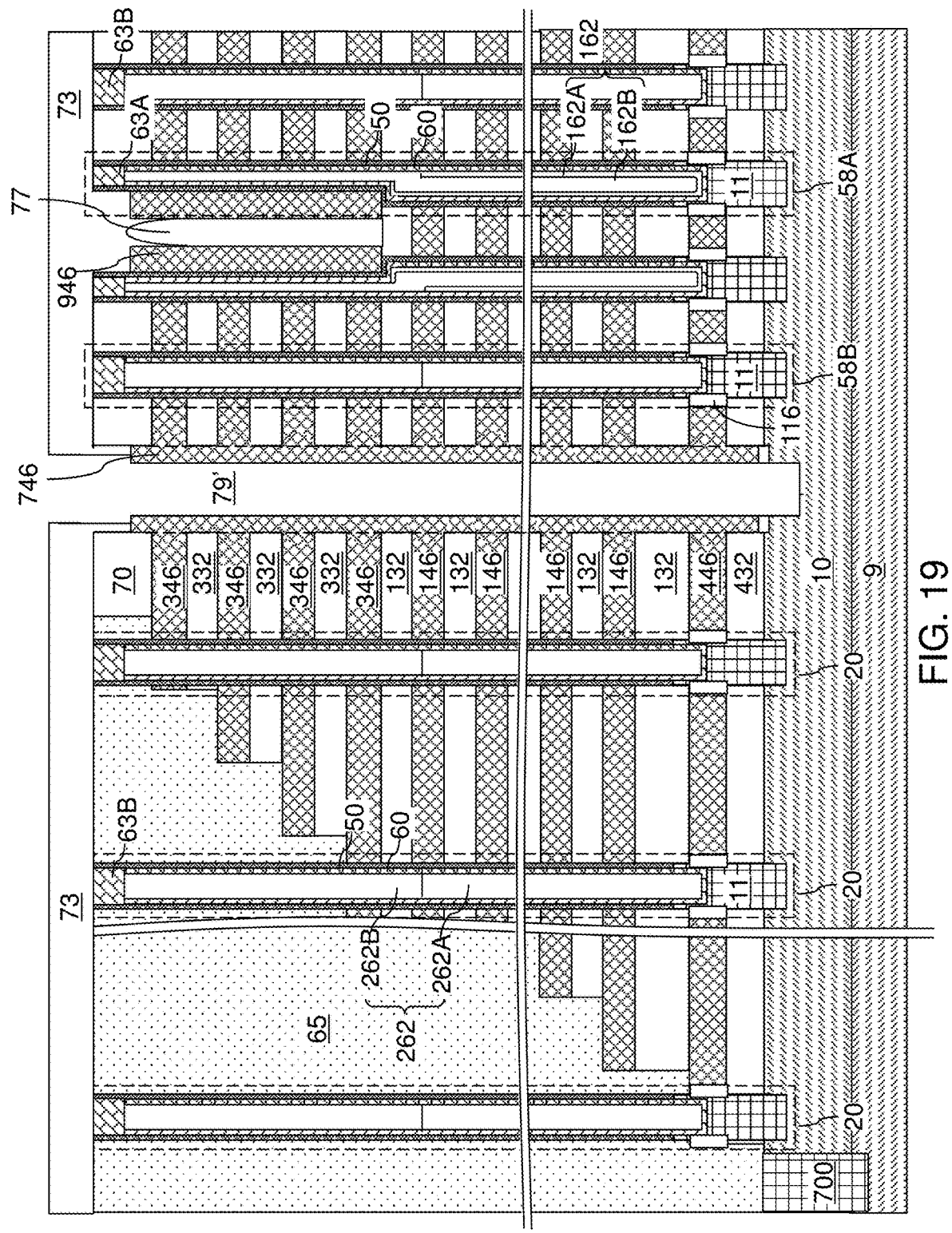
FIG. 19 is a schematic vertical cross-sectional view of the exemplary structure after formation of a nonconformal insulating layer and an isotropic recess etch according to an embodiment of the present disclosure.

Referring to FIG. 19, a nonconformal insulating layer 73 may be deposited over the insulating cap layer 70 and the retro-stepped dielectric material potion. The nonconformal insulating layer 73 may be an insulating material layer, and includes an insulating material such as silicon oxide, and is deposited anisotropically by a nonconformal deposition process such as plasma enhanced chemical vapor deposition (PECVD) process. The nonconformal insulating layer 73 may have a greater thickness above the top surface of the insulating cap layer 70 and above the retro-stepped dielectric material portion than on sidewalls and bottom surfaces of the backside trenches 79 or on sidewalls of the vertical conducive strips 946 or on bottom surfaces of the drain-select-level trenches 71. The widths of the backside trenches 79 and the drain-select-level trenches 71 may be selected such that an encapsulated cavity (i.e., air gap) 77 may be formed within each drain-select-level trench 71, and a backside cavity 79' that continuously extends to an elongated opening at the top surface of the nonconformal insulating layer 73 is present within each backside trench 79.

An isotropic recess etch may be performed to etch back surface portions of the nonconformal insulating layer 73. Bottom portions of the nonconformal insulating layer 73 may be removed from the bottom of each backside trench 79, and sidewall portions of the nonconformal insulating layer 73 may be removed from the sidewalls of the electrically conductive vertical plates 746. A top surface of the semiconductor material layer 10 may be physically exposed at the bottom of each backside cavity 79'. An encapsulated cavity 77 bounded by a curved bottom surface of the nonconformal insulating layer 73 is formed within a volume of each of the drain-select-level trenches 71.

Figure 20:
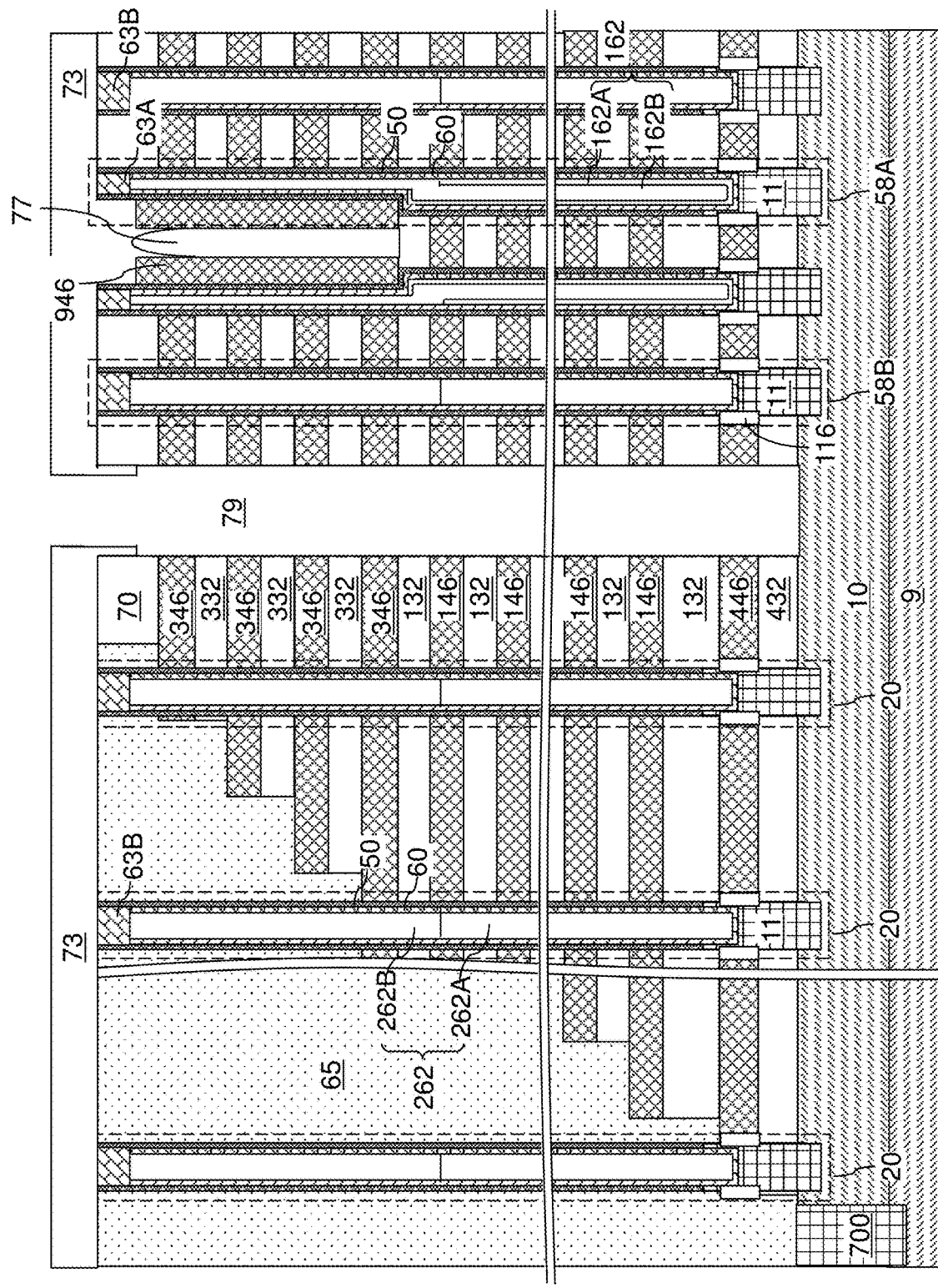
FIG. 20 is a schematic vertical cross-sectional view of the exemplary structure after removal of the at least one electrically conductive material from the backside trenches according to an embodiment of the present disclosure.

Referring to FIG. 20, the at least one electrically conductive material of the electrically conductive vertical plates 746 may be removed from the backside trenches 79 by an isotropic etch process. The isotropic etch process may include a wet etch process that etches the metallic materials of the electrically conductive vertical plates 746 selective to the materials of the insulating layers (432, 132, 332), the insulating cap layer 70, and the nonconformal insulating layer 73 and selective to the semiconductor material of the semiconductor material layer 10.

Figure 21:
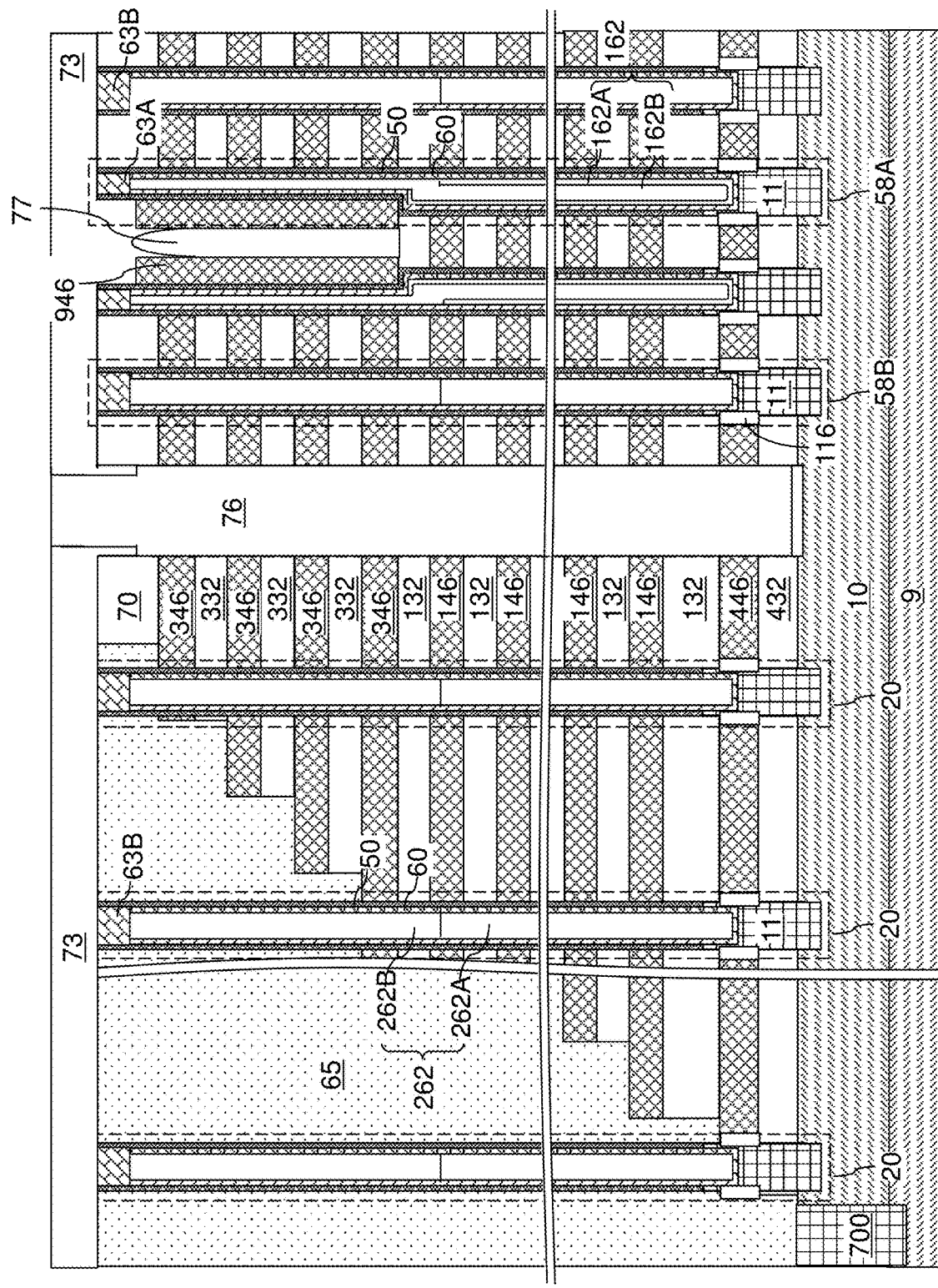
FIG. 21 is a schematic vertical cross-sectional view of the exemplary structure after formation of backside trench fill structures according to an embodiment of the present disclosure.

Referring to FIG. 21, a backside trench fill structure 76 may be formed within each backside trench 79. In one embodiment, a backside trench fill structure 76 may be a dielectric material portion such as a silicon oxide portion or a cavity-containing dielectric material portion (i.e., an air gap structure). Alternatively, a source region (not shown) having a doping of the second conductivity type may be formed at the bottom of each backside trench 79 by ion implantation, and a combination of an insulating spacer and a source contact via structure may be formed as a backside trench fill structure 76 within each backside trench 79.

Figure 22A:
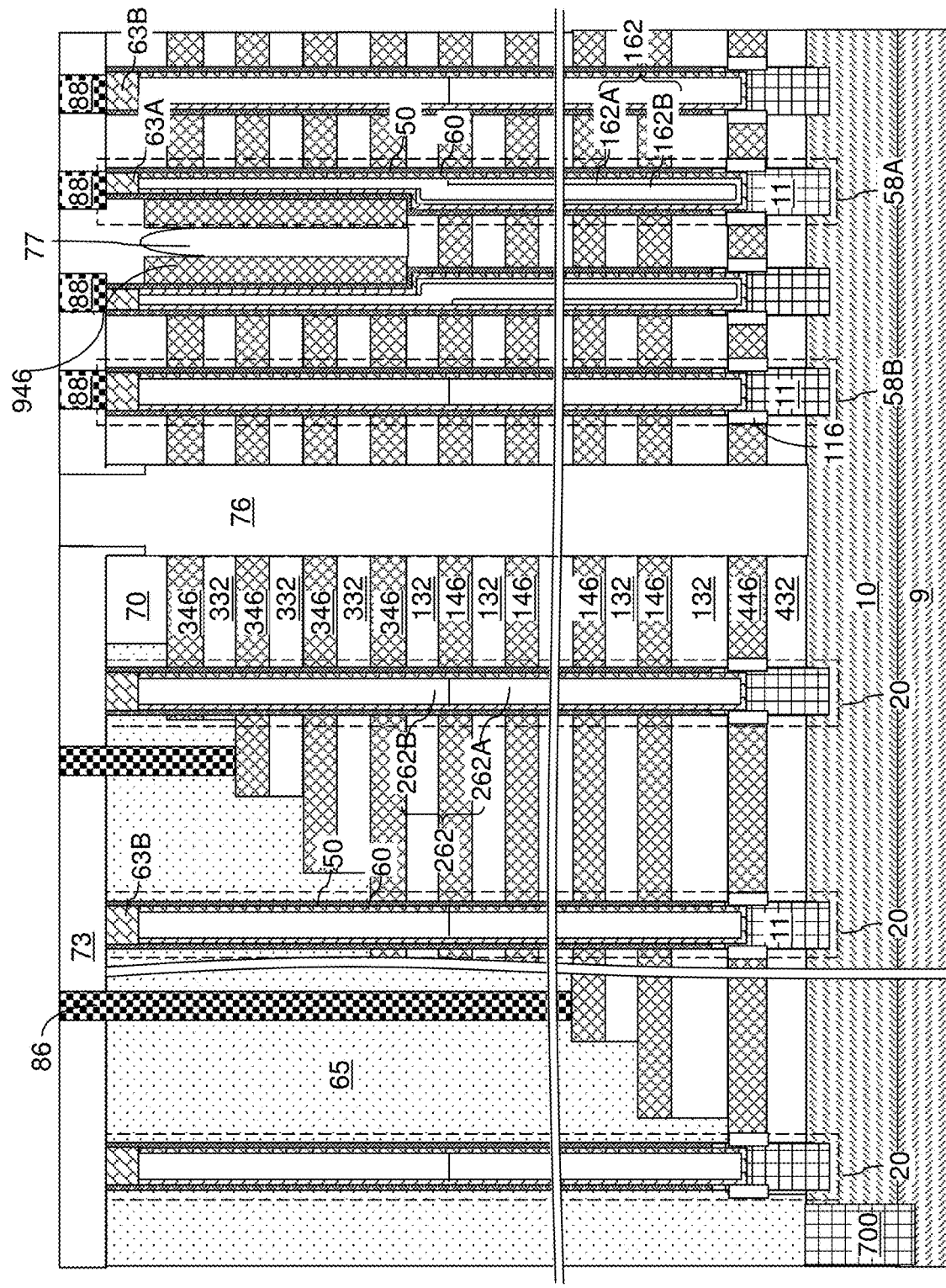
FIG. 22A is a schematic vertical cross-sectional view of the exemplary structure after formation of additional contact via structures according to an embodiment of the present disclosure.
Figure 22B:
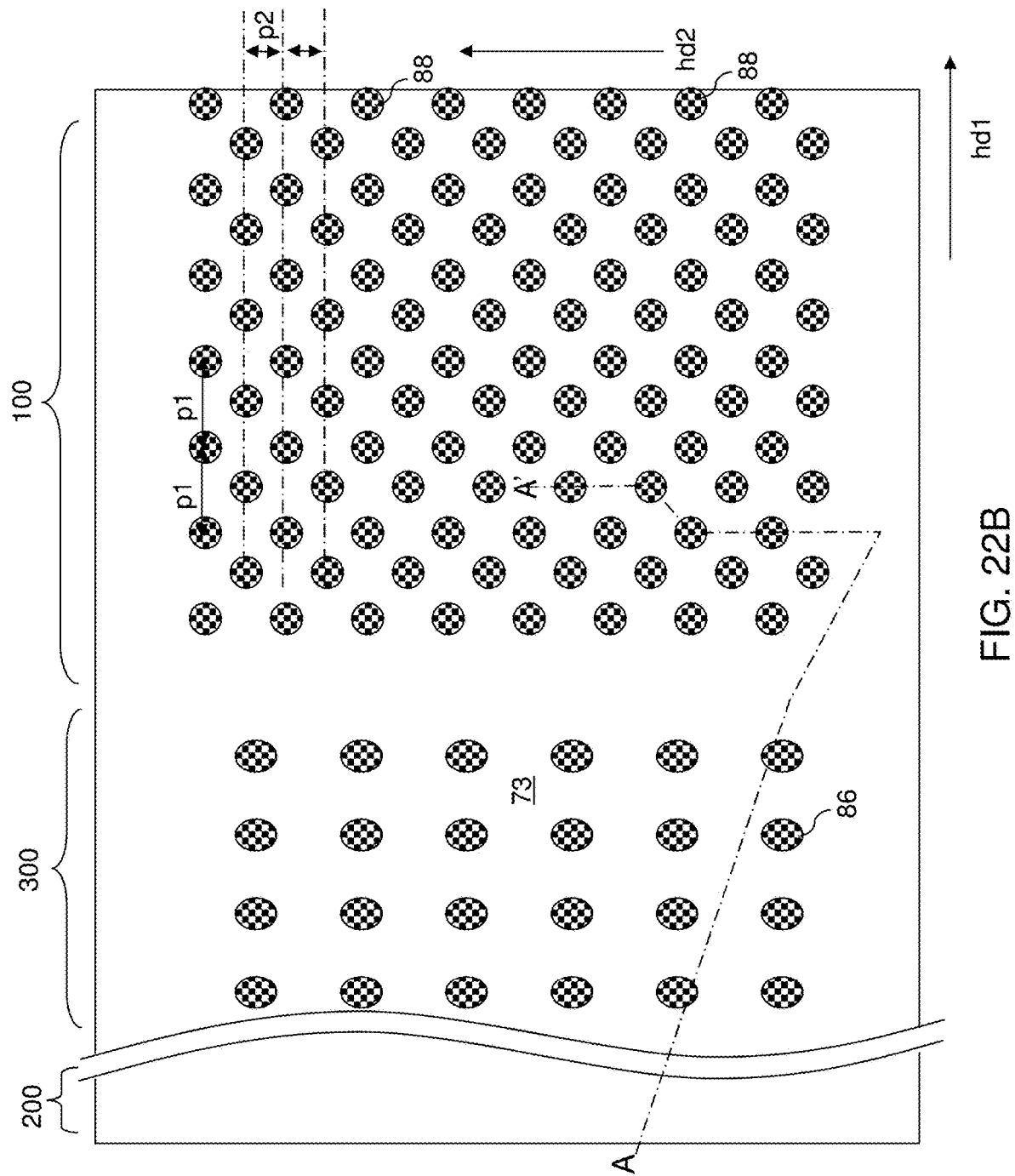
FIG. 22B is a top-down view of the exemplary structure of FIG. 22A. The zig-zag vertical plane A-A' is the plane of the schematic vertical cross-sectional view of FIG. 22A.

Referring to FIGS. 22A and 22B, additional contact via structures (88, 86) may be formed through the nonconformal insulating layer 73, and optionally through the retro-stepped dielectric material portion 65. For example, drain contact via structures 88 may be formed through the nonconformal insulating layer 73 on each drain region (63A, 63B). Layer contact via structures 86 may be formed on the electrically conductive layers (446, 146, 346) through the nonconformal insulating layer 73 and through the retro-stepped dielectric material portion 65. Peripheral device contact via structures (not shown) may be formed through the retro-stepped dielectric material portion 65 directly on respective nodes of the peripheral devices. Each drain contact via structure 88 contacts a top surface of an underlying one of the drain regions (63A, 63B).

Figure 23:
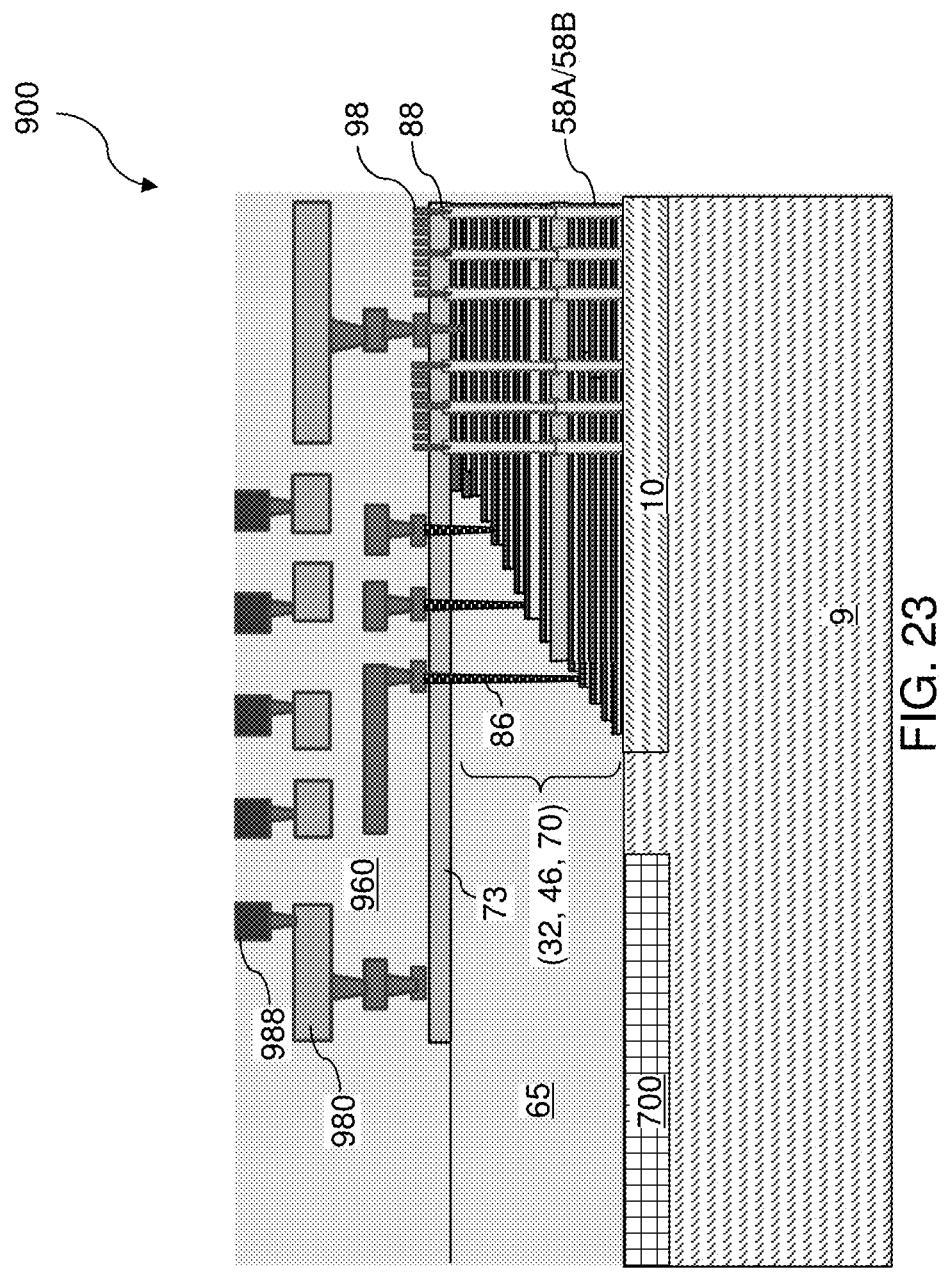
FIG. 23 is a vertical cross-sectional view of the exemplary structure after formation of interconnect-level dielectric material layers, additional metal interconnect structures, and bonding pads according to an embodiment of the present disclosure.

Referring to FIG. 23, memory-side dielectric material layers 960 may be deposited over the nonconformal insulating layer 73. Various memory-side metal interconnect structures 980 may be formed in the memory-side dielectric material layers 960. The memory-side metal interconnect structures 980 may include bit lines 98 that overlie the memory stack structures 55 and electrically connected to a respective subset of the drain regions (63A, 63B). Further, the memory-side metal interconnect structures 980 may include additional metal via structures and additional metal line structures that provide electrical wiring to and from the various underlying elements such as the layer contact via structures 86, the bit lines 98, and other nodes of the three-dimensional memory device that may be formed as needed. The thickness of the memory-side dielectric material layers 960 may be in a range from 300 nm to 3,000 nm, although lesser and greater thicknesses may also be used.

Pad cavities may be formed in the upper portion of the memory-side metal interconnect structures 980 such that a respective one of the memory-side metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape. A conductive material may be deposited in the pad cavities to form various memory-side bonding pads 988. The memory-side bonding pads 988 are formed in memory-side dielectric material layers 960, which is formed over the alternating stack {(432, 132, 332), (446, 146, 346)}. The memory-side bonding pads 988 are electrically connected to nodes of the memory stack structures 55. In one embodiment, each bit line 98 may be electrically connected to a respective one of the memory-side bonding pads 988. The exemplary structure comprises a memory die 900.

Figure 24A:
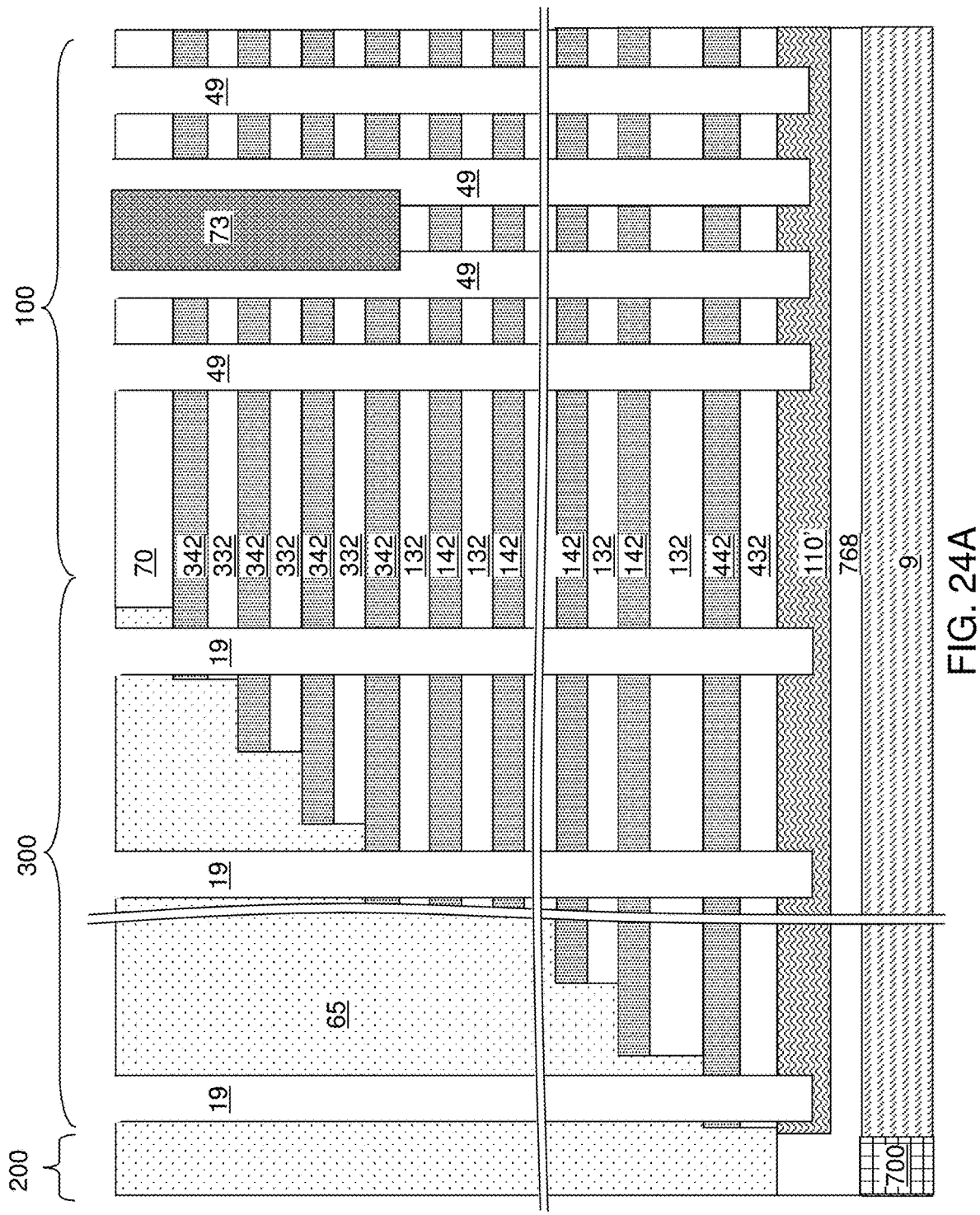
FIG. 24A is a vertical cross-sectional view of an alternative configuration of the exemplary structure at the processing steps of FIGS. 8A and 8B according to an embodiment of the present disclosure.
Figure 24B:
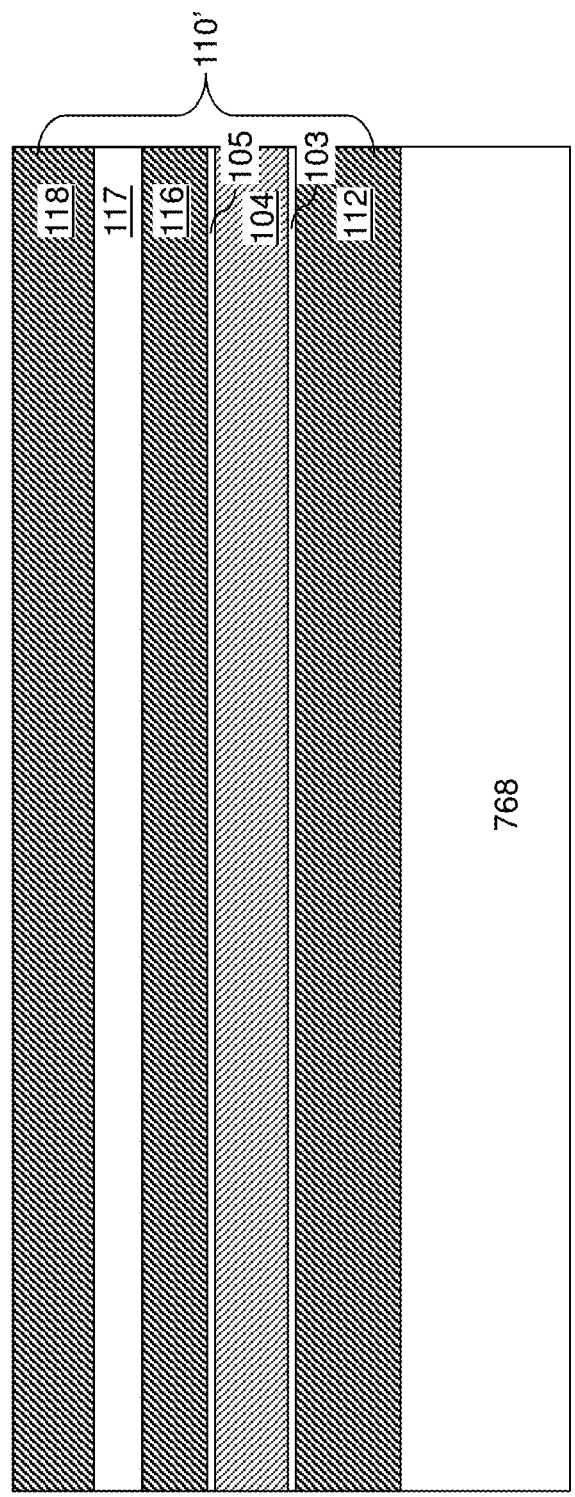
FIG. 24B is a magnified view of in-process source-level material layers at the processing steps of FIG. 24A.

Referring to FIGS. 24A and 24B, an alternative configuration for the exemplary structure is illustrated, which is derived from the exemplary structure of FIGS. 8A and 8B by employing a combination of a dielectric material layer 768 and in-process source-level material layers 110' in lieu of a semiconductor material layer 10. The dielectric material layer 768 may be a single dielectric material layer or a plurality of dielectric material layers having different material compositions and/or formed at different processing steps. Optionally, lower-level metal interconnect structures (not shown) may be formed in the dielectric material layer 769. The dielectric material layer 768 can include silicon oxide and/or silicon nitride. The thickness of the dielectric material layer 768 may be in a range from 100 nm to 3,000 nm, although lesser and greater thicknesses can also be employed.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The processing steps of FIG. 2-FIG. 8B can be subsequently performed to provide the alternative configuration of the exemplary structure illustrated in FIGS. 24A and 24B.

Subsequently, the processing steps of FIGS. 9C, 9G, and 9H can be performed with the modification that the thickness and the material of the first semiconductor channel layer 601 are selected to be the thickness and the material of vertical semiconductor channels 60 to be formed.

Figure 25A:
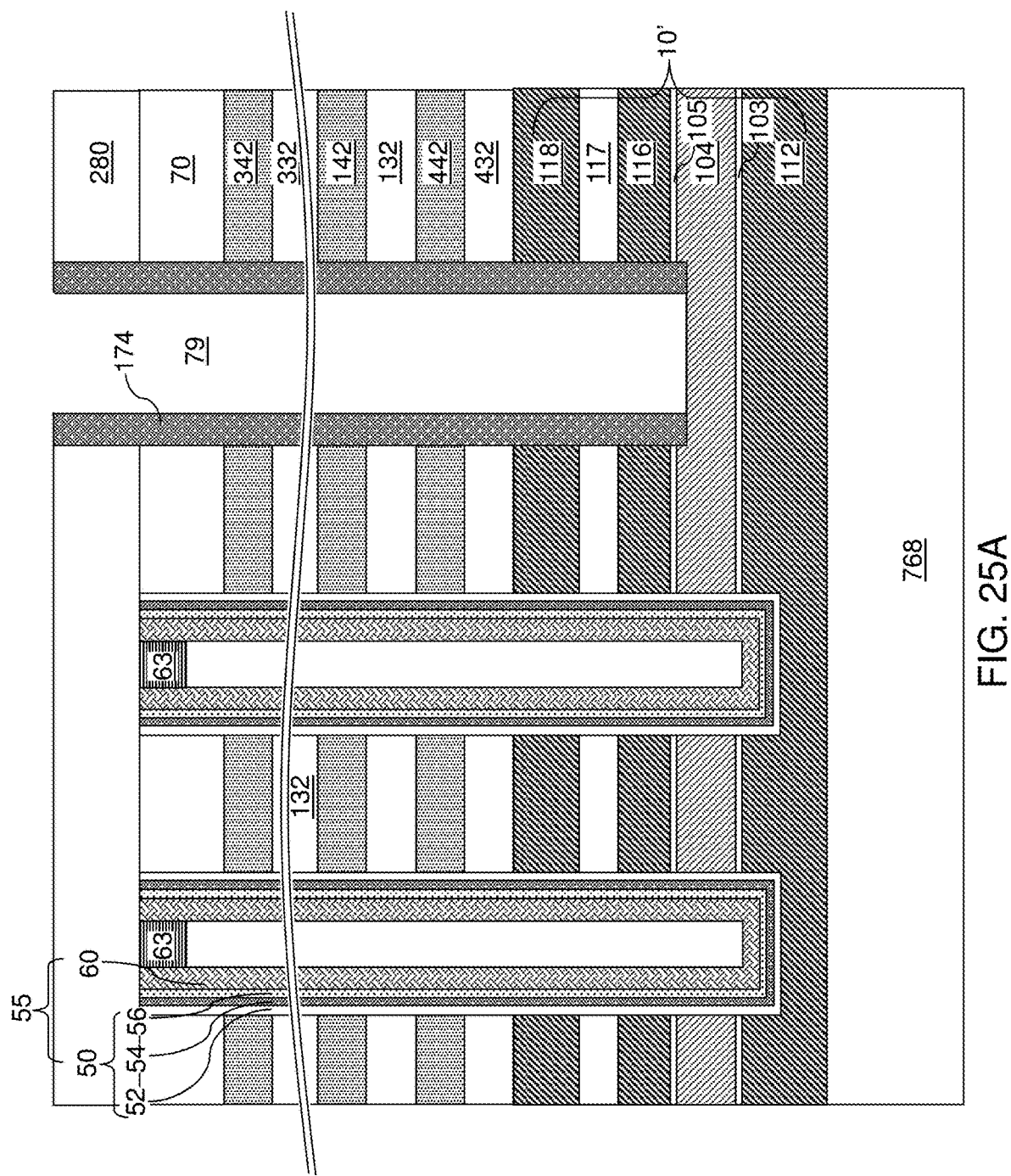
FIGS. 25A-25E illustrate sequential vertical cross-sectional views of memory opening fill structures and a backside trench during formation of source-level material layers in the alternative configuration of the exemplary structure according to an embodiment of the present disclosure.

Referring to FIG. 25A, a sacrificial cover layer 280 can be deposited over the insulating cap layer 70. The sacrificial cover layer 280 can include a dielectric material that can be subsequently removed. For example, the sacrificial cover layer 280 can include borosilicate glass and can have a thickness in a range from 30 nm to 300 nm, although lesser and greater thicknesses can be employed. The processing steps of FIGS. 14A-14D can be performed with the modification that the bottom of each backside trench 79 extends into the in-process source-level material layers.

A backside trench spacer 174 may be formed on sidewalls of each backside trench 79. For example, a conformal spacer material layer may be deposited in the backside trenches 79 and over the sacrificial cover layer 280, and may be anisotropically etched to form the backside trench spacers 174. The backside trench spacers 174 include a material that is different from the material of the source-level sacrificial layer 104. For example, the backside trench spacers 174 may include silicon nitride.

Figure 25B:
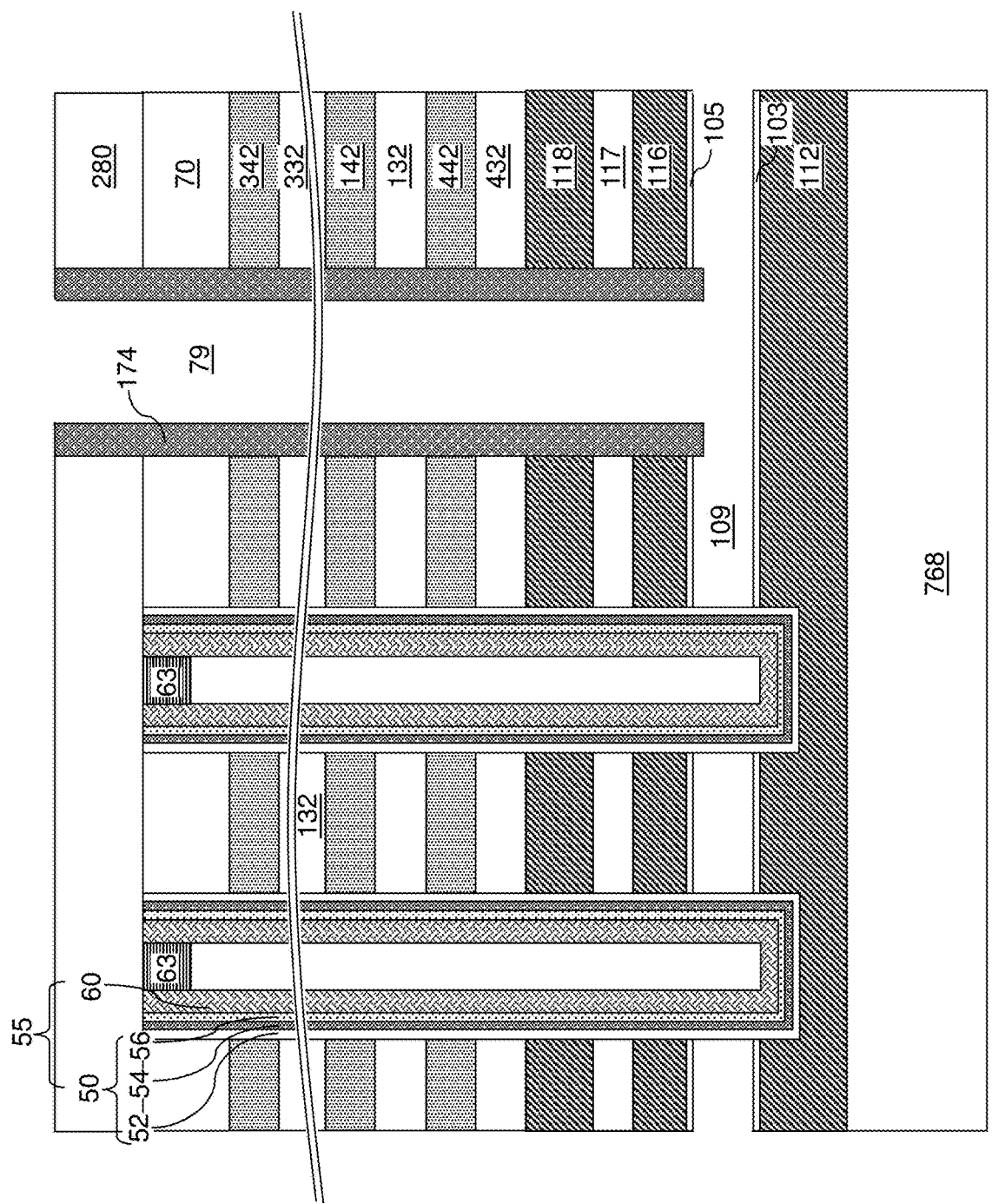

Referring to FIG. 25B, an etchant that etches the material of the source-level sacrificial layer 104 selective to the materials of the alternating stack {(432, 132, 332), (442, 142, 342)}, the insulating cap layers 70, the sacrificial cover layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 174 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 174 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 174, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 and memory stack structures 55 is physically exposed to the source cavity 109. Specifically, each of the memory opening fill structures 58 includes a sidewall and that are physically exposed to the source cavity 109.

Figure 25C:
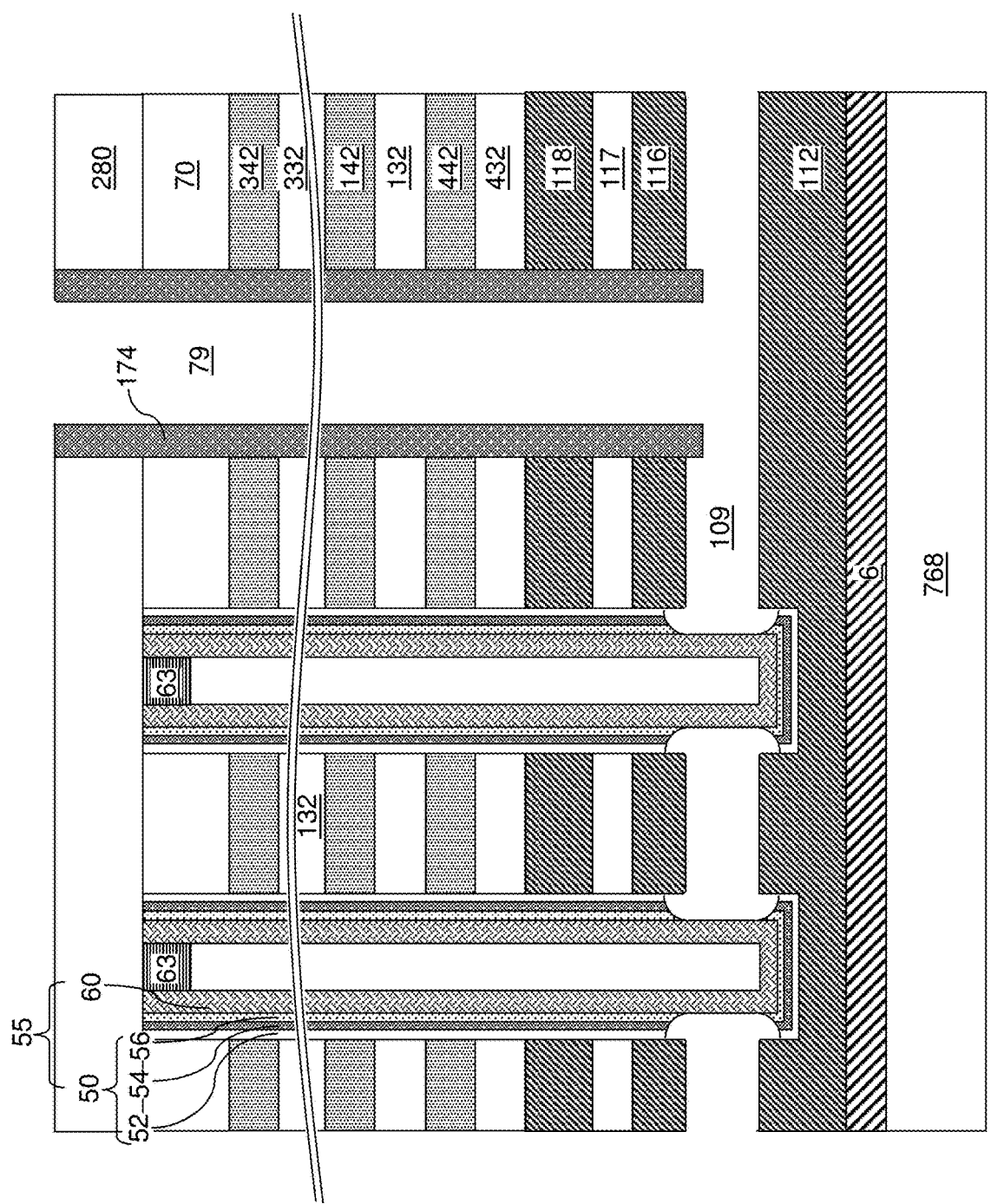

Referring to FIG. 25C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 25D:
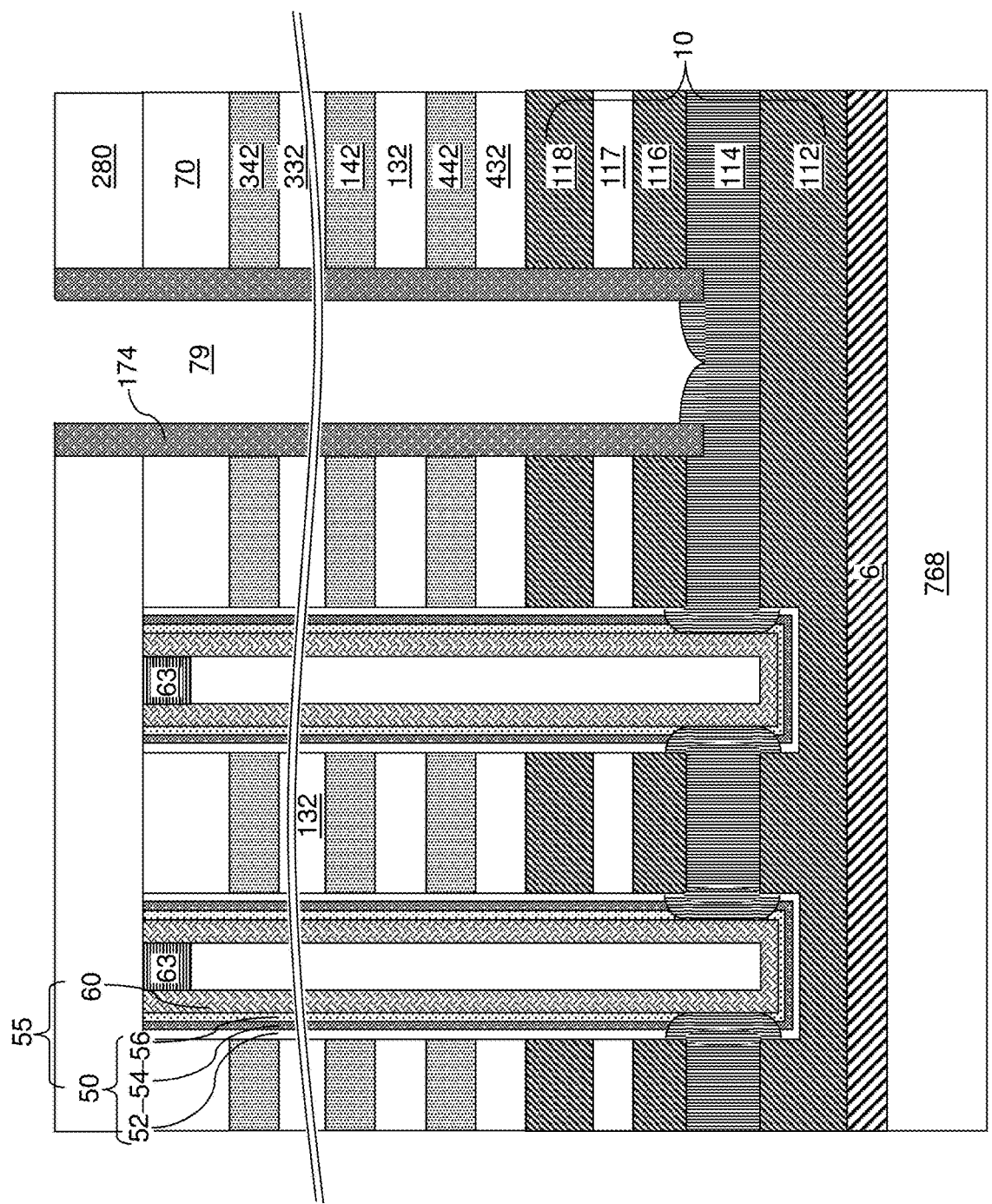

Referring to FIG. 25D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 174. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 10, which replaces the in-process source-level material layers 110'.

Figure 25E:
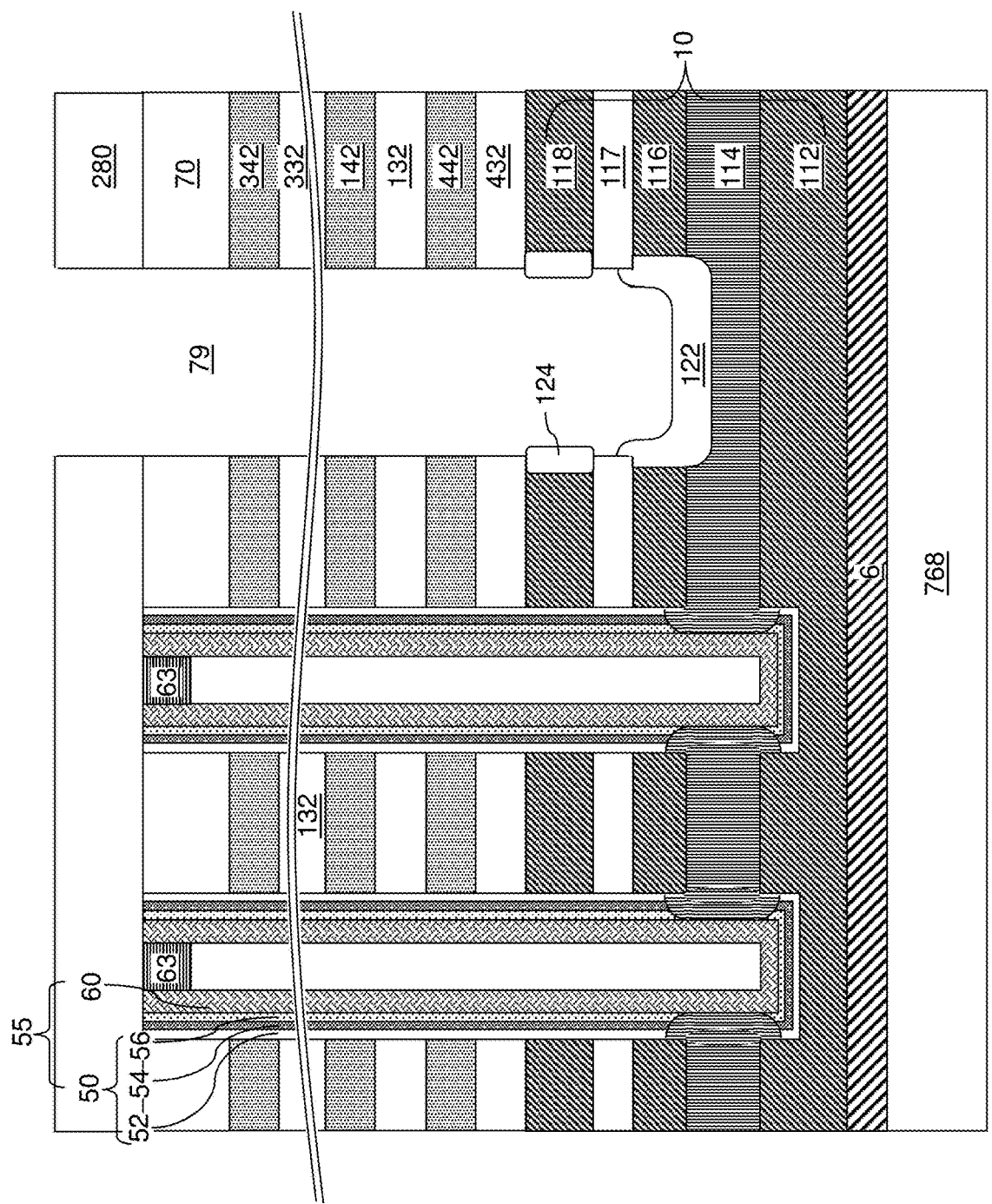

Referring to FIG. 25E, the backside trench spacers 174 may be removed selective to the insulating layers (132, 232), the first and second insulating cap layers (170, 270), the sacrificial cover layer 280, and the source contact layer 114 using an isotropic etch process. For example, if the backside trench spacers 174 include silicon nitride, a wet etch process using hot phosphoric acid may be performed to remove the backside trench spacers 174. In one embodiment, the isotropic etch process that removes the backside trench spacers 174 may be combined with a subsequent isotropic etch process that etches the sacrificial material layers (142, 242) selective to the insulating layers (132, 232), the first and second insulating cap layers (170, 270), the sacrificial cover layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 26:
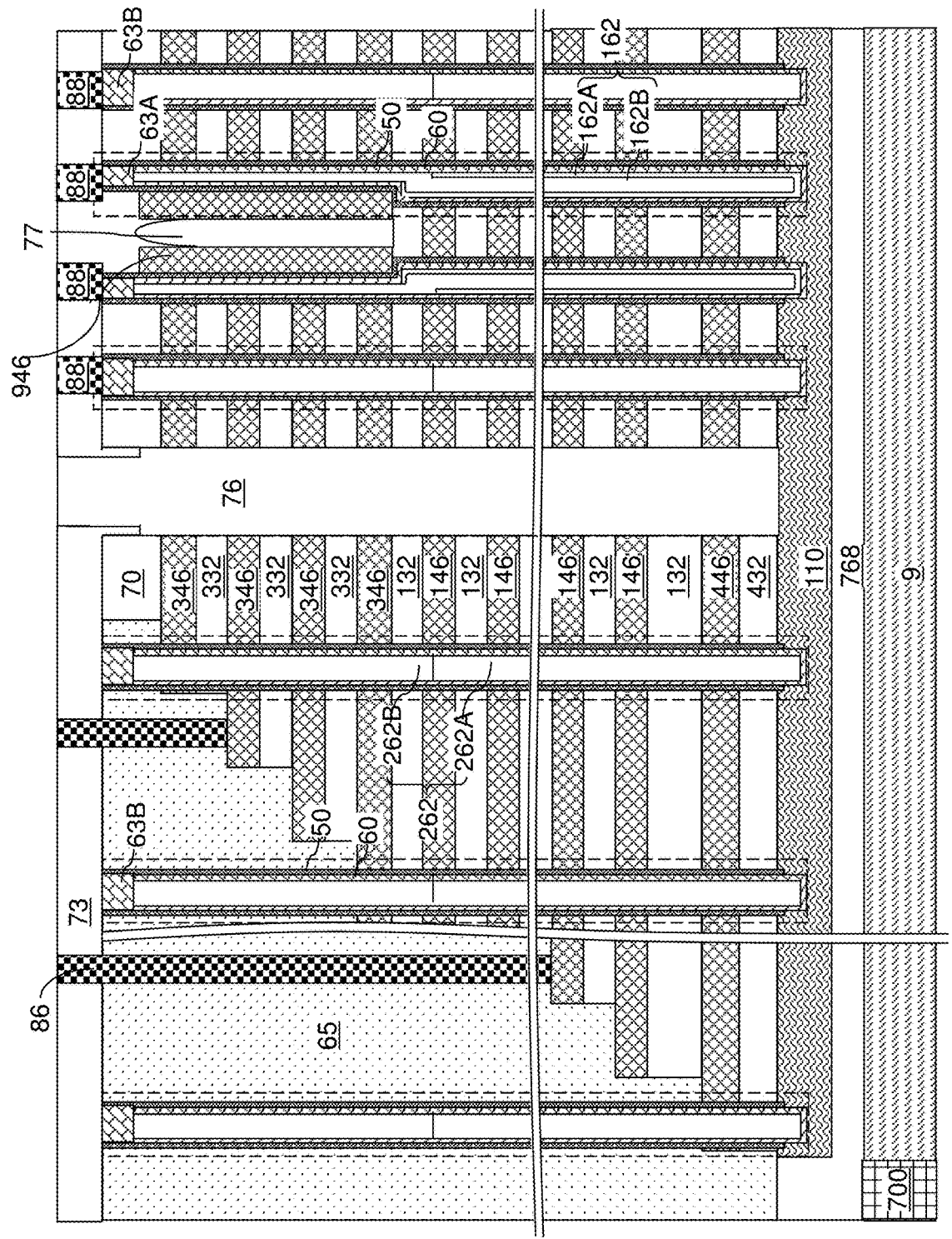
FIG. 26 illustrates a vertical cross-sectional view of the alternative configuration of the exemplary structure at the processing steps of FIGS. 22A and 22B according to an embodiment of the present disclosure.

Referring to FIG. 26, the processing steps of FIGS. 15A and 15B through the processing steps of FIGS. 22A and 22B can be subsequently performed to provide the alternative configuration of the exemplary structure illustrated in FIG. 26. The processing steps of FIG. 23 can be subsequently performed.

Referring to all drawings and according to various embodiments of the present disclosure, a three-dimensional memory device is provided, which comprises: an alternating stack {(432, 132, 332), (446, 146, 346)} of insulating layers (432, 132, 332) and electrically conductive layers (446, 146, 346) located over a substrate (9, 10), wherein the electrically conductive layers comprise word-line-level electrically conductive layers 146 and at least one drain-select-level electrically conductive layer 346 overlies the word-line-level electrically conductive layers 146; first memory stack structures 55 (located within first memory opening fill structures 58A) extending through the alternating stack {(432, 132, 332), (446, 146, 346)}; drain-select-level trenches 71 that vertically extend through the at least one drain-select-level electrically conductive layer 346 and laterally extend along a first horizontal direction hd1 and divide each of the at least one drain-select-level electrically conductive layer 346 into multiple drain-select-level electrically conductive strips that are laterally spaced apart along a second horizontal direction hd2; and pairs of vertical conductive strips 946, wherein each pair of vertical conductive strips 946 is located within a respective one of the drain-select-level trenches 71, and each of the vertical conductive strips 946 has a pair of vertical straight sidewalls that laterally extends along the first horizontal direction hd1.

In one embodiment, each of the first memory stack structures 55 may have a horizontal surface having a shape of a geometrical segment within a horizontal plane including bottom surfaces of the drain-select-level trenches 71. In one embodiment, each of the vertical conductive strips 946 overlies a respective row of horizontal surfaces arranged along the first horizontal direction hd1. In one embodiment, each of the first memory stack structures 55 comprises a planar sidewall having a bottom edge that is adjoined to a straight edge of a respective horizontal surface and contacting a sidewall of a respective one of the drain-select-level trenches 71.

In one embodiment, each of the first memory stack structures 55 comprises a circular-cylindrical or elliptical-cylindrical sidewall that is located below the horizontal plane including the bottom surfaces of the drain-select-level trenches 71, is adjoined to a curved edge of a respective horizontal surface, and laterally bounds a volume of a respective first memory stack structure 55 below the horizontal plane including the bottom surfaces of the drain-select-level trenches 71.

In one embodiment, each of the first memory stack structures 55 includes a respective first memory film 50 and a respective first vertical semiconductor channel 60; and each first vertical semiconductor channel 60 comprises a flat planar portion 60P having a vertical surface that is parallel to the first horizontal direction hd1. In one embodiment, the flat planar portion 60P is laterally spaced from a most proximal one to the vertical conductive strips 946 by a vertical flat portion of the respective first memory film 50. In one embodiment, each of the first memory films 50 comprises a stack that includes a charge storage layer 54 and a tunneling dielectric layer 56 that contacts a respective one of the first vertical semiconductor channels 60.

In one embodiment, each of the vertical conductive strips 946 has an areal overlap in a plan view (i.e., a view along a vertical direction) with portions of each first memory stack structure 55 that are present within a row of first memory stack structures 55, and are located below the horizontal plane including bottom surfaces of the vertical conductive strips 946.

In one embodiment, three-dimensional memory device comprises second memory stack structures 55 (located in second memory opening fill structures 58B) that extends through the alternating stack {(432, 132, 332), (446, 146, 346)} with a horizontal cross-sectional shape of a circle or an ellipse at each level of the at least one drain-select-level electrically conductive layer 346 and the word-line-level electrically conductive layers 146.

In one embodiment, each of the first memory stack structures 55 is located between a vertical flat sidewall of a most proximal one of the vertical conductive strips 946 and a vertical concave sidewall of a most proximal one of the multiple drain-select-level electrically conductive strips. Thus, each drain-select-level electrode (346, 946) may have a gate-all-around configuration.

In one embodiment, each of the drain-select-level electrically conductive layers 346 contacts a respective one of the vertical conductive strips 946. Each of the drain-select-level electrically conductive layers 346 and the respective one of the vertical conductive strips 946 comprises an integral conductive structure (346, 946) that includes: a metallic barrier layer 46A that continuously extends around, and encircles, at least two rows of first memory stack structures 55 selected from the first memory stack structures 55 and extends into a respective one of the drain-select-level trenches 71; and a metallic fill material layer 46B that continuously extends around, and encircles, the at least two rows of first memory stack structures 55 selected from the first memory stack structures 55 and extends into the respective one of the drain-select-level trenches 71.

In one embodiment, the three-dimensional memory device comprises an insulating material layer (such as a nonconformal insulating layer 73) that overlies the alternating stack {(432, 132, 332), (446, 146, 346)} and the drain-select-level trenches 71, wherein an encapsulated cavity 77 bounded by a curved bottom surface of the insulating material layer is located within one of the drain-select-level trenches 71.

In one embodiment, the at least one drain-select-level electrically conductive layer 346 comprises a plurality of drain-select-level electrically conductive layers 346; and each of the vertical conductive strips 946 is adjoined to a plurality of drain-select-level electrically conductive layers 346 that are vertically spaced apart.

The various embodiments of the present disclosure provide more than two strips of drain-select-level electrically conductive layers 346 between each laterally neighboring pair of backside trenches 79. The drain-select-level trenches 71 function as a conduit for providing an etchant for etching the sacrificial material of the drain-select-level sacrificial material layers 342 that are not directly exposed to backside trenches 79 during formation of the drain-select-level backside recesses 343. Further, the drain-select-level trenches 71 function as a conduit for providing a reactant for depositing the backside blocking dielectric layer 44, the optional metallic barrier layer 46A, the metallic fill material layer 46B. Thus, more than two clusters of memory stack structures 55 may be provided with electrical isolation at the drain select levels between each. The various embodiments described above provide drain-select-level trenches 71 that isolate and group memory stack structures 55 into clusters 148, but minimize the number of process steps that are used to form the electrically conductive layers (446, 146, 346) located over a substrate (9, 10). The same deposition step may be used to form the word lines 146, the source select gate electrodes 446, the drain select gate electrodes 346 and the vertical conductive strips 946 connected to the drain select gate electrodes to provide the select gate electrodes and word lines for all of the memory stack structures despite the isolation resulting from the formation of the drain-select-level trenches 71. This reduces the cost of the process while reducing misalignment between elements in the word-line-level and the drain-select-level. Furthermore, a cavity (i.e., air gap) 77 may be formed in the drain-select-level trenches 71 to improve the level of isolation between elements.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate, wherein the electrically conductive layers comprise word-line-level electrically conductive layers and at least one drain-select-level electrically conductive layer that overlies the word-line-level electrically conductive layers;
first memory stack structures extending through the alternating stack;
drain-select-level trenches that vertically extend through the at least one drain-select-level electrically conductive layer and laterally extend along a first horizontal direction and divide each of the at least one drain-select-level electrically conductive layer into multiple drain-select-level electrically conductive strips that are laterally spaced apart along a second horizontal direction; and
pairs of vertical conductive strips, wherein each pair of vertical conductive strips is located within a respective one of the drain-select-level trenches, and each of the vertical conductive strips has a pair of vertical straight sidewalls that laterally extends along the first horizontal direction;
wherein each of the first memory stack structures has a horizontal surface having a shape of a geometrical segment within a horizontal plane including bottom surfaces of the drain-select-level trenches;
wherein each of the vertical conductive strips overlies a respective row of horizontal surfaces arranged along the first horizontal direction;
wherein each of the first memory stack structures comprises a planar sidewall having a bottom edge that is adjoined to a straight edge of a respective horizontal surface and contacting a sidewall of a respective one of the drain-select-level trenches; and
wherein each of the first memory stack structures comprises a circular-cylindrical or elliptical-cylindrical sidewall that is located below the horizontal plane including the bottom surfaces of the drain-select-level trenches, is adjoined to a curved edge of a respective horizontal surface, and laterally bounds a volume of a respective first memory stack structure below the horizontal plane including the bottom surfaces of the drain-select-level trenches.

2. A three-dimensional memory device comprising:
an alternating stack of insulating layers and electrically conductive layers located over a substrate, wherein the electrically conductive layers comprise word-line-level electrically conductive layers and at least one drain-select-level electrically conductive layer that overlies the word-line-level electrically conductive layers;
first memory stack structures extending through the alternating stack;
drain-select-level trenches that vertically extend through the at least one drain-select-level electrically conductive layer and laterally extend along a first horizontal direction and divide each of the at least one drain-select-level electrically conductive layer into multiple drain-select-level electrically conductive strips that are laterally spaced apart along a second horizontal direction; and
pairs of vertical conductive strips, wherein each pair of vertical conductive strips is located within a respective one of the drain-select-level trenches, and each of the vertical conductive strips has a pair of vertical straight sidewalls that laterally extends along the first horizontal direction;
wherein each of the first memory stack structures has a horizontal surface having a shape of a geometrical segment within a horizontal plane including bottom surfaces of the drain-select-level trenches;
wherein each of the vertical conductive strips overlies a respective row of horizontal surfaces arranged along the first horizontal direction;
wherein each of the first memory stack structures comprises a planar sidewall having a bottom edge that is adjoined to a straight edge of a respective horizontal surface and contacting a sidewall of a respective one of the drain-select-level trenches; and
wherein:
each of the first memory stack structures includes a respective first memory film and a respective first vertical semiconductor channel; and
each first vertical semiconductor channel comprises a flat planar portion having a vertical surface that is parallel to the first horizontal direction.

3. The three-dimensional memory device of claim 2, wherein the flat planar portion is laterally spaced from a most proximal one to the vertical conductive strips by a vertical flat portion of the respective first memory film.

4. The three-dimensional memory device of claim 2, wherein each of the first memory films comprises a stack that includes a charge storage layer and a tunneling dielectric layer that contacts a respective one of the first vertical semiconductor channels.

5. A three-dimensional memory device comprising:
an alternating stack of insulating layers and electrically conductive layers located over a substrate, wherein the electrically conductive layers comprise word-line-level electrically conductive layers and at least one drainselect-level electrically conductive layer that overlies the word-line-level electrically conductive layers;

first memory stack structures extending through the alternating stack;

drain-select-level trenches that vertically extend through the at least one drain-select-level electrically conductive layer and laterally extend along a first horizontal direction and divide each of the at least one drain-select-level electrically conductive layer into multiple drain-select-level electrically conductive strips that are laterally spaced apart along a second horizontal direction; and pairs of vertical conductive strips, wherein each pair of vertical conductive strips is located within a respective one of the drain-select-level trenches, and each of the vertical conductive strips has a pair of vertical straight sidewalls that laterally extends along the first horizontal direction;

wherein each of the first memory stack structures has a horizontal surface having a shape of a geometrical segment within a horizontal plane including bottom surfaces of the drain-select-level trenches; and wherein each of the vertical conductive strips has an areal overlap in a plan view along a vertical direction with portions of each first memory stack structure that are present within a row of first memory stack structures and are located below the horizontal plane including bottom surfaces of the vertical conductive strips.

6. The three-dimensional memory device of claim 5, further comprising second memory stack structures that extends through the alternating stack with a horizontal cross-sectional shape of a circle or an ellipse at each level of the at least one drain-select-level electrically conductive layer and the word-line-level electrically conductive layers.

7. The three-dimensional memory device of claim 5, wherein each of the first memory stack structures is located between a vertical flat sidewall of a most proximal one of the vertical conductive strips and a vertical concave sidewall of a most proximal one of the multiple drain-select-level electrically conductive strips.

8. The three-dimensional memory device of claim 5, wherein each of the drain-select-level electrically conductive layers contacts a respective one of the vertical conductive strips.

9. The three-dimensional memory device of claim 8, wherein each of the drain-select-level electrically conductive layers and the respective one of the vertical conductive strips comprises an integral conductive structure that includes:

a metallic barrier layer that continuously extends around, and encircles, at least two rows of first memory stack structures selected from the first memory stack structures and extends into a respective one of the drain-select-level trenches; and a metallic fill material layer that continuously extends around, and encircles, the at least two rows of first memory stack structures selected from the first memory stack structures and extends into the respective one of the drain-select-level trenches.

10. The three-dimensional memory device of claim 5, further comprising an insulating material layer that overlies the alternating stack and the drain-select-level trenches, wherein an encapsulated cavity bounded by a curved bottom surface of the insulating material layer is located within one of the drain-select-level trenches.

11. The three-dimensional memory device of claim 5, wherein:

the at least one drain-select-level electrically conductive layer comprises a plurality of drain-select-level electrically conductive layers; and each of the vertical conductive strips is adjoined to a plurality of drain-select-level electrically conductive layers that are vertically spaced apart.

* * * * *